US012564016B2

(12) United States Patent
Kondo et al.

(10) Patent No.: US 12,564,016 B2
(45) Date of Patent: Feb. 24, 2026

(54) DEFECT OBSERVATION METHOD, APPARATUS, AND PROGRAM

(71) Applicant: Hitachi High-Tech Corporation, Tokyo (JP)

(72) Inventors: Naoaki Kondo, Tokyo (JP); Yuki Doi, Tokyo (JP); Atsushi Miyamoto, Tokyo (JP); Hideki Nakayama, Tokyo (JP); Hirohiko Kitsuki, Tokyo (JP)

(73) Assignee: Hitachi High-Tech Corporation, Tokyo (JP)

( * ) Notice: Subject to any disclaimer, the term of this patent is extended or adjusted under 35 U.S.C. 154(b) by 481 days.

(21) Appl. No.: 18/152,252

(22) Filed: Jan. 10, 2023

(65) Prior Publication Data

US 2023/0238290 A1 Jul. 27, 2023

(30) Foreign Application Priority Data

Jan. 27, 2022 (JP) ................................. 2022-010717
Oct. 28, 2022 (JP) ................................. 2022-173347

(51) Int. Cl.
*H01L 21/66* (2006.01)
*G01N 21/95* (2006.01)
(Continued)

(52) U.S. Cl.
CPC ......... *H01L 22/12* (2013.01); *G01N 21/9503* (2013.01); *G01N 21/95607* (2013.01);
(Continued)

(58) Field of Classification Search
CPC ....... G06T 2207/30; G06T 2207/30108; G06T 2207/30148; G06T 2207/10016;
(Continued)

(56) References Cited

U.S. PATENT DOCUMENTS 7,161,667 B2    1/2007  Meeks et al.
7,706,599 B2 *  4/2010  Sim ......................... G06T 7/001
                                                        382/312

(Continued)

FOREIGN PATENT DOCUMENTS

JP      2008-541058 A    11/2008
JP      2010-165876 A     7/2010
(Continued)

*Primary Examiner* — Georgia Y Epps
(74) *Attorney, Agent, or Firm* — Foley & Lardner LLP

(57) ABSTRACT

A defect observation method includes, as steps executed by a computer system, a first step of acquiring, as a bevel image, an image captured using defect candidate coordinates in a bevel portion as an imaging position by using a microscope or an imaging apparatus; and a second step of detecting a defect in the bevel image. The second step includes a step of determining whether there is at least one portion among a wafer edge, a wafer notch, and an orientation flat in the bevel image, a step of switching and selectively applying a defect detection scheme of detecting the defect from the bevel image from a plurality of schemes which are candidates based on a determination result, and a step of executing a process of detecting the defect from the bevel image in conformity with the switched scheme.

32 Claims, 33 Drawing Sheets

(51) Int. Cl.

| | |
|---|---|
| *G01N 21/956* | (2006.01) |
| *G06T 7/13* | (2017.01) |
| *H01J 37/28* | (2006.01) |

(52) U.S. Cl.
CPC ................ *G06T 7/13* (2017.01); *H01J 37/28* (2013.01); *G06T 2207/10061* (2013.01); *G06T 2207/30148* (2013.01)

(58) Field of Classification Search
CPC ....... G06T 2207/10004; G06T 2207/10; G06T 2207/10052; G06T 2207/10056; G06T 2207/10061; G06T 7/174; G06T 7/10; G06T 7/13; H01L 37/28; H01L 22/26; H01L 22/20; H01L 22/00; H01L 22/10; H01L 22/12; G01N 21/88; G01N 21/95; G01N 21/9501; G01N 21/9503; G01N 21/9505; G01N 21/956; G01N 21/95607; G01N 21/95684; G01N 21/95692; G01N 2021/95615
See application file for complete search history.

(56) References Cited

U.S. PATENT DOCUMENTS

| | | | | |
|---|---|---|---|---|
| 7,873,202 | B2 * | 1/2011 | Kurihara | H01J 37/222 |
| | | | | 382/141 |
| 9,857,312 | B2 * | 1/2018 | Lev | G01N 21/9503 |
| 10,871,454 | B2 * | 12/2020 | Chou | G01N 21/9503 |

| | | | | |
|---|---|---|---|---|
| 10,971,325 | B2 | 4/2021 | Harada et al. | |
| 11,600,497 | B2 * | 3/2023 | Madhogarhia | G01B 15/00 |
| 11,927,545 | B1 * | 3/2024 | Drillman | G01N 21/9503 |
| 2005/0013474 | A1 * | 1/2005 | Sim | G01N 21/9503 |
| | | | | 382/145 |
| 2005/0087686 | A1 * | 4/2005 | Honda | G01N 23/2251 |
| | | | | 250/311 |
| 2006/0115142 | A1 * | 6/2006 | Sim | G06T 7/001 |
| | | | | 382/145 |
| 2007/0031026 | A1 * | 2/2007 | Kurihara | H01J 37/28 |
| | | | | 382/149 |
| 2008/0204756 | A1 * | 8/2008 | Sim | G06T 7/001 |
| | | | | 356/445 |
| 2009/0116727 | A1 * | 5/2009 | Jin | G01N 21/9503 |
| | | | | 382/149 |
| 2009/0161094 | A1 * | 6/2009 | Watkins | G06T 7/0004 |
| | | | | 348/126 |
| 2009/0268959 | A1 * | 10/2009 | Harada | G06T 7/0004 |
| | | | | 382/218 |
| 2010/0026997 | A1 * | 2/2010 | Hayashi | H01L 22/12 |
| | | | | 382/145 |
| 2015/0330914 | A1 * | 11/2015 | Maleev | G01N 21/47 |
| | | | | 356/237.5 |
| 2023/0238290 | A1 * | 7/2023 | Kondo | G01N 21/9501 |
| | | | | 438/14 |
| 2024/0127417 | A1 * | 4/2024 | Hirai | G01N 23/2251 |

FOREIGN PATENT DOCUMENTS

| | | |
|---|---|---|
| JP | 2020-043266 A | 3/2020 |
| WO | WO-2021/075170 A1 | 4/2021 |

* cited by examiner

Figure 6:
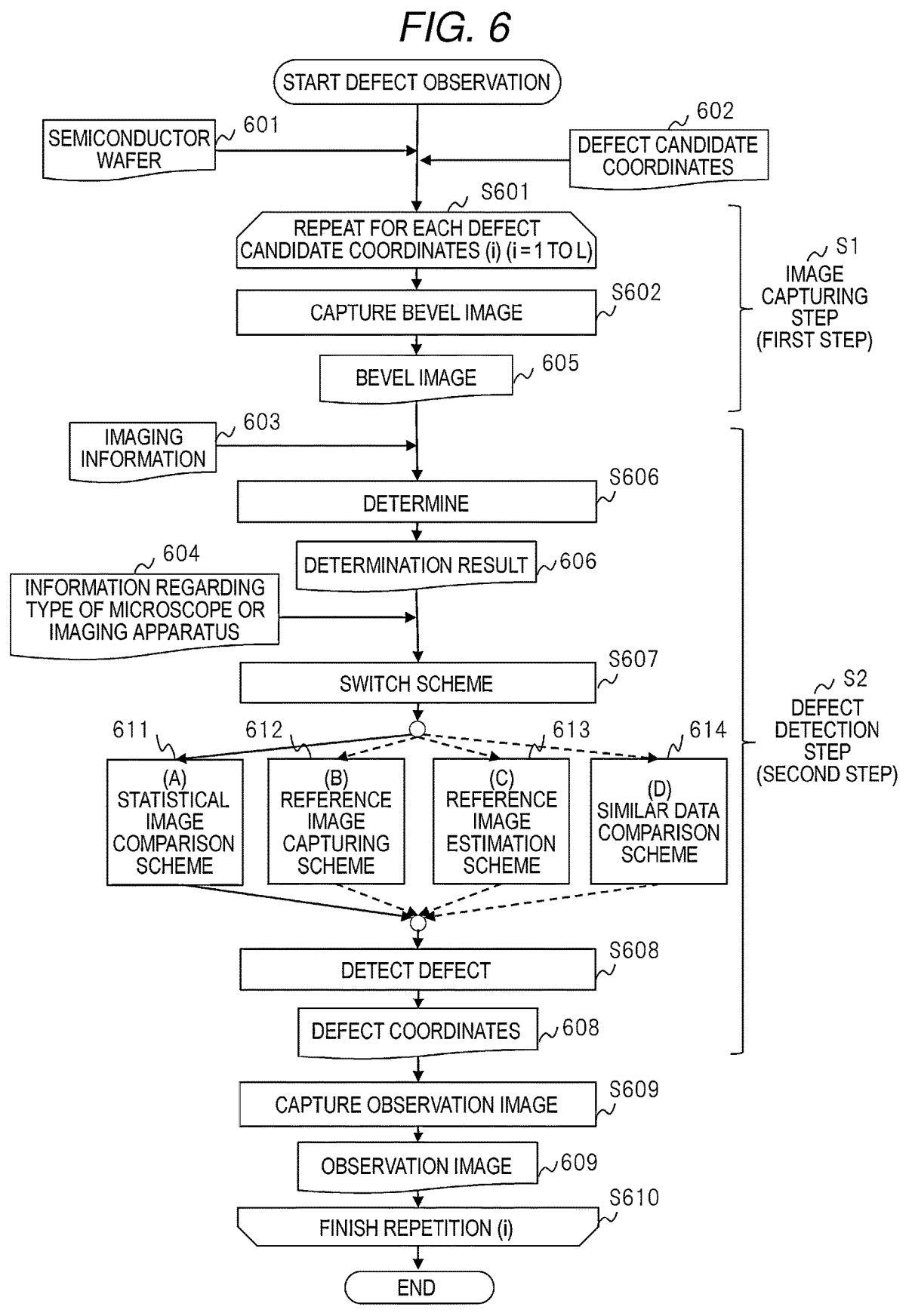

START DEFECT OBSERVATION

SEMICONDUCTOR WAFER ~ 601

DEFECT CANDIDATE COORDINATES ~ 602

~ S601
REPEAT FOR EACH DEFECT CANDIDATE COORDINATES (i) (i = 1 TO L)

CAPTURE BEVEL IMAGE S602

BEVEL IMAGE ~ 605

} ~ S1 IMAGE CAPTURING STEP (FIRST STEP)

IMAGING INFORMATION ~ 603

DETERMINE S606

INFORMATION REGARDING TYPE OF MICROSCOPE OR IMAGING APPARATUS ~ 604

DETERMINATION RESULT ~ 606

SWITCH SCHEME S607

611 — (A) STATISTICAL IMAGE COMPARISON SCHEME

612 — (B) REFERENCE IMAGE CAPTURING SCHEME

613 — (C) REFERENCE IMAGE ESTIMATION SCHEME

614 — (D) SIMILAR DATA COMPARISON SCHEME

~ S2 DEFECT DETECTION STEP (SECOND STEP)

DETECT DEFECT S608

DEFECT COORDINATES ~ 608

CAPTURE OBSERVATION IMAGE S609

OBSERVATION IMAGE ~ 609

FINISH REPETITION (i) S610

END

FIG. 7A

| | ABSENCE OF WAFER NOTCH AND ORIENTATION FLAT | PRESENCE OF WAFER NOTCH | PRESENCE OF ORIENTATION FLAT |
|---|---|---|---|
| ABSENCE OF WAFER EDGE | FIRST INSTANCE | THIRD INSTANCE | FOURTH INSTANCE |
| PRESENCE OF WAFER EDGE | SECOND INSTANCE | FIFTH INSTANCE | SIXTH INSTANCE |

FIG. 7B

| | ABSENCE OF WAFER NOTCH AND ORIENTATION FLAT | PRESENCE OF WAFER NOTCH | PRESENCE OF ORIENTATION FLAT |
|---|---|---|---|
| ABSENCE OF WAFER EDGE | FIRST INSTANCE | THIRD INSTANCE | FOURTH INSTANCE |
| | SCHEMES : A,B,C,D | SCHEMES : B,C,D | SCHEMES : B,C,D |
| | PARTICULARLY SCHEME A | PARTICULARLY SCHEME D | PARTICULARLY SCHEME D |
| PRESENCE OF WAFER EDGE | SECOND INSTANCE | FIFTH INSTANCE | SIXTH INSTANCE |
| | SCHEMES : B,C,D | SCHEMES : B,C,D | SCHEMES : B,C,D |
| | PARTICULARLY SCHEME C (OR B) | PARTICULARLY SCHEME D | PARTICULARLY SCHEME D |

*FIG. 8A*
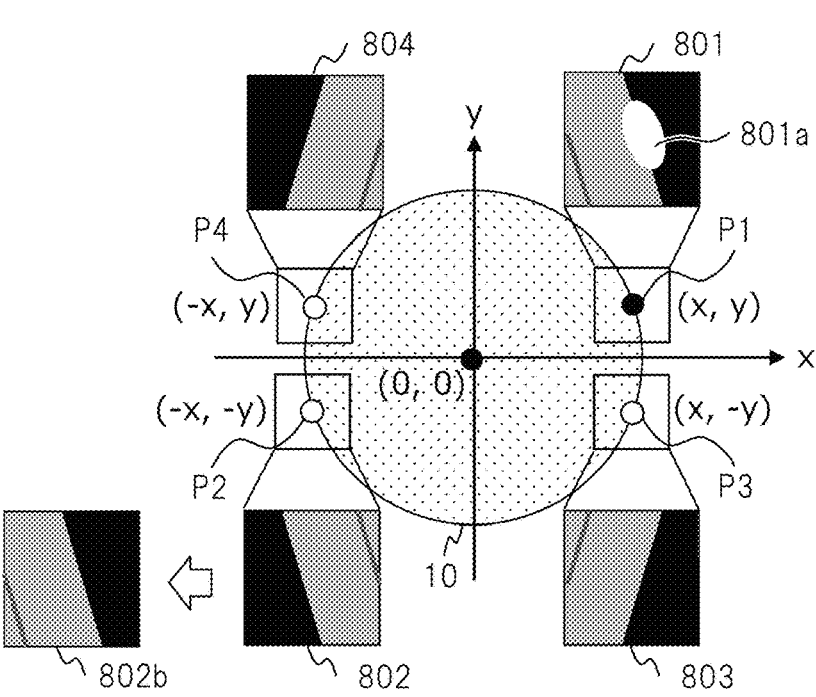
*FIG. 8B*               *FIG. 8C*
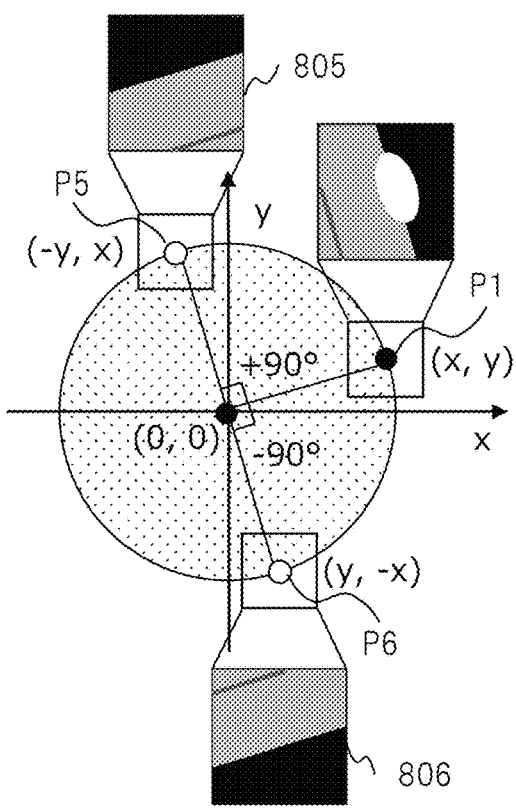 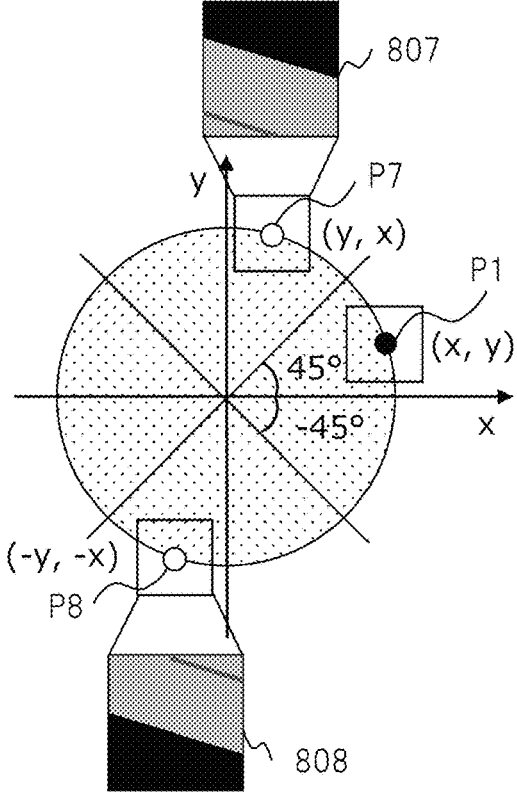

FIG. 11
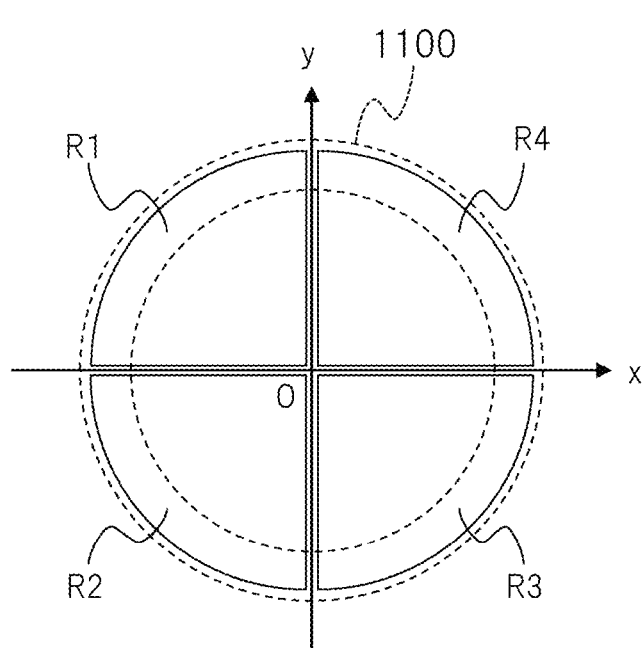
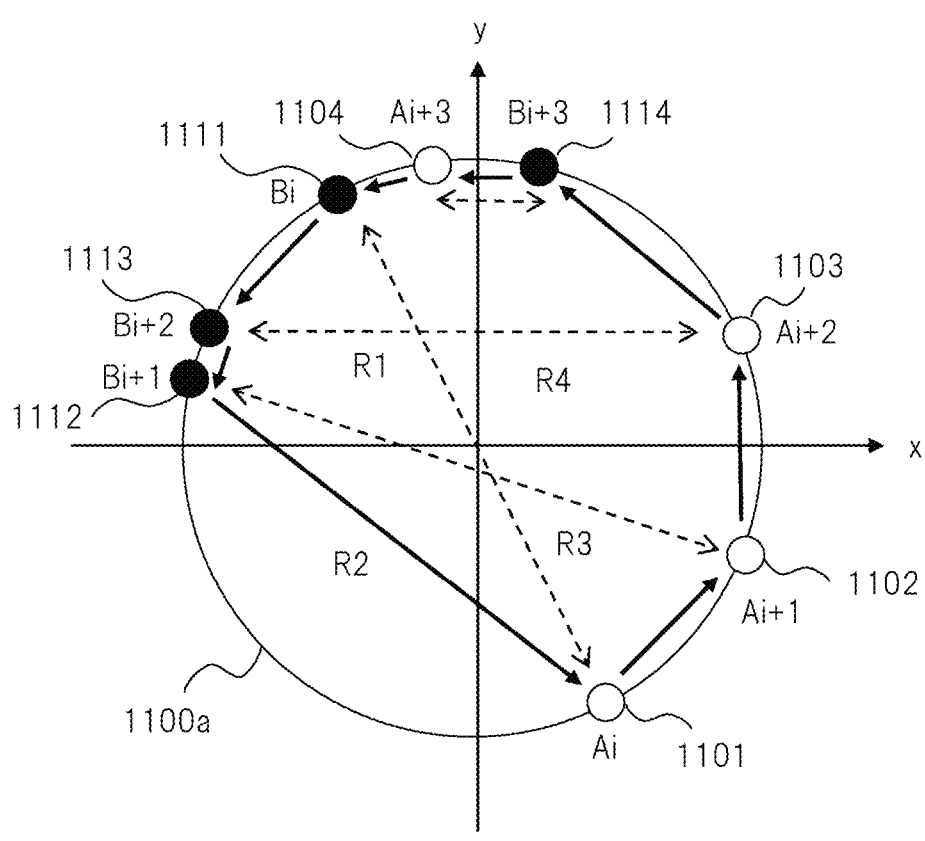

| | FIRST INSTANCE | SECOND INSTANCE | THIRD INSTANCE | FOURTH INSTANCE |
|---|---|---|---|---|
| IMAGE EXAMPLES | 2001 | 2002 | 2003 | 2004 |
| PRESENCE OR ABSENCE OF REGION BOUNDARY | ABSENT | PRESENT | PRESENT | PRESENT |
| PRESENCE OR ABSENCE OF REGION BOUNDARY IN CURVED LINE | NON-RELATION | ABSENT (STRAIGHT LINE) | ABSENT (STRAIGHT LINE) | PRESENT (CURVED LINE) |
| PRESENCE OR ABSENCE OF NOTCH / ORIENTATION FLAT | NON-RELATION | ABSENT | PRESENT (NOTCH / ORIENTATION FLAT) | ABSENT |

FIG. 20B

| INSTANCE (CLASSIFICATION) | FIRST INSTANCE (FIRST CLASSIFICATION) | SECOND INSTANCE (SECOND CLASSIFICATION) | THIRD INSTANCE (THIRD CLASSIFICATION) | FOURTH INSTANCE (FOURTH CLASSIFICATION) |
|---|---|---|---|---|
| APPLICABLE DEFECT DETECTION SCHEME | FIRST TO THIRD SCHEMES | SECOND SCHEME THIRD SCHEME | THIRD SCHEME | THIRD SCHEME |
| PARTICULARLY EFFECTIVE DEFECT DETECTION SCHEME | FIRST SCHEME | SECOND SCHEME | THIRD SCHEME | THIRD SCHEME |

CASE OF WAFER-OUTSIDE REGION
(CASE IN WHICH NOTCH /
ORIENTATION FLAT IS NOT INCLUDED)

CASE IN WHICH NOTCH REGION
IS INCLUDED

CASE IN WHICH ORIENTATION FLAT
REGION REGION IS INCLUDED

CASE IN WHICH BOUNDARY IS
SHOWN AS STRAIGHT LINE

CASE IN WHICH BOUNDARY IS
SHOWN AS CURVED LINE

APPROXIMATED TO ONE STRAIGHT
LINE IN CASE IN WHICH BOUNDARY
IS SHOWN AS CURVED LINE

APPROXIMATED TO PLURALITY OF
STRAIGHT LINES IN CASE IN
WHICH BOUNDARY IS SHOWN
AS CURVED LINE

FIG. 27
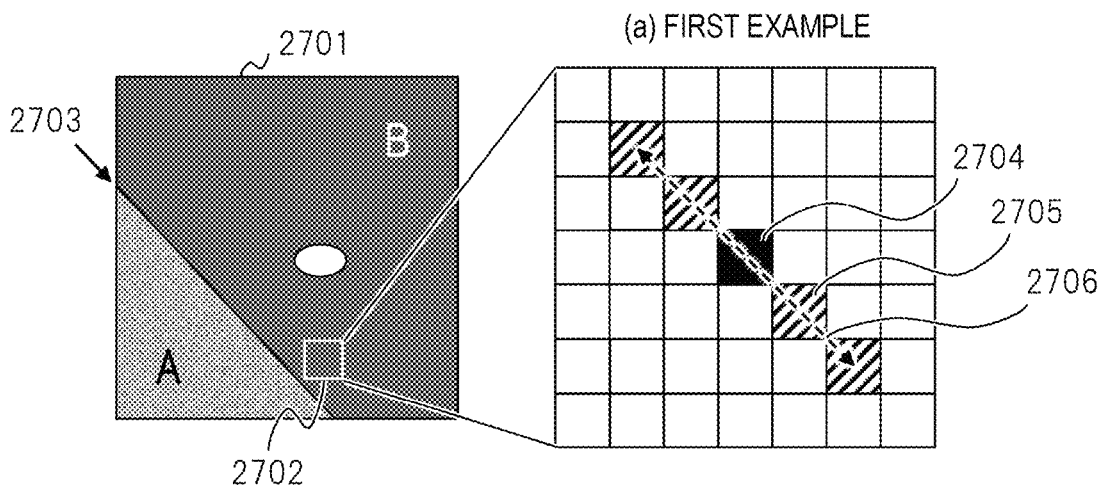
(a) FIRST EXAMPLE
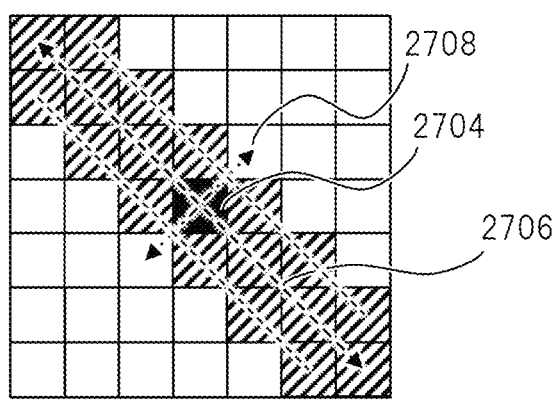
(b) SECOND EXAMPLE

FIG. 30A
3000 : REGION BOUNDARY DISTANCE INFORMATION
| PIXEL | DISTANCE FROM REGION BOUNDARY 1 | DISTANCE FROM REGION BOUNDARY 2 | NEARBY REGION BOUNDARY |
|---|---|---|---|
| . . . | . . . | . . . | . . . |
| (x1, y1) | E1 | E2 | REGION BOUNDARY 1 |
| . . . | . . . | . . . | . . . |
| (x2, y2) | E3 | E4 | REGION BOUNDARY 2 |
| . . . | . . . | . . . | . . . |
3001  3002  3003  3004
FIG. 30B
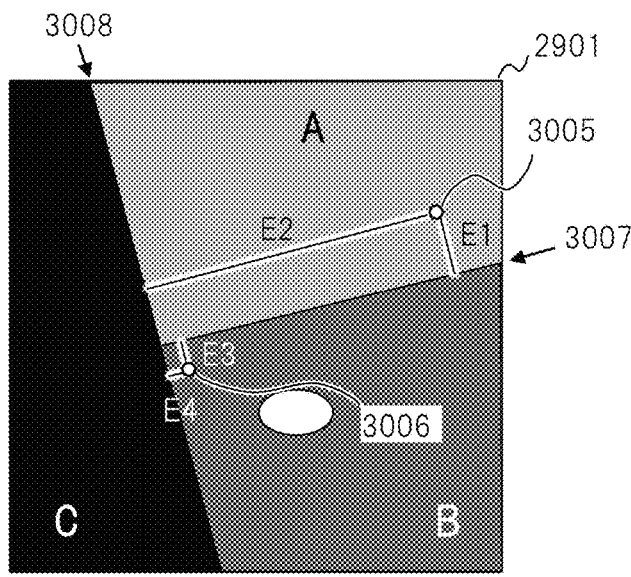
FIG. 30C
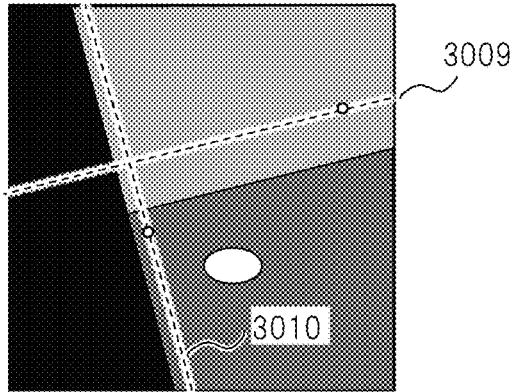

DEFECT OBSERVATION METHOD, APPARATUS, AND PROGRAM

BACKGROUND OF THE INVENTION

1. Field of the Invention

The present invention relates to a technology for observing a sample or a defect, for example, a technology for a defect observation apparatus observing a defect on an outer circumferential portion of a semiconductor wafer.

2. Description of Related Art

In manufacturing of semiconductor wafers, it is important to launch manufacturing processes quickly and proceed to mass production of high yields early in order to guarantee profits. For this purpose, various inspection apparatuses, observation apparatuses, measurement apparatuses, and the like are introduced in manufacturing lines. For semiconductor wafers which are samples, for example, defects (foreign substances, defects, and the like are generally referred to as defects) are inspected by inspection apparatuses. Inspection apparatuses output coordinate information indicating positions or portions of defects in samples as defect candidate coordinates. The output defect candidate coordinates are supplied to defect observation apparatuses which are observation apparatuses observing defects.

The defect observation apparatuses capture image defect candidates on wafers at high resolutions based on the defect candidate coordinates and output captured images. As the defect observation apparatuses, observation apparatuses using optical microscopes or observation apparatuses using scanning electron microscopes (SEMs) are widely used.

It is preferable to automate observation works using observation apparatuses in mass production lines of semiconductor wafers. To realize automation in a mass production line, an observation apparatus includes a function of executing automatic defect image collection, in other words, automatic defect review (ADR), to automatically collect images at defect positions in samples and a function of executing automatic defect image classification, in other words, automatic defect classification (ADC), to automatically classify collected defect images in some cases. It is possible to automatically obtain the classified defect images using such functions.

There are errors in defect candidate coordinates output by an inspection apparatus. Since there is a difference between a coordinate system of defect candidate coordinates in an inspection apparatus and a coordinate system in an observation apparatus, defect candidates are unnoticed in some cases even when defect candidate coordinates are imaged by the observation apparatus because of a deviation resulting from the difference. Therefore, the observation apparatus executes wide visual field imaging by centering defect candidate coordinates in ADR and detects defect candidate portions from images obtained through the imaging. The observation apparatus images the defect candidate portions obtained in this way at a high magnification and a high resolution and outputs captured images as observation images.

Examples of a technology of the related art regarding detection of a defect on an outer circumferential portion or a bevel portion of a semiconductor wafer include WO2021/075170 (hereinafter referred to as Patent Literature 1).

Patent Literature 1 discloses a scheme of using machine learning to detect a defect on a bevel as an inspection system or the like.

SUMMARY OF THE INVENTION

Even on an outer circumferential portion, in other words, a bevel portion, of a surface of a semiconductor wafer which is a sample, a defect arises in some cases. Here, in the present specification, a bevel portion is a generic name including, as an outer circumferential portion of a semiconductor wafer, various 3-dimensional shape or structure portions which are generally on an outer circumferential portion including a ring-shaped region or a wafer side surface portion near the outer circumferential portion of a circular upper surface (in other words, a top surface) of the wafer, for example, a narrow bevel (that is, a chamfered slope surface), a wafer edge, a wafer notch, an orientation flat, and the like. In other words, the wafer edge is a boundary between a wafer region and an outer region. The wafer notch (sometimes referred simply to as a notch) is a groove portion cut in, for example, a V shape formed to show crystal orientation of a wafer. The orientation flat is a portion cut in, for example, a straight or planar shape formed to show crystal orientation of a wafer.

A defect arising in such an outer circumferential portion or a bevel portion is moved into the inside of a wafer (in other words, the inside of an upper surface of the wafer) during a manufacturing process. In this case, there is an instance in which a critical defect arises. From this viewpoint, it is necessary to observe a defect arising in an outer circumferential portion or a bevel portion of a sample.

In semiconductor manufacturing, for example, a defect observation apparatus observes a defect arising in an outer circumferential portion or a bevel portion of a semiconductor wafer which is a sample. However, for a bevel portion, whether there is a reflection of a narrow bevel, a wafer edge, a wafer notch, or an orientation flat or a disposition direction and angle of a wafer edge in an image differs depending on a position at which an observation image is captured as an inspection image. Therefore, with a single defect observation and detection scheme, it is difficult to observe and detect a defect with high accuracy.

An objective of the present invention is to provide a technology for observing and detecting a defect on an outer circumferential portion or a bevel portion of a sample with high accuracy.

A representative embodiment of the present disclosure has the following configuration. A defect observation method according to the embodiment is a defect observation method of observing a defect in a bevel portion of a semiconductor wafer which is a sample using a computer system that includes a processor and a memory resource. The method includes: as steps executed by the computer system, a first step of acquiring, as a bevel image, an image in which defect candidate coordinates in the bevel portion are imaged as an imaging position using a microscope or an imaging apparatus; and a second step of detecting a defect in the bevel image. The second step includes a determination step of determining whether there is at least one portion among a wafer edge, a wafer notch, and an orientation flat in the bevel image, a scheme switching step of switching and selectively applying a defect detection scheme of detecting the defect from the bevel image from a plurality of schemes which are candidates based on a determination result of the determination step, and a defect detection step of executing a process of detecting the defect from the bevel image in conformity with the scheme switched in the scheme switching step.

According to a representative embodiment of the present disclosure, it is possible to realize high accuracy in the technology for observing and detecting a defect on an outer circumferential portion or a bevel portion of a sample. Other tasks, configurations, advantages, and the like are apparent in modes for carrying out the invention.

BRIEF DESCRIPTION OF THE DRAWINGS

FIG. 2 is a diagram illustrating a configuration of a defect observation apparatus according to a first embodiment;

FIG. 5 is a diagram illustrating a difference in a way to view uneven defects in an image by the detector of the SEM;

FIG. 6 is a flowchart illustrating an overall processing operation in a defect observation method of the first embodiment executed by the defect observation apparatus according to the first embodiment;

FIGS. 7A and 7B are diagrams illustrating classification of bevel images to describe a determination step and a scheme switching step according to the first embodiment;

FIGS. 8A to 8C are schematic diagrams illustrating symmetric and rotational positions at which reference images for bevel images are captured in a reference image capturing scheme according to the first embodiment;

FIG. 11 is a diagram illustrating an imaging procedure of a plurality of images in the reference image capturing scheme according to the first embodiment;

FIG. 12 is a diagram illustrating an imaging procedure in a method of a comparative example with respect to FIG. 11;

4

Figure 19:
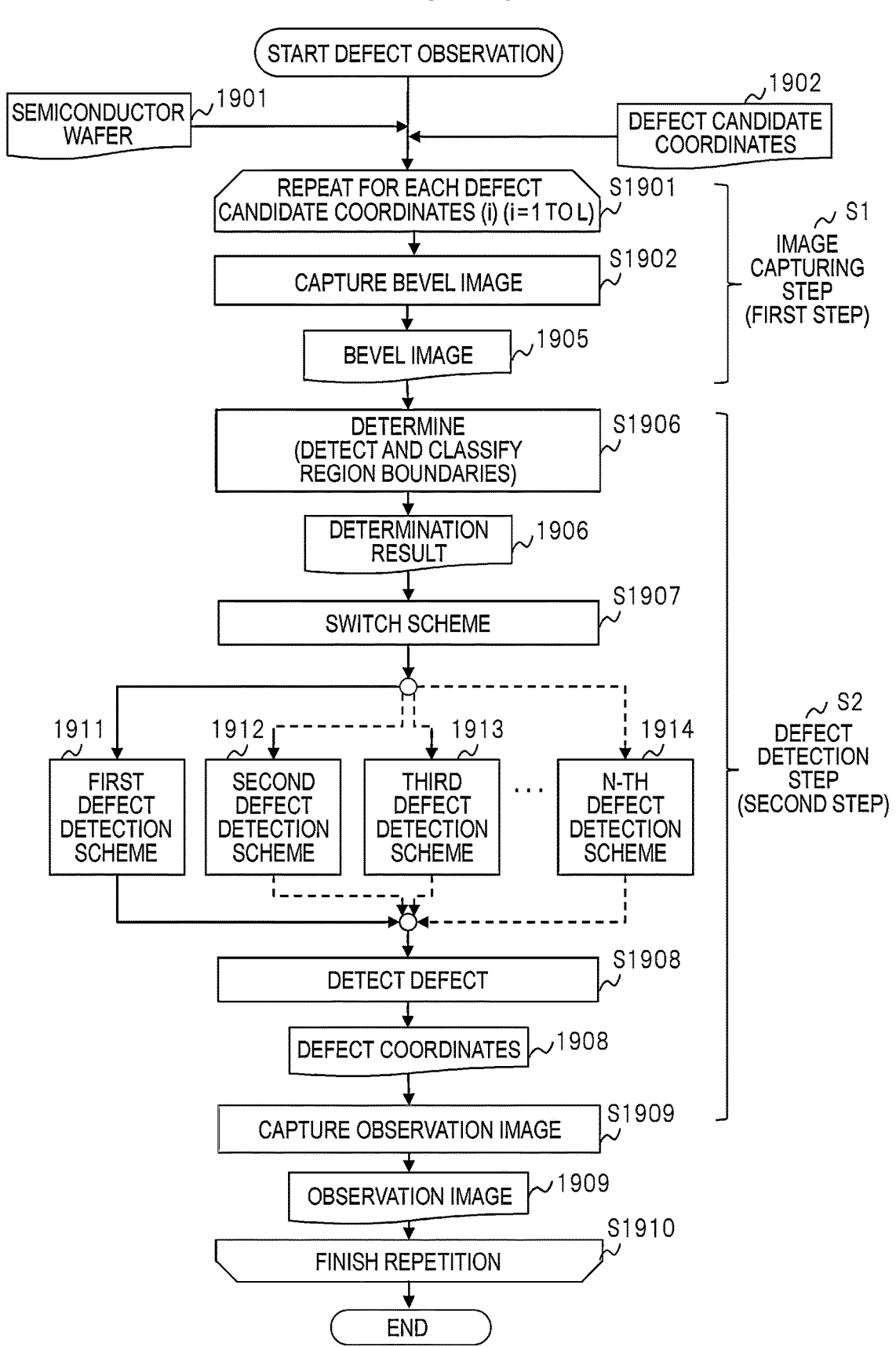
Figure 21:
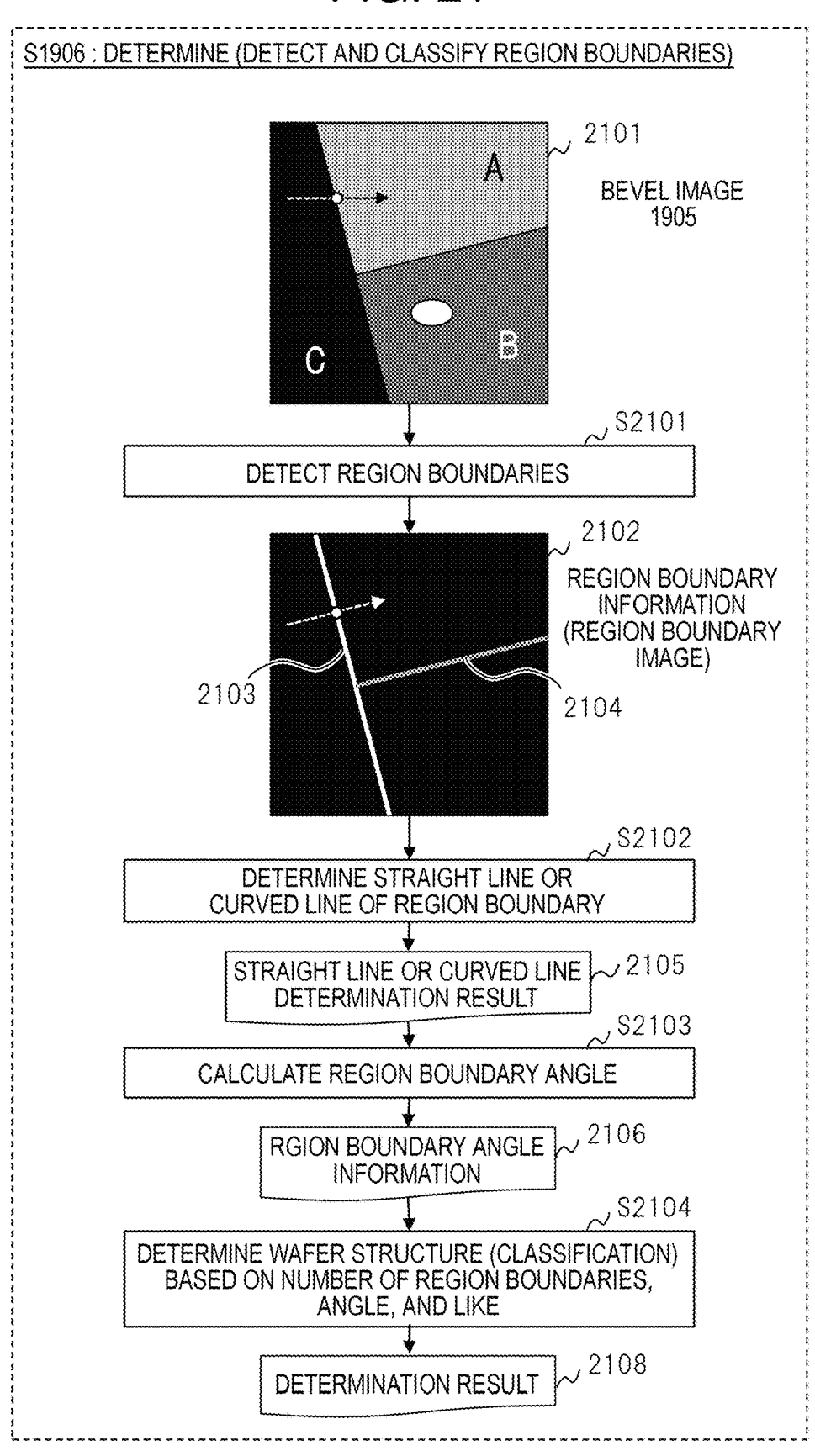
Figure 22A:
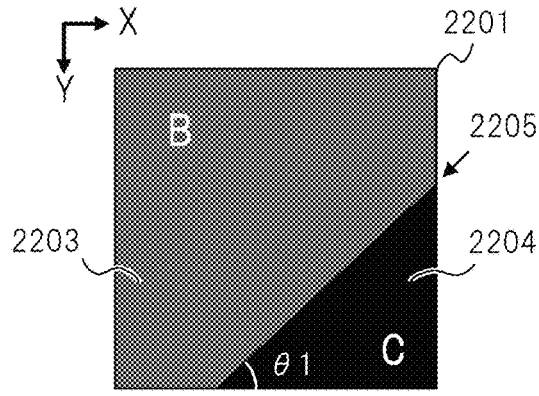
Figure 22B:
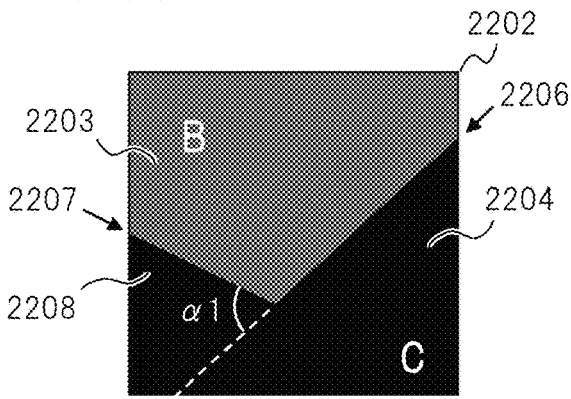
Figure 22C:
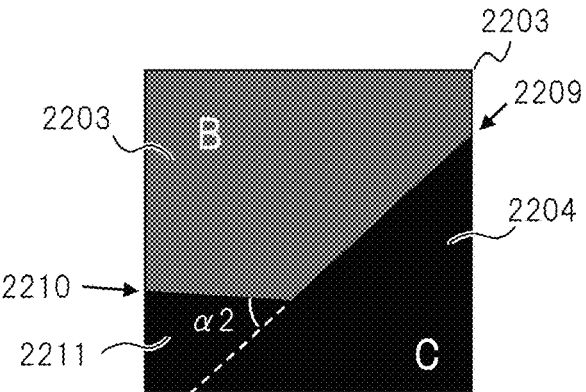
Figure 24:
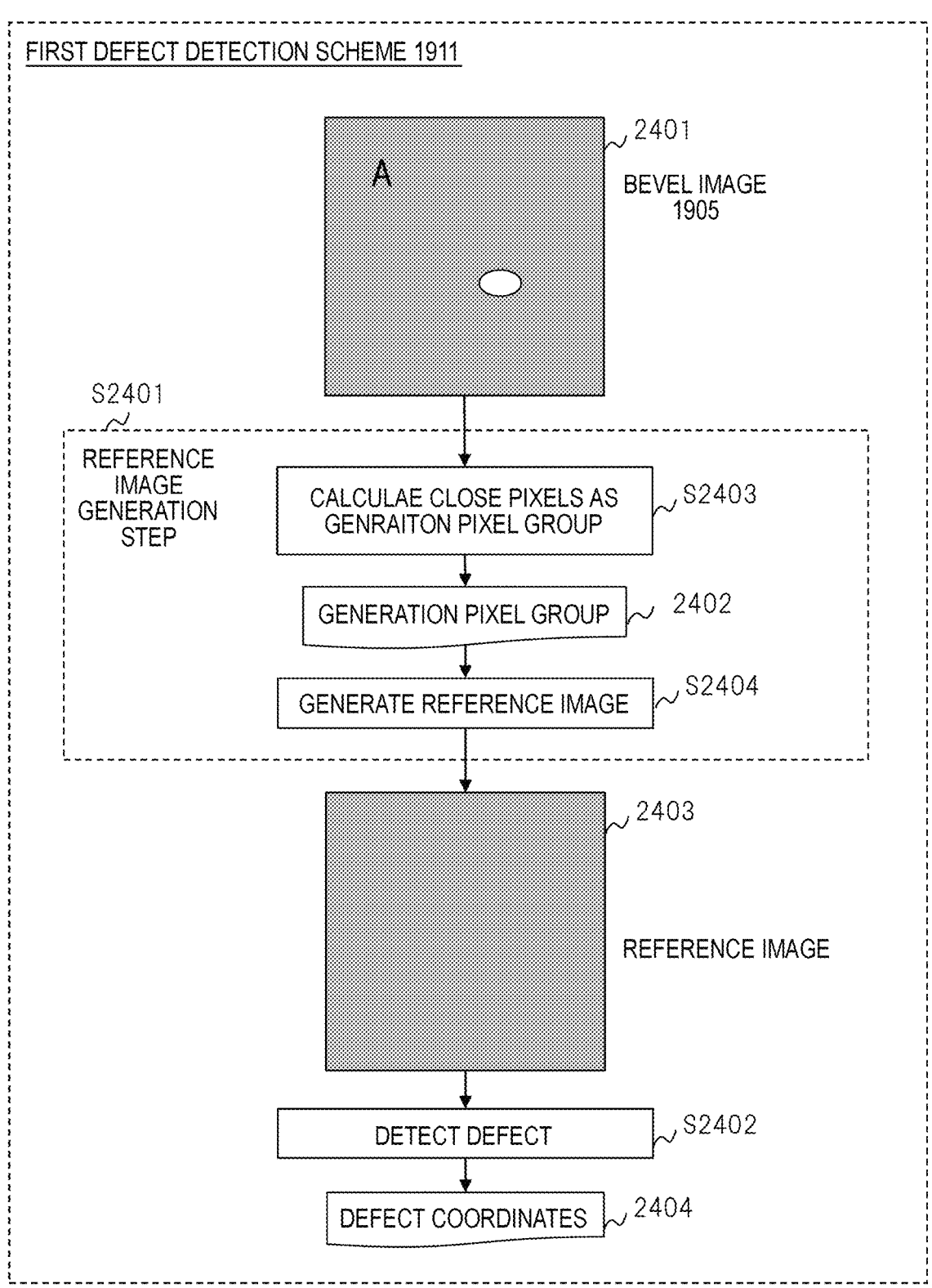
Figure 25:
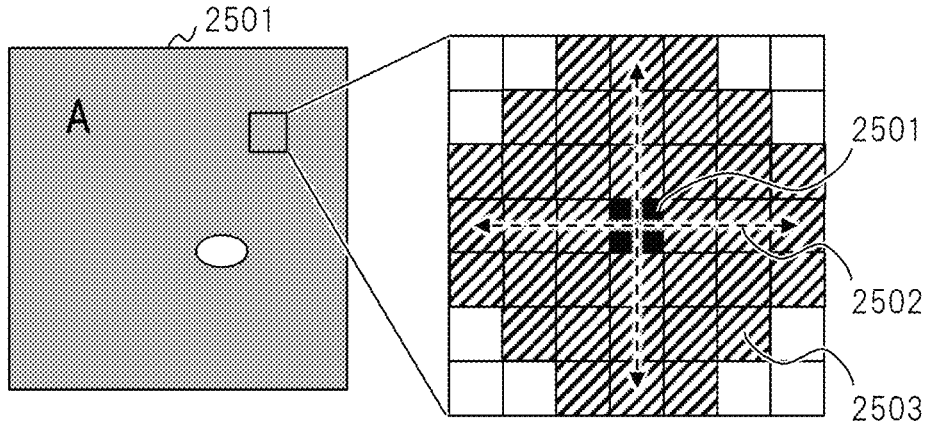
Figure 26:
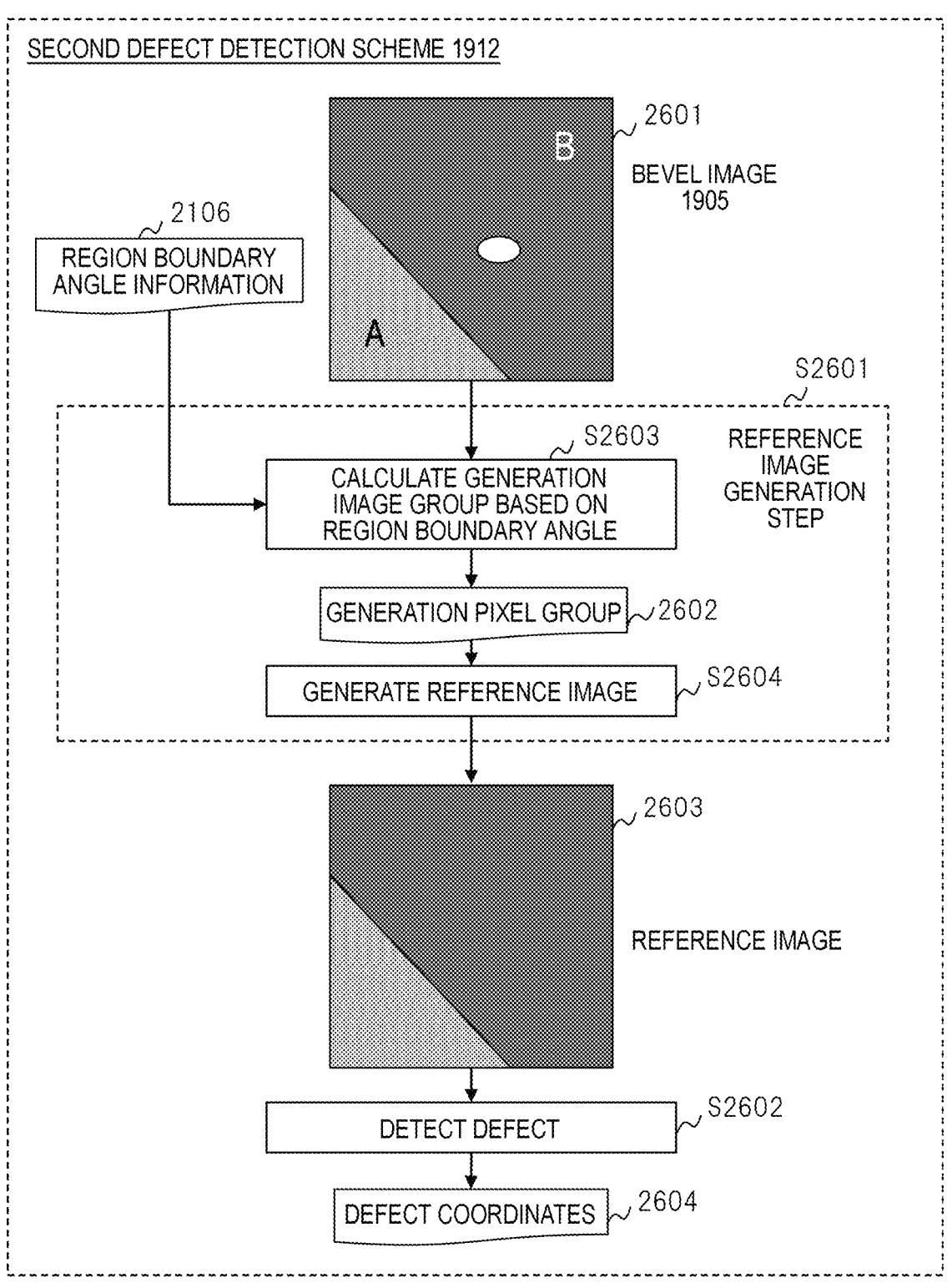
Figure 28:
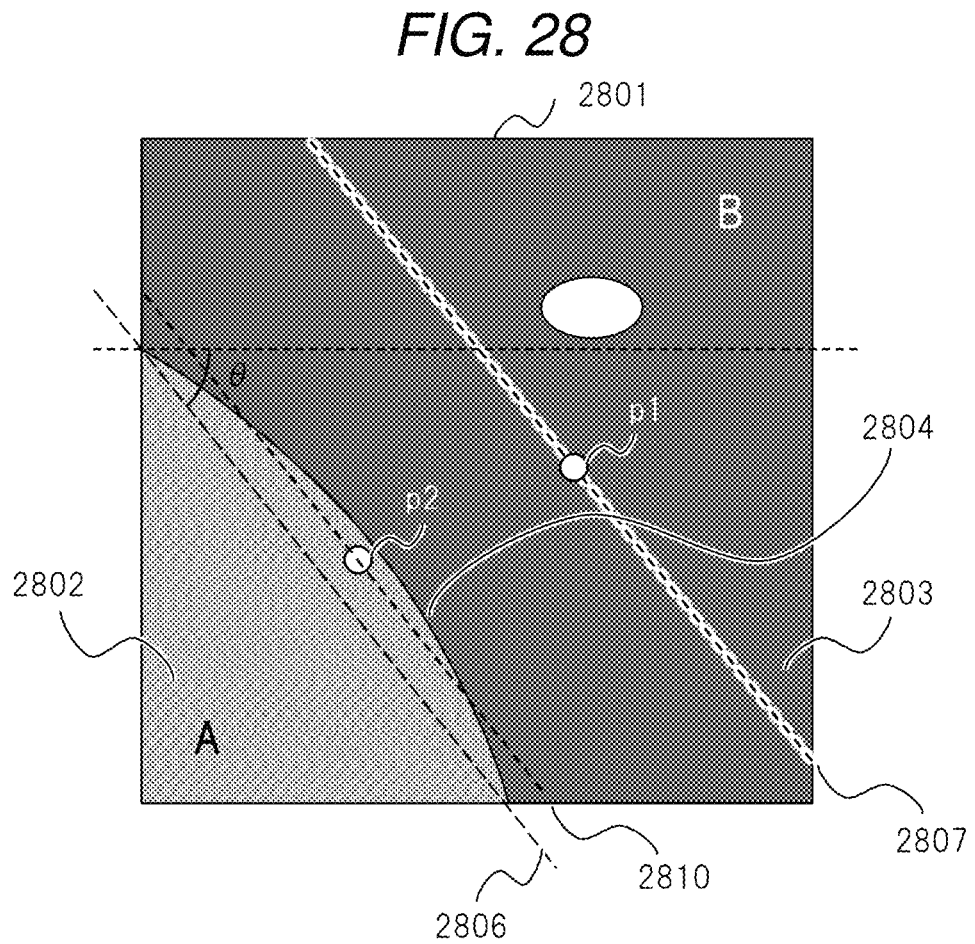
Figure 29:
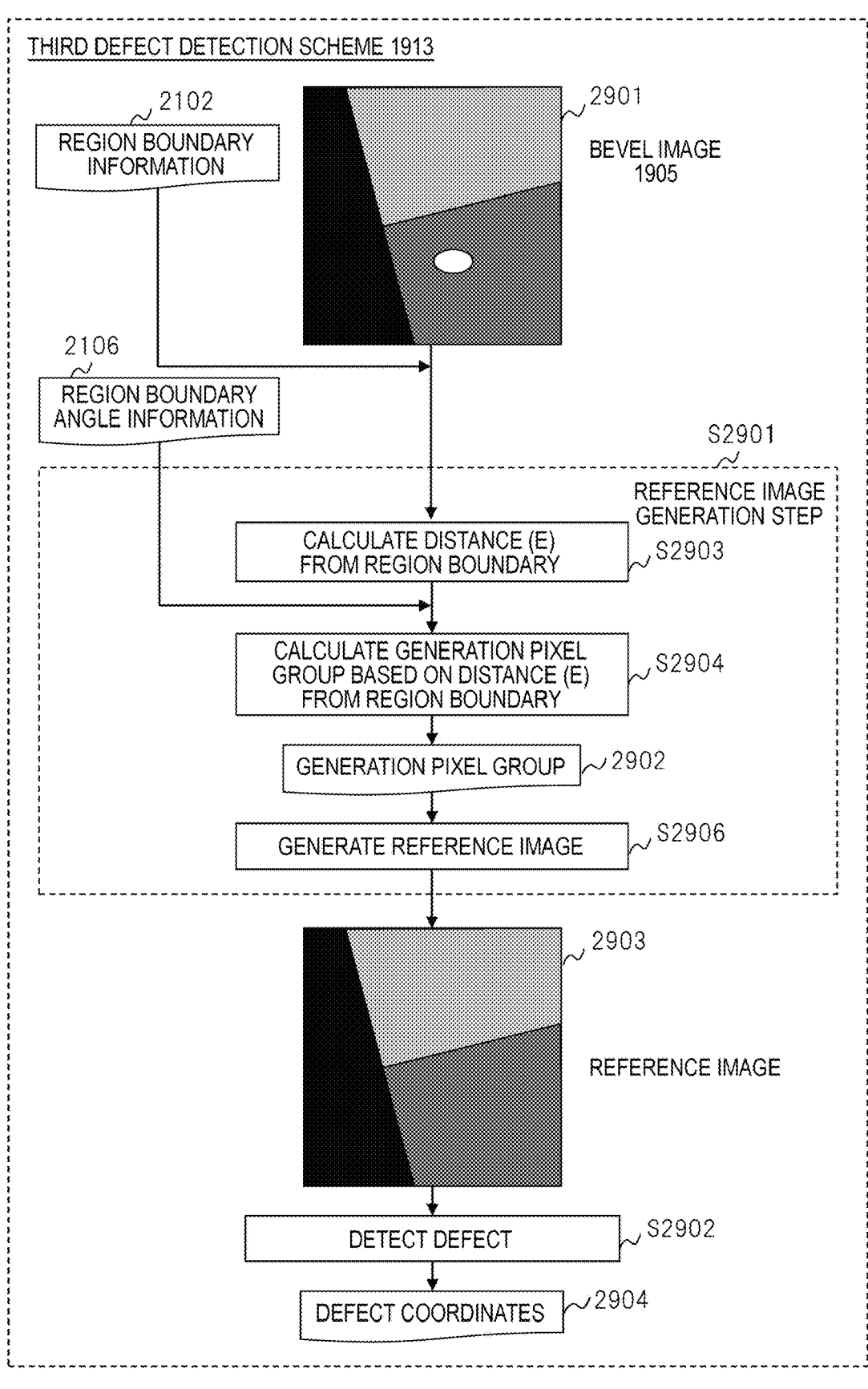
Figure 31A:
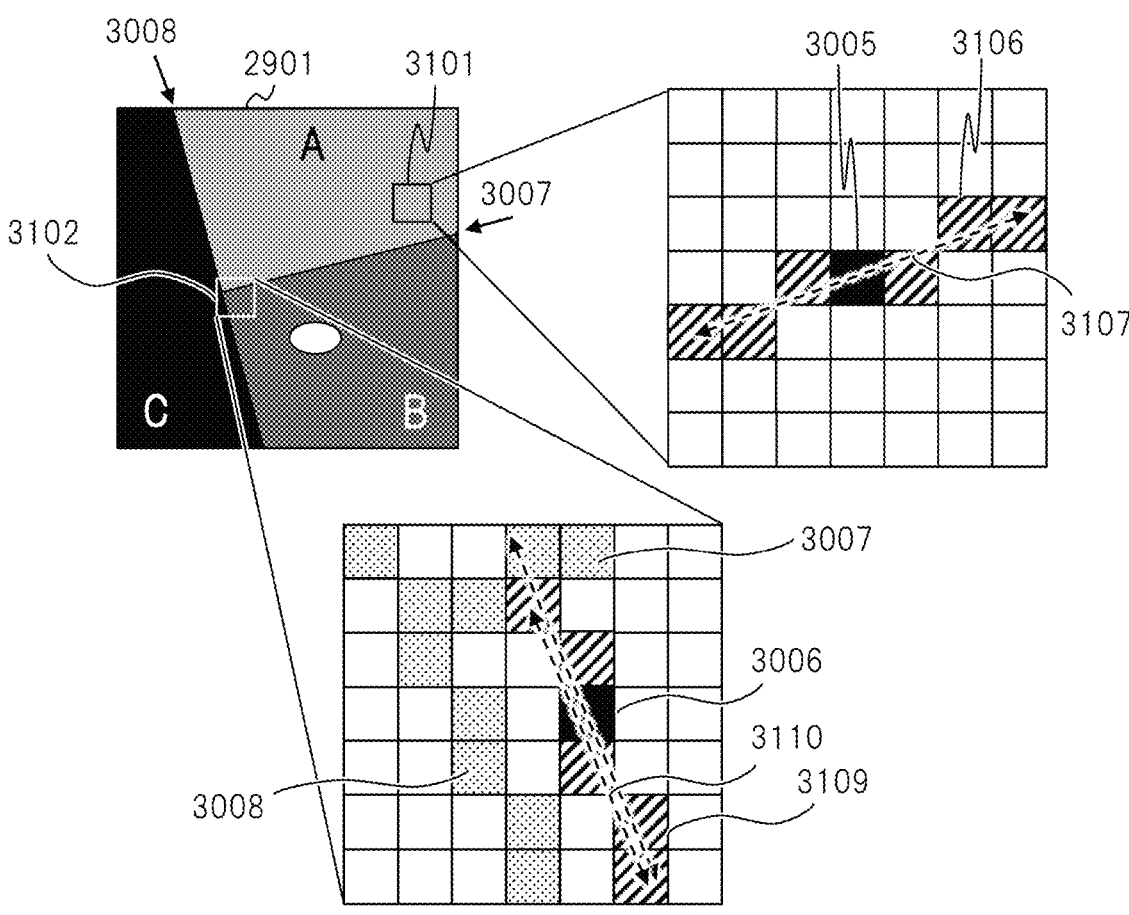
Figure 31B:
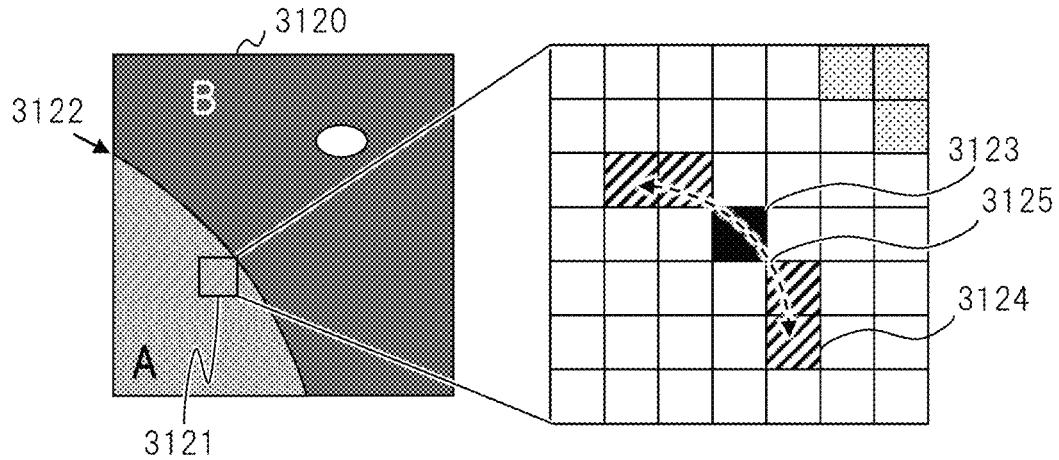
Figure 33:
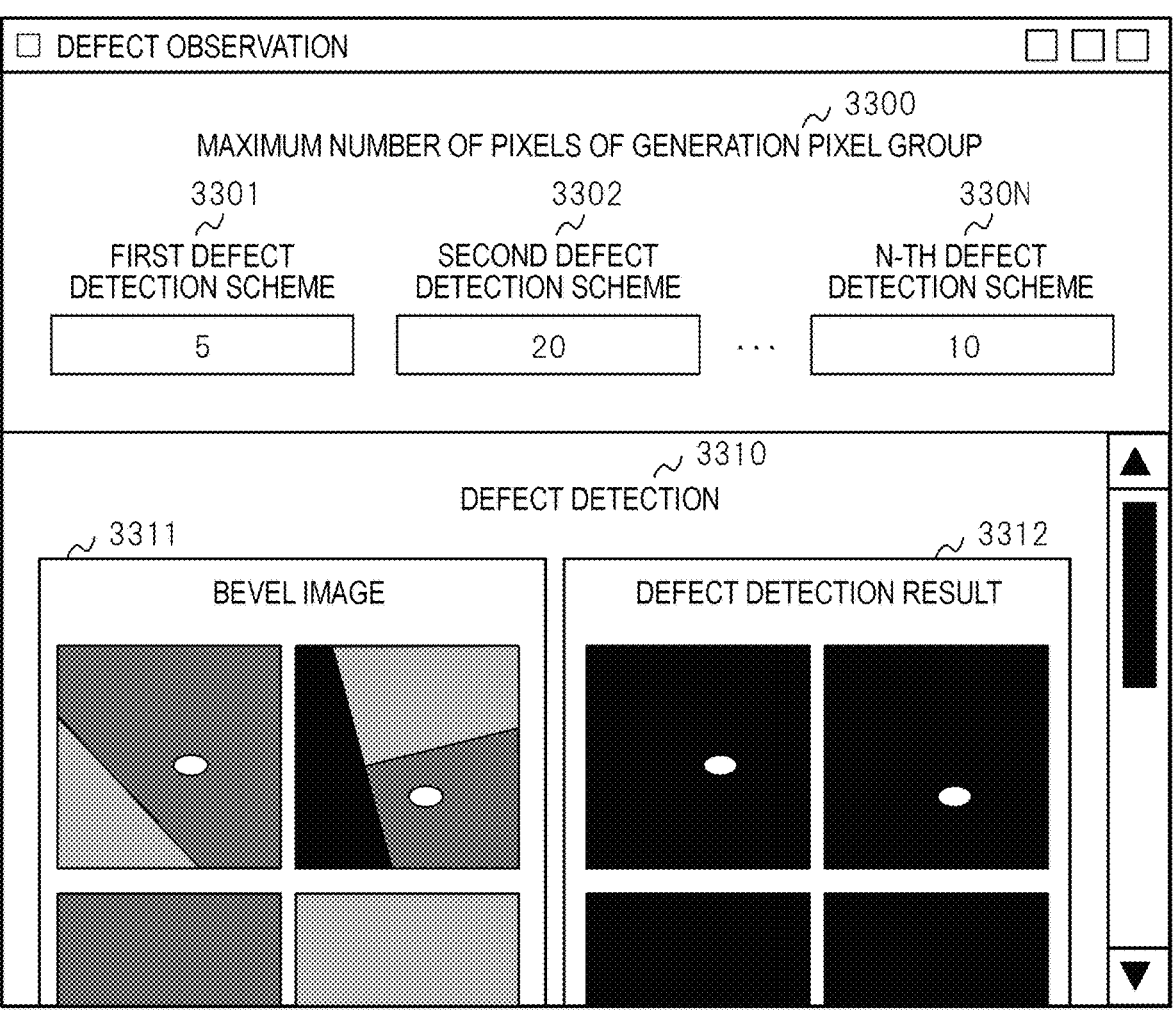
Figure 34:
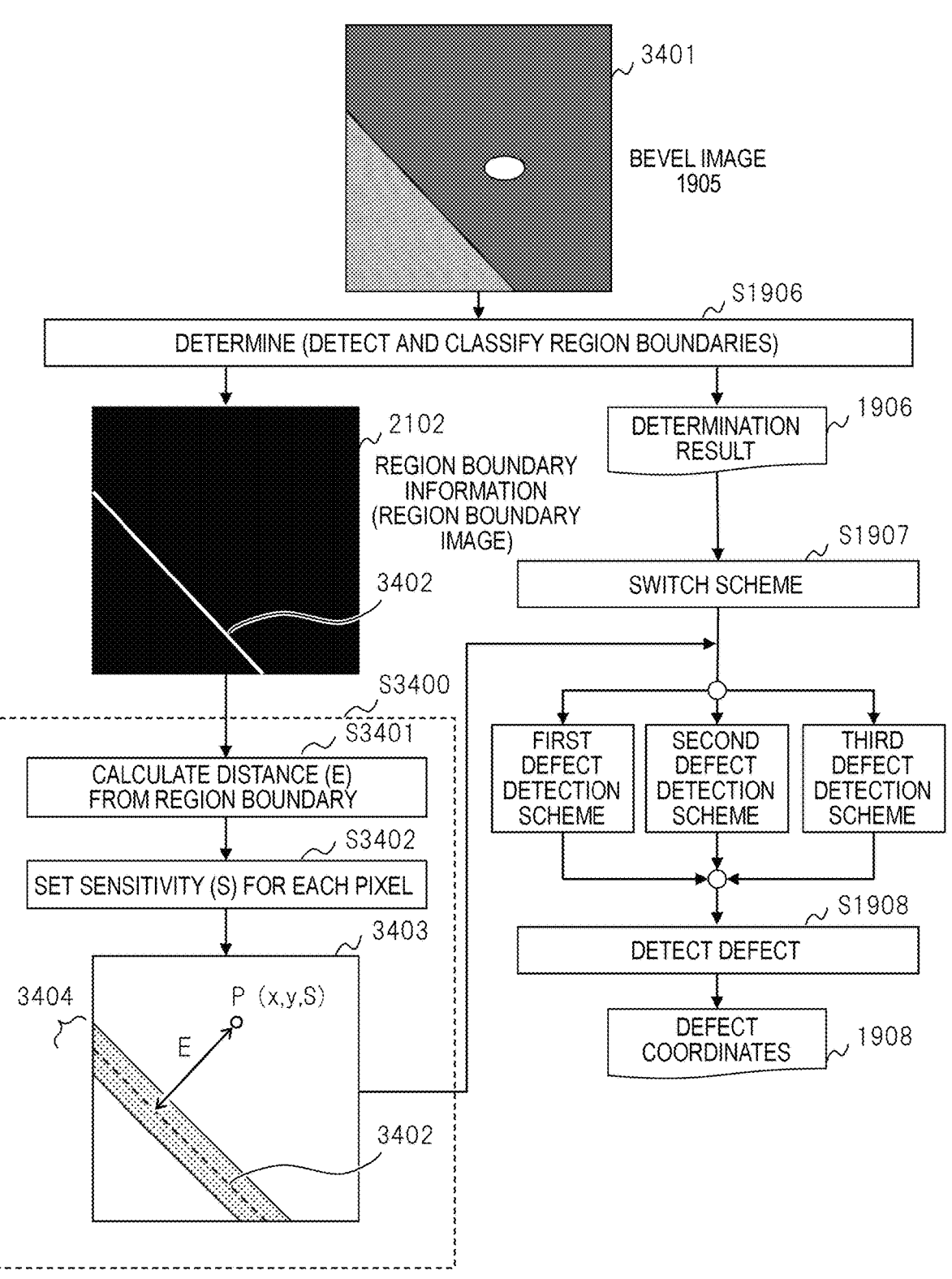

FIG. 19 is a flowchart illustrating an overall process in a defect observation method according to the second embodiment;

FIGS. 20A and 20B are diagrams illustrating classification of bevel images to describe a determination step and a scheme switching step according to the second embodiment;

FIG. 21 is a flowchart illustrating a process in the determination step according to the second embodiment;

FIGS. 22A to 22C are diagrams illustrating determination of presence or absence of a notch and an orientation flat according to the second embodiment;

FIGS. 23A to 23D are diagrams illustrating a straight line and a curved line of a region boundary according to the second embodiment;

FIG. 24 is a flowchart illustrating a process in a first defect detection scheme according to the second embodiment;

FIG. 25 is a diagram illustrating an example of generation of a generation pixel group in the first defect detection scheme according to the second embodiment;

FIG. 26 is a flowchart illustrating a process in a second defect detection scheme according to the second embodiment;

FIG. 27 is a diagram illustrating an example of generation of a generation pixel group in the second defect detection scheme according to the second embodiment;

FIG. 28 is a diagram illustrating a direction or the like of a region boundary according to a comparative example of the second embodiment;

FIG. 29 is a flowchart illustrating a process in a third defect detection scheme according to the second embodiment;

FIGS. 30A to 30C are diagrams illustrating an example of a distance from a region boundary in the third defect detection scheme according to the second embodiment;

FIGS. 31A and 31B are diagrams illustrating an example of generation of a generation pixel group in the third defect detection scheme according to the second embodiment;

Figures 32A, 32B:
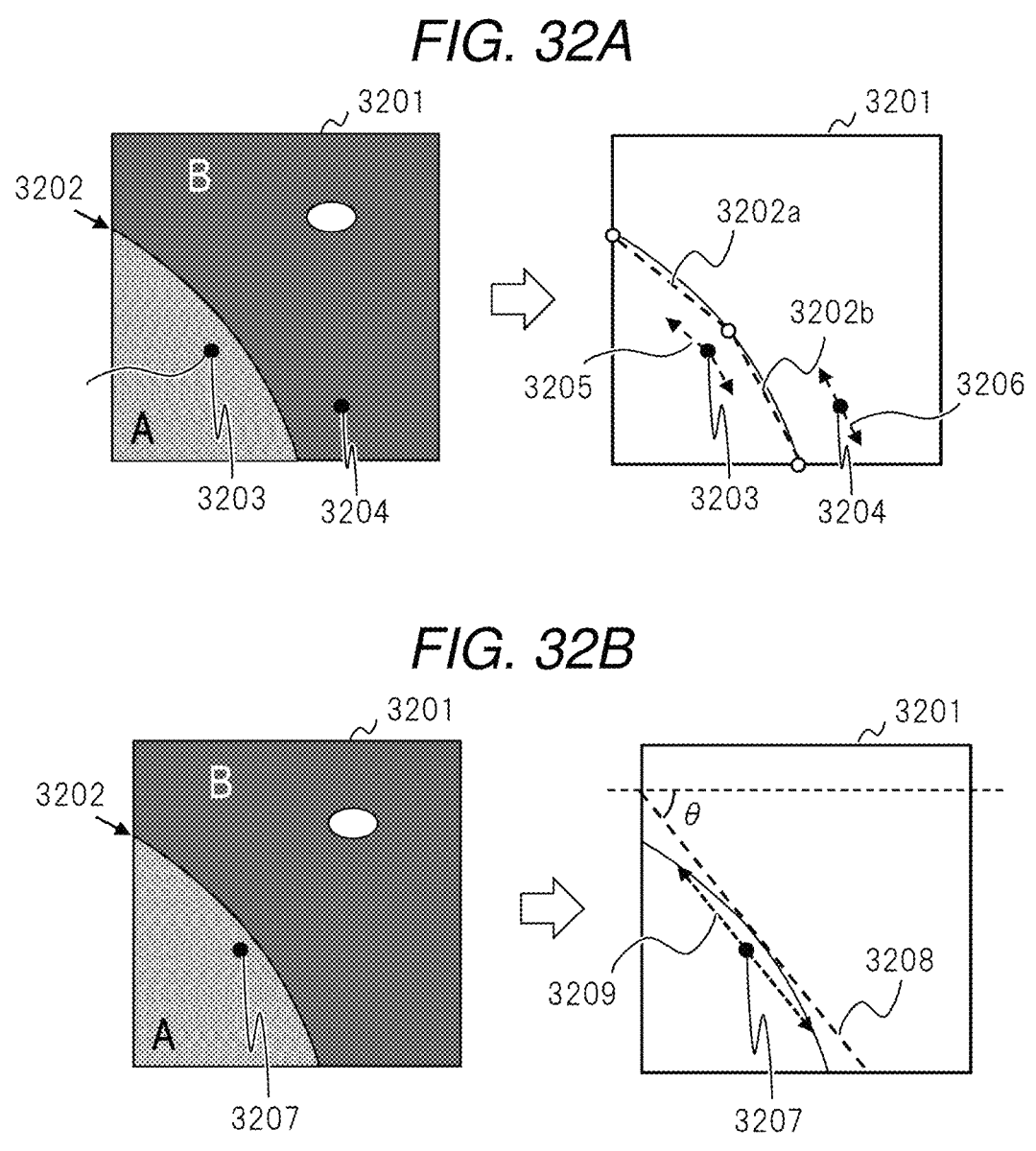

FIGS. 32A and 32B are diagrams illustrating another processing example of generation of a generation pixel group in the third defect detection scheme according to the second embodiment;

FIG. 33 is a diagram illustrating a display example of a screen including a GUI for setting the maximum number of pixels included in the generation pixel group according to the second embodiment; and FIG. 34 is a flowchart illustrating a process of setting sensitivity for each pixel according to Modification 1 of the second embodiment.

DESCRIPTION OF EMBODIMENTS

Hereinafter, embodiments of the present disclosure will be described in detail with reference to the drawings. In the drawings, the same reference numerals are given to the same portions in principle and repeated description thereof will be omitted. In the drawings, constituents may not be expressed in actual positions, sizes, shapes, ranges, and the like to facilitate understanding of the invention.

For description, a program, a function, a processing unit, and the like are described as main agents when a process by a program is described in some cases, but main agents of the program, the function, the processing unit, and the like are processors, or controllers, apparatuses, computers, systems, or the like configured with the processors or the like. A computer executes a process in accordance with a program read on a memory while a processor appropriately uses resources such as a memory or a communication interface.

Thus, a predetermined function, a processing unit, or the like is realized. The processor is configured with, for example, a semiconductor device such as a CPU or a GPU. The processor is configured with a device or a circuit capable of executing predetermined calculation. A process is not limited to a software program process and can also be implemented in a dedicated circuit. An FPGA, an ASIC, a CPLD, or the like can be applied as the dedicated circuit.

A program may be installed in advance as data in a target computer or may be distributed as data from a program source to a target computer. The program source may be a program distribution server on a communication network or may be a non-transitory computer-readable storage medium (for example, a memory card). The program may be configured by a plurality of modules. A computer system may be configured by a plurality of apparatuses. The computer system may be configured by a cloud computing system or an IoT system. Various types of data or information are configured with, for example, a structure such as a table or a list, but the invention is not limited thereto. Expression of identification information, an identifier, an ID, a name, a number, and the like can be substituted one another.

First Embodiment

A defect observation apparatus and method according to the first embodiment of the present disclosure will be described with reference to FIGS. 1 to 16. A defect observation method according to the first embodiment is a method including steps executed by the defect observation apparatus according to the first embodiment. The defect observation apparatus 1 according to the first embodiment illustrated in FIG. 2 and the like is an apparatus that has a function of observing a defect on an outer circumferential portion or a bevel portion of a semiconductor wafer which is a sample 10. The defect observation method according to the first embodiment illustrated in FIG. 6 and the like is a method including steps of observing a defect on the outer circumferential portion or the bevel portion of the semiconductor wafer which is the sample 10.

The defect observation apparatus 1 according to the first embodiment includes an imaging unit that captures images of a plurality of channels (to be described below) in an outer circumferential portion or a bevel portion of a wafer using an optical microscope or an SEM 2 serving as a microscope or an imaging apparatus and a defect detection unit that detects a defect portion in a bevel image. The defect observation method according to the first embodiment includes a first step S1 of capturing images of the plurality of channels in the outer circumferential portion or the bevel portion of the wafer as bevel images using the SEM 2 and a second step S2 of detecting the defect portion in the bevel image.

In the defect observation method according to the first embodiment, the second step S2 includes a determination step S606, a scheme switching step S607, and a defect observation and detection step S608. The determination step S606 is a step of determining whether there is at least one portion among a wafer edge, a wafer notch, and an orientation flat in the bevel image using the bevel image and the imaging information (at least one piece of information among an imaging position, an imaging magnification, and an imaging visual field). The scheme switching step S607 is a step of switching and selectively applying a scheme of observing and detecting a defect (referred to as a defect detection scheme in some cases) based on a determination result of the determination step S606 and a type of microscope or imaging apparatus used in the imaging of the first step S1.

The bevel images of the plurality of channels are, for example, the following images. For example, when an SEM is used as the microscope or the imaging apparatus, the SEM 2 (see FIG. 2) that has a function of capturing images of the plurality of channels can also be used. The images of the plurality of channels in the SEM 2 are a plurality of types of images with different shades which can be acquired and imaged by a plurality of detectors 111 included in the SEM 2.

In the following first embodiment, a case in which a semiconductor wafer is used as a sample, at least a bevel portion of the semiconductor wafer is targeted to observe and detect a defect in the defect observation apparatus 1 and a method will be described. In the first embodiment, an example in which the SEM 2 (see FIG. 2) is used as the microscope or the imaging apparatus used in the defect observation apparatus 1 will be described. The invention is not limited thereto. As a microscope or an imaging apparatus, an optical microscope or another type of microscope or imaging apparatus such as a charged particle beam apparatus using, for example, charged particles such as ions can also be applied. A process in a system including the defect observation apparatus 1 is executed using an appropriate image suitable for a type of microscope or imaging apparatus to be used or imaging information (information such as an imaging position, an imaging magnification, and an imaging visual field) in the microscope or the imaging apparatus, for example, an image with an appropriate size or resolution, or the like.

In the first embodiment, an example in which an image captured in a vertical direction to the upper surface of the wafer which is basically an imaging direction (in other words, a top view image) is used as an image captured by the microscope or the imaging apparatus (for example, the SEM 2) used in the defect observation apparatus 1 will be described. The invention is not limited thereto. An image captured in an oblique direction (in other words, a tilt direction or the like) to the vertical direction of the upper surface of the wafer can also be similarly applied to the image.

In the first embodiment, a case in which the defect observation apparatus 1 captures a bevel image or the like using defect candidate coordinates as an imaging position with reference to defect detection information 8 (including the above-described defect candidate coordinates) generated and output by the external defect inspection apparatus 5 (see FIG. 2) will be described.

[Image of Bevel Portion of Semiconductor Wafer]

Figure 1:
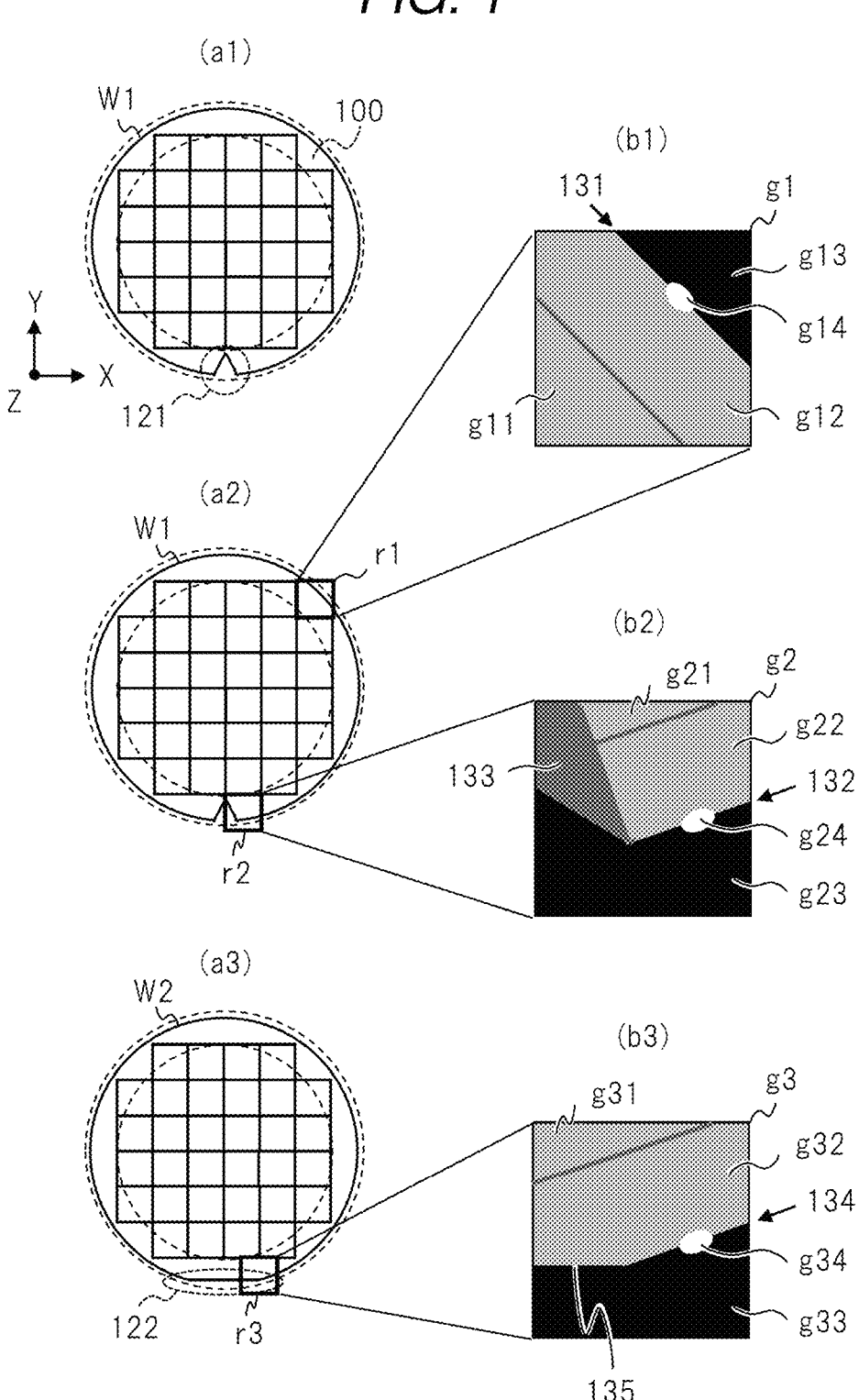
FIG. 1 is a schematic diagram illustrating examples of images of bevel portions of a semiconductor wafer.

FIG. 1 is a schematic diagram illustrating examples of images of bevel portions of the semiconductor wafer, in particular, examples of a wafer edge, a notch, and an orientation flat, as a diagram related to an underlying technology. On the left side of FIG. 1, a circular upper surface (in other words, a top surface) of a wafer is illustrated. On the right side of FIG. 1, an example of an image captured by targeting a partial rectangular region of a bevel portion 100 in the upper surface of the wafer is illustrated. The bevel portion 100 is schematically illustrated as a region in a ring shape, as indicated by a dotted line. The inside of the bevel portion 100 which is an outer circumferential portion is referred to as an inner circumferential portion in some cases.

On the left side of FIG. 1, as indicated in (a1), an example in which a first wafer W1 from the upper side has a notch 121 in the bevel portion 100 which is the outer circumferential portion. A case in which a plurality of rectangular regions are partitioned and set inside the circular upper surface of the wafer is illustrated. The regions correspond to chip regions or imaging regions. As indicated in (a2), an example in which, in a second wafer W1 from the upper side, imaging regions are set in the same bevel portion 100 as that of the wafer W1 in (a1) is illustrated. The imaging regions are illustrated as, for example, regions r1 and r2. As indicated in (a3), an example in which a third wafer W2 from the upper side has an orientation flat 122 in the bevel portion 100 as another wafer W2 unlike (a1) and an imaging region is set in the bevel portion 100 is illustrated. The imaging region is illustrated as, for example, a region r3.

On the right side of FIG. 1, as illustrated as three images from the upper side, an image g1 in which a wafer edge 131 is shown is an image corresponding to the region r1, as indicated in (b1), an image g2 in which a wafer edge 132 and a wafer notch 133 are shown is an image corresponding to the region r2, as indicated in (b2), and an image g3 in which a wafer edge 134 and an orientation flat 135 are shown is an image corresponding to the region r3, as indicated in (b3). The captured images in the examples of FIG. 1 and the like actually have multivalued color or luminance and are simplified and schematically illustrated with small values of white, gray, and black, and the like or dot pattern regions and the like in the drawing.

In the image g1 of the region r1, a region g11 is a region of the upper surface of the wafer. A region g12 is a region where a chamfered portion or a slope surface is formed as a narrow bevel. A region g13 is a region where a part of a stage (a stage 109 in FIG. 2) on, for example, a background which is outside of the wafer is darkly shown. A region g14 indicates an example of a defect arising in the bevel portion 100. In this example, in particular, the region g14 of a defect arises in one portion of the wafer edge 131. The wafer edge 131 corresponds to a wafer region in the image g1, in particular, a boundary between the region g12 of the bevel and the outside region g13. The wafer edge 131 is an arc curve, but is schematically shown as a straight line in the image g1. In this example, the line of the wafer edge 131 is schematically disposed as an oblique line at about −45 degrees with respect to the vertical or horizontal line (for example, the upper side) of a region of a rectangle in the image g1.

In the image g2 of the region r2, a part of the notch 121 is shown. A region g21 is a region of the upper surface of the wafer. A region g22 is a region of the narrow bevel. A region g23 is a region outside of the wafer. A region g24 is an example of a defect arising on the bevel portion 100, in particular, on the wafer edge 132. In this example, the wafer notch 133 is shown to the left continuously from the region g22 of the bevel and the wafer edge 132 in the image g2. The shape of the wafer notch 133 is formed as, for example, a slope surface rather than a cross-sectional surface vertical to the upper surface of the wafer.

In the image g3 of the region r3, a part of the orientation flat 122 is shown. A region g31 is a region of the upper surface of the wafer. A region g32 is a region of the narrow bevel. A region g33 is a region outside of the wafer. A region g34 is an example of a defect arising in the bevel portion 100, in particular, the wafer edge 134. In this example, the orientation flat 135 is shown to the left continuously from the region g32 of the bevel and the wafer edge 134 in the image g3. The shape of the orientation flat 135 is formed as, for example, a cross-sectional surface vertical to the upper surface of the wafer.

Hereinafter, for description, a direction or an angle of a wafer edge such as the wafer edge 131 or 132 is used in some cases. The direction or the angle of the wafer edge is a direction or an angle of disposition of a line such as the wafer edge 131 shown in the captured image, as illustrated.

Figure 2:
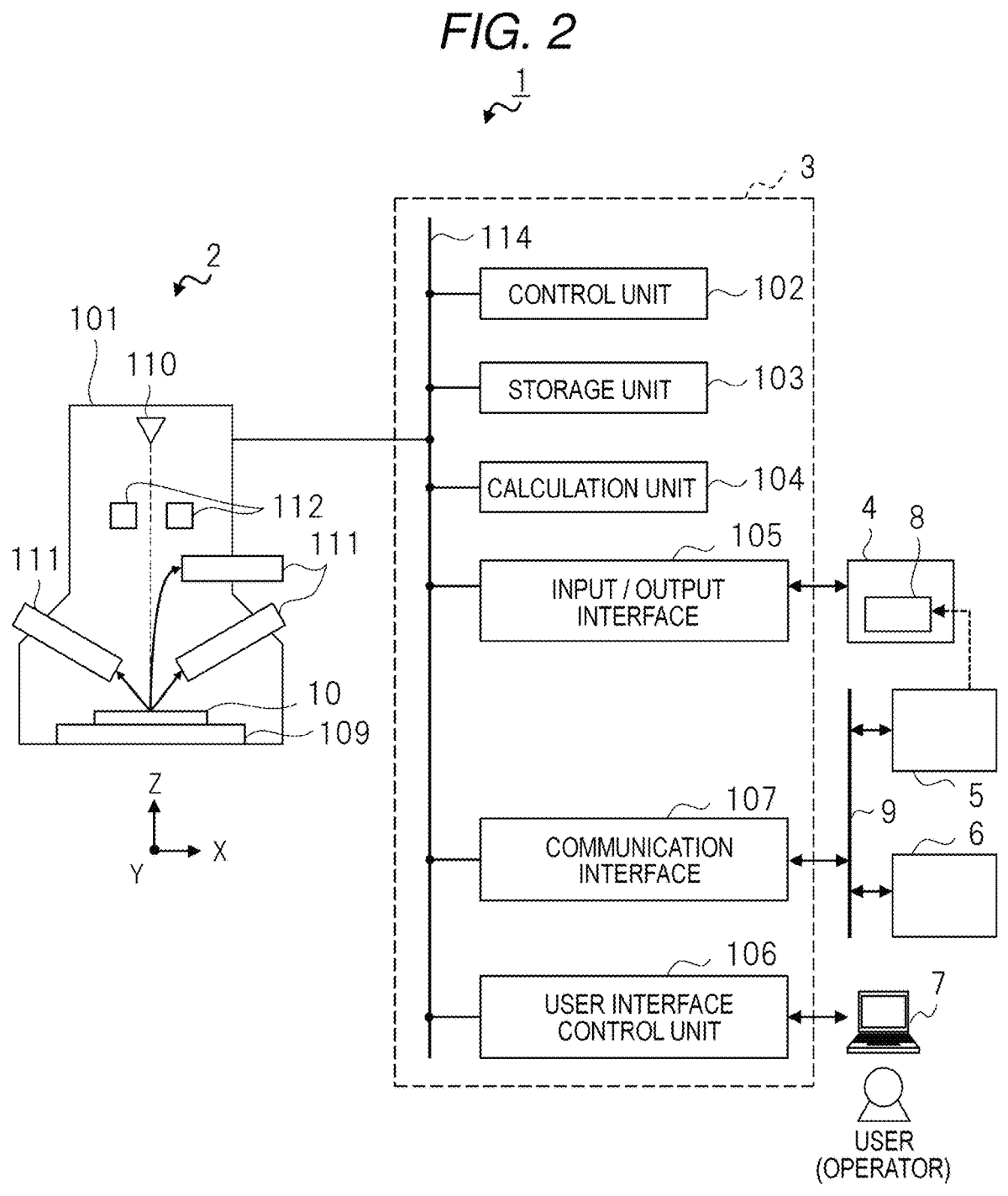

The imaging region in the bevel portion 100 as in the example of FIG. 1 is set based on defect candidate coordinates of the defect detection information 8 from the defect inspection apparatus 5 (see FIG. 2). The invention is not limited to the example of FIG. 1. In a modification, on the upper surface of the wafer, a plurality of rectangular imaging regions may be set to include the entire bevel portion 100 which is the outer circumferential portion.

In the first embodiment, for example, the SEM 2 (see FIG. 2) obtains a bevel image by targeting and imaging an imaging region in the bevel portion 100 as in the example of FIG. 1. In each imaging region, an imaging position and an imaging visual field are set so that 2-dimensional coordinates (X, Y) in the SEM 2 corresponding to the defect candidate coordinates are included. In a modification, the SEM 2 may capture a plurality of images by targeting the same region as the bevel portion 100 (for example, the notch 121 or the orientation flat 122), or a plurality of images may be captured by targeting the same region and switching a position or an angle little by little.

The coordinates or positions used for description are not limited to a coordinate system. For example, 2-dimensional coordinates (X, Y) in a wafer coordinate system in which the wafer serves as a reference may be used, or 2-dimensional coordinates (X, Y) in a stage coordinate system in which a stage 109 (see FIG. 2) on which the wafer is placed serves as a reference may be used. Alternatively, when the microscope or the imaging apparatus has an imaging coordinate system, coordinates in the imaging coordinate system may be used. In any coordinate system, coordinates or a position are appropriately converted based on a relation of each coordinate system.

As in the foregoing example, in a bevel image of a top view in which the bevel portion 100 is imaged in a direction vertical to the upper surface of the wafer, the wafer edge 131 or the like which is a boundary between a region in the wafer and a region outside of the wafer, the wafer notch 121, or the orientation flat 122 is shown in some cases. In the example of the image g1, the wafer notch 121 or the like is not shown and only the wafer edge 131 is shown. In the example of the image g2, both the wafer edge 132 and the wafer notch 133 are shown. In the example of the image g3, both the wafer edge 134 and the orientation flat 135 are shown. In this way, in accordance with an imaging position (for example a central point of the region r1) of a target sample, the SEM 2, or the like, whether there is the wafer edge, the wafer notch, or the orientation flat or a direction or an angle of the wafer edge in the image differs.

Therefore, it is difficult to detect a defect in all the bevel images with high accuracy in accordance with the single defect observation and detection scheme of the related art.

[Defect Observation Apparatus]

FIG. 2 is a diagram illustrating a configuration of the defect observation apparatus 1 according to the first embodiment. The defect observation apparatus 1 broadly includes the scanning electron microscope (the SEM) 2 which is a microscope or an imaging apparatus and a computer system 3 which is a host control apparatus of the SEM 2. As a specific example, the defect observation apparatus 1 is a review SEM serving as a sample observation apparatus that has the above-described ADR function. The computer system 3 is coupled to the SEM 2 via a connection line (in other words, a communication line or a signal line). The computer system 3 is an apparatus that has a function or the like of controlling the SEM 2, in other words, a controller. The controller may be one or more computers. The defect observation apparatus 1 has at least a function of acquiring an image captured with the SEM 2 by controlling the SEM 2 and a function of observing and detecting a defect based on the captured image. In particular, the defect observation apparatus 1 has the above-described ADR function.

The defect observation apparatus 1 includes necessary functional blocks or various devices, but some of the blocks or devices including essential elements are illustrated. In other words, all apparatuses including the defect observation apparatus 1 in FIG. 2 are configured as a defect inspection system.

For example, a defect inspection apparatus 5, a defect classification apparatus 6, or the like is connected as an external apparatus of the defect observation apparatus 1 to a communication network 9 (for example, a LAN).

In this example, defect detection information 8 is generated in advance as a result obtained by targeting and inspecting a semiconductor wafer which is the sample 10 in the external defect inspection apparatus 5. The defect detection information 8 is information including defect candidate coordinates. The defect detection information 8 output from the defect inspection apparatus 5 is stored in advance in, for example, the external storage device 4. The invention is not limited thereto and the defect detection information 8 may be stored in a database of a server or the like on the communication network 9. The computer system 3 reads and refers to the defect detection information 8 from the external storage device 4 when a defect is observed.

The defect classification apparatus 6 is an apparatus or a system that has the above-described ADC function. The defect classification apparatus 6 obtains a result in which defects and defect images are classified by executing an ADC process based on data information of a result of a process of observing defects by the ADR function in the defect observation apparatus 1. The invention is not limited to the exemplary configuration of FIG. 1 and a form in which the defect classification apparatus 6 is merged with the defect observation apparatus 1 is also possible.

FIG. 2 illustrates a case in which the host control apparatus is configured by one computer system 3, but the host control apparatus may be configured by a plurality of computer systems, for example, a plurality of server apparatuses or the like.

The computer system 3 includes a control unit 102, a storage unit 103, a calculation unit 104, an input/output interface 105, a communication interface 107, and a user interface control unit 106. These constituents are connected to a bus 114, and thus can communicate with each other or perform an input or an output.

The control unit 102 corresponds to a controller that controls the entire system. The control unit 102 includes, for example, a hardware circuit or a processor such as a CPU, an MPU, or a GPU. When the processor such as a CPU or the like is included, the control unit 102 executes a process in accordance with a program read from the storage unit 103 by the processor. The control unit 102 realizes various functions based on, for example, program processing. The calculation unit 104 includes a CPU, an MPU, or a GPU and a memory such as a ROM or a RAM. The calculation unit 104 executes calculation in accordance with a program read from the storage unit 103 by the processor. The control unit 102 and the calculation unit 104 may be integrated.

The storage unit 103 can be configured with a device that stores various types of information or data including a program, for example, a storage medium device that includes a magnetic disk or a semiconductor memory. The storage unit 103 may store data such as a program or the like read from the external storage device 4 or the communication network 9. The storage unit 103 may store the defect detection information 8 read from the external storage device 4 or the like. The storage unit 103 may store image data acquired from the SEM 2.

The input/output interface 105 is a device in which interfaces with an input device, an output device, and the external storage device 4 are mounted and executes inputting and outputting data or information into and from such devices. For example, the external storage device 4 is connected to the computer system 3 via the input/output interface 105. The external storage device 4 may store various types of program or data. The external storage device 4 may store image data or processing result information.

The communication interface 107 is a device in which a communication interface corresponding to the communication network 9 such as a LAN is mounted, and transmits and receives data or information to and from the communication network 9. The computer system 3 is connected to the communication network 9 via the communication interface 107. The computer system 3 is connected to an external system or an apparatus via the communication network 9 to be able to execute communication. For example, the defect inspection apparatus 5 or the defect classification apparatus 6 is connected to the communication network 9. Other examples of the external device include a database server and a manufacturing execution system (MES). The computer system 3 may refer to design data of a sample or information of a manufacturing process from the external device. Examples of the manufacturing process include etching.

The user interface control unit 106 is a unit that supplies and controls a user interface including a graphical user interface (GUI) for inputting and outputting information or data to and from a user, in other words, an operator. A user terminal 7 (in other words, a client terminal) may be connected as an input/output terminal via the user interface control unit 106 to the computer system 3. The user terminal 7 may be an apparatus connected to the communication network 9. The user terminal 7 or another input/output device may be a device embedded and integrated in the computer system 3. The user interface control unit 106 supplies data of a screen (for example, a web page) corresponding to a GUI to the user terminal 7. Another input/output device, for example, a display device, a sound output device, an operational device, or the like may be connected to the input/output interface 105 or the user interface control unit 106.

The user operates the user terminal 7 or another input/output device to input, for example, an instruction or setting information to the defect observation apparatus 1, in particular, the computer system 3 and confirms information output on, for example, a screen. The user terminal 7 may be applied to, for example, a general PC. A keyboard, a mouse, a display, or the like may be embedded in or externally connected to the user terminal 7. The user terminal 7 may be a remote terminal connected to the communication network 9 such as the Internet. The user interface control unit 106 generates data of the screen including a GUI and supplies the data to the user terminal 7 by communication, and the user terminal 7 displays the screen on a display.

The system including the defect observation apparatus 1 may have the following form. The computer system 3 may be configured as a server in a client server system, a cloud computing system, an IoT system, or the like. The user terminal 7 may be configured as a client computer of the server. For example, the computer system 3 or an external device may execute machine learning. In machine learning, many computer resources are required in some cases. In this case, a process related to the machine learning may be executed in a server group such as a cloud computing system. Functions may be shared between the server group and the client computer.

For example, the user operates the user terminal 7 which is a client computer and the user terminal 7 transmits a request to the computer system 3 which is a server. The server receives the request and executes a process (for example, imaging or a defect observation process) in response to the request. For example, the server transmits data of a requested screen (for example, a web page) as a response to the user terminal 7. The user terminal 7 receives the data of the response and displays the screen (for example, a web page) on the display.

[Imaging Apparatus]

In FIG. 2, the SEM 2 which is an imaging apparatus includes the stage 109, an electron gun 110, an electronic lens (not shown), a deflector 112, and the detectors 111 in a casing 101. In other words, the stage 109 is a sample table on which a semiconductor wafer which is the sample 10 is placed and held to be able to move at least in the horizontal direction (the X and Y directions, as illustrated). The electron gun 110 is an electron gun that irradiates the sample 10 on the stage 109 with an electron beam. The electronic lens (not illustrated) causes the electron beam to converge on a surface of the sample 10. The deflector 112 is a deflector that scans the surface of the sample 10 with the electron beam. The detector 111 detects electrons or particles such as secondary electrons or reflected electrons generated from the sample 10 by irradiation of the electron beam. In other words, the detector 111 detects a state of the surface of the sample 10 as an image. In this example, the plurality of detectors 111 are provided, as illustrated.

In this example, the computer system 3 which is a host control apparatus controls elements such as the stage 109, the electron gun 110, the deflector 112, and the detectors 111 of the SEM 2. An element such as a driving circuit driving a mechanism such as the stage 109 is not illustrated.

Information detected by the detector 111 of the SEM 2, in other words, an image signal or image data is supplied to the computer system 3 via a connection line. A circuit such as an analog-to-digital conversion circuit may be provided inside or at a rear stage of the detector 111. In the computer system 3, an image signal supplied from the detector 111 of the SEM 2 is processed by the control unit 102, the calculation unit 104, or the like, and the processed data information is stored in the storage unit 103 or the like.

The SEM 2 captures an image of the semiconductor wafer which is the sample 10 in accordance with a set imaging condition under the control of the computer system 3. The computer system 3 realizes a defect observation process on the sample 10 by processing the image signal which is an image captured by the SEM 2 and is supplied from the detector 111. The defect observation apparatus 1 images the outer circumferential portion or the bevel portion of the wafer which is the sample 10 using the SEM 2, acquires a bevel image, and observes and detects a defect from the bevel image.

The defect observation apparatus 1 in FIG. 2 includes the SEM 2 as a microscope or an imaging apparatus that images the sample 10 based on the defect candidate coordinates from the defect inspection apparatus 5. Alternatively, the defect observation apparatus 1 may execute a similar operation using an external microscope or imaging apparatus. In particular, the computer system 3 of the defect observation apparatus 1 may control the external microscope or imaging apparatus or acquire an image captured by the external microscope or imaging apparatus. In other words, the invention is not limited to the single defect observation apparatus 1 and a system that includes a defect observation apparatus and a microscope or an imaging apparatus may be provided.

As a modification, the microscope or the imaging apparatus used by the defect observation apparatus 1 may include and appropriately use both an SEM and an optical microscope.

[Exemplary Configuration of Detector of SEM]

Figure 3:
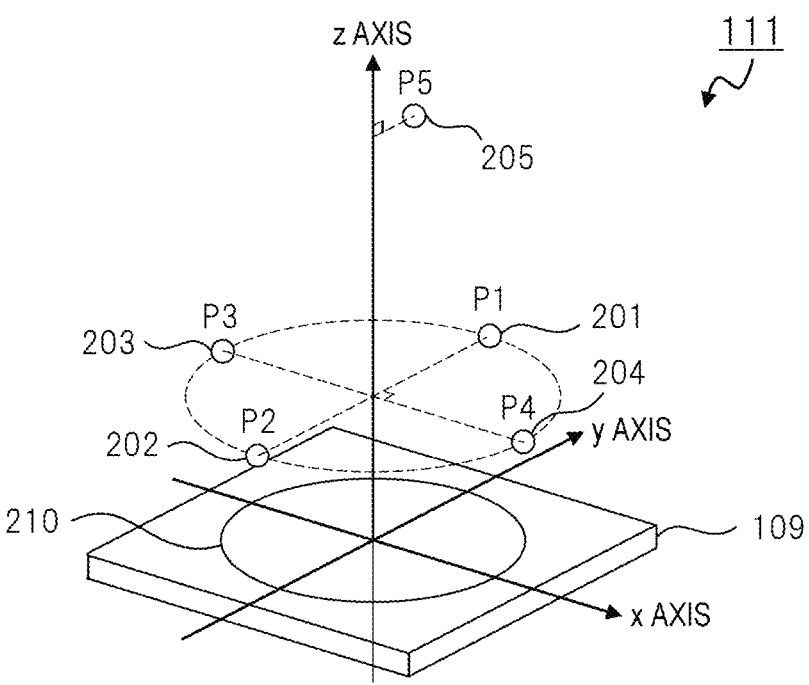
FIG. 3 is a perspective view illustrating an exemplary configuration of a detector of an SEM in a defect observation apparatus according to the first embodiment.

FIG. 3 illustrates an exemplary configuration of the detectors 111 in the SEM 2 used to observe a defect. FIG. 3 is a perspective view illustrating an overview of disposition of the plurality of detectors 111. In this example, the SEM 2 includes five detectors 201 to 205 as the plurality of detectors 111. The number of detectors 111 is not limited thereto. As illustrated, the x and y axes are two horizontal directions orthogonal to a horizontal plane and the z axis is a vertical direction perpendicular to the x and y axes.

The detectors 201 and 202 are disposed at positions P1 and P2 along the y axis. The detectors 203 and 204 are disposed at positions P3 and P4 along the x axis. The four detectors 201 to 204 are disposed on a plane at the same height position upward on the z axis from the surface of the sample 10 (indicated by a circle as the semiconductor wafer 210 in FIG. 3) on the stage 109. The center of the sample 10 is disposed at the position of the z axis on the horizontal plane. In this case, the four detectors 201 to 204 are disposed at a total of four positions, positive and negative sides on the y axis and positive and negative sides on the x axis, in a plane at the same height position when the z axis is a reference. The position P1 is a position at a predetermined distance in the positive direction on the y axis from the z axis of the center. The position P2 is a position at a predetermined distance in the negative direction on the y axis from the z axis of the center. The position P3 is a position at a predetermined distance in the negative direction on the x axis from the z axis of the center. The position P4 is a position at a predetermined distance in the positive direction on the x axis from the z axis of the center.

The four detectors 201 to 204 are disposed so that electrons at outgoing angles in specific directions (indicated by elevation angles and azimuth angles) from the surface of the wafer can selectively be detected. That is, for example, the detector 201 can efficiently detect electrons discharged in the positive direction (a direction indicated by the illustrated arrow) of the y axis from the upper surface of the semiconductor wafer 210. For example, the detector 204 can efficiently detect electrons discharged in the positive direction of the x axis.

The four detectors 201 to 204 can acquire images with a contrast as if each detector is irradiated with light in a facing direction, in other words, images with shades. In other words, it is possible to acquire images with a contrast as if the upper surface of the sample 10 is irradiated with light in an oblique direction inclined in the x and y axes when the perpendicular z axis is a reference.

The detector 205 is disposed at the predetermined position P5 away upward from the plane of the z axis on which the four detectors 201 to 204 are disposed along the z axis. The position P5 may be a position on the z axis or may be a position at a predetermined distance in the horizontal direction from the z axis of the center, as illustrated. The position P5 is a position closer to the z axis than the positions P1 to P4. The detector 205 can efficiently detect electrons mainly discharged upward in the z axis from the surface of the semiconductor wafer 210.

In this way, with the configuration in which the plurality of detectors 111 are disposed at different positions along the different axes, the images with the contrast, in other words, the images of a plurality of channels with different shades can be acquired and more detailed defect observation and detection can be executed. The invention is not limited thereto and a plurality of detectors 111 which are the number of detectors 111 different from that of the exemplary configuration of FIG. 3 may be disposed or the details of the disposition of the five detectors 201 to 205 are not particularly limited.

[Defect Candidate Coordinates]

Figure 4:
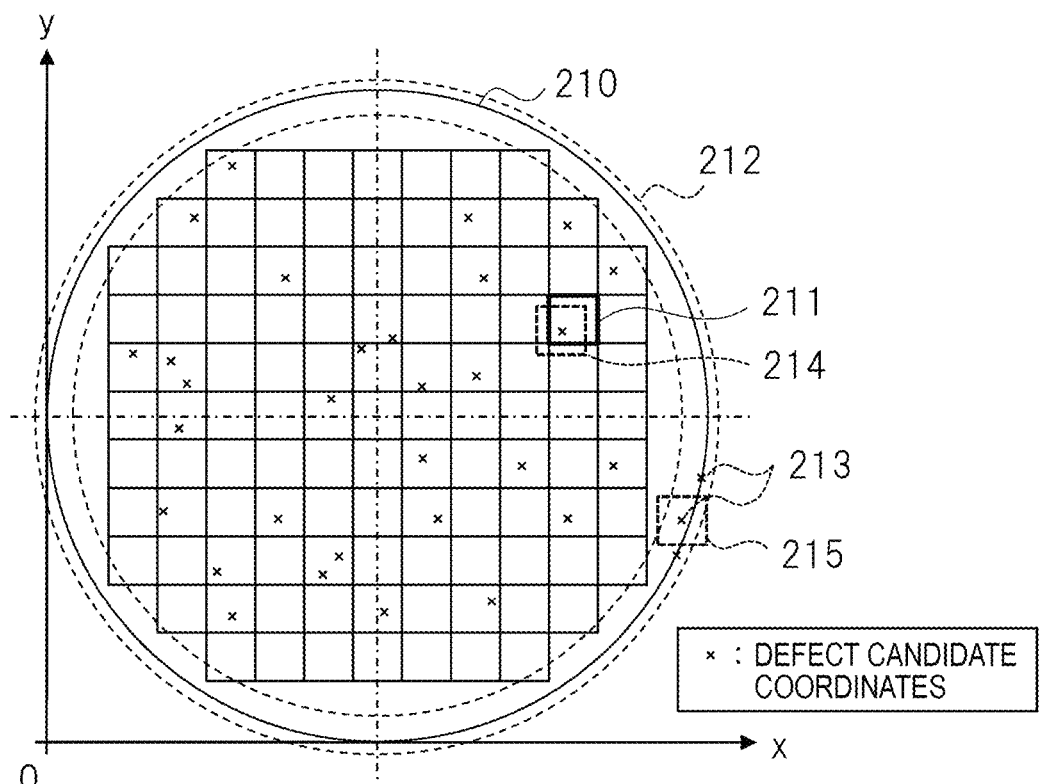
FIG. 4 is s diagram illustrating examples of defect candidate coordinates on an upper surface of a semiconductor wafer.

FIG. 4 is a diagram illustrating examples of defect candidate coordinates indicated by the defect detection information 8 (see FIG. 2) output from the defect inspection apparatus 5, the defect candidate coordinates being on the upper surface of the semiconductor wafer 210 which is the sample 10. In FIG. 4, the defect candidate coordinates on an x-y plane of the circular upper surface of the semiconductor wafer 210 are illustrated as points of x marks. From the viewpoint of the defect observation apparatus 1, the defect candidate coordinates are target positions of observation or inspection. A rectangular region 211 disposed in a lattice shape indicates a region of a plurality of chips (in other words, dies) formed in the region of the upper surface of the semiconductor wafer 210.

A region 212 in a ring shape indicated by a dotted line indicates a region corresponding to the bevel portion 100 (see FIG. 1) which is an outer circumferential portion of the wafer. In the region 212 of the bevel portion, as described above, a narrow bevel, a notch, an orientation flat, and the like are formed in some cases. The defect inspection apparatus 5 may also target the region 212 of the bevel portion and determine and detect defect candidates. In this case, the defect detection information 8 also includes the defect candidate coordinates in the region 212 of the bevel portion. For example, defect candidate coordinates 213 are an example of a defect candidate in the region 212 of the bevel portion.

The defect observation apparatus 1 according to the first embodiment image regions including the inner circumferential portion and the outer circumferential portion of the upper surface of the semiconductor wafer 210 using the SEM 2 based on the defect candidate coordinates of the defect detection information 8. The defect observation apparatus 1 sets an imaging region, for example, using defect candidate coordinates (x, y) as a central imaging position. For example, the imaging region 214 is an example of an imaging region where the defect candidate coordinates (x, y) are set as a central imaging position. A size of the imaging region 214 may be the same size as or different from that of a chip or the like. The SEM 2 targets each imaging region 214 and captures one or more images using the plurality of detectors 111. The image captured by targeting the region 212 of the bevel portion can be obtained as a bevel image.

[Information Regarding Type of Microscope or Imaging Apparatus]

Information regarding a type of microscope or imaging apparatus used to observe a defect (information 604 in FIG.

6 to be described below) is information indicating which type of microscope or imaging apparatus is used to capture the foregoing bevel image. For example, when the system including the defect observation apparatus 1 includes both the SEM 2 and the optical microscope, the information is information indicating which is used. A plurality of types or a plurality of SEMs or optical microscopes may be used. In this case, information regarding the types of microscopes or imaging apparatuses is information indicating which microscope or imaging apparatus is used among the types of microscopes or imaging apparatuses.

The information regarding the types of microscopes or imaging apparatuses is managed and stored in association with captured images or the like. For example, the computer system 3 stores the information regarding the types of microscopes or imaging apparatuses in the storage unit 103 or another database along with the images. For example, a management table may be stored in the storage unit 103 or the like. The information regarding the types of microscopes or imaging apparatuses may have one piece of attribute information of the images. Attribute information may be described as a header or metadata of an image file.

[Way to View Defect]

Figure 5:
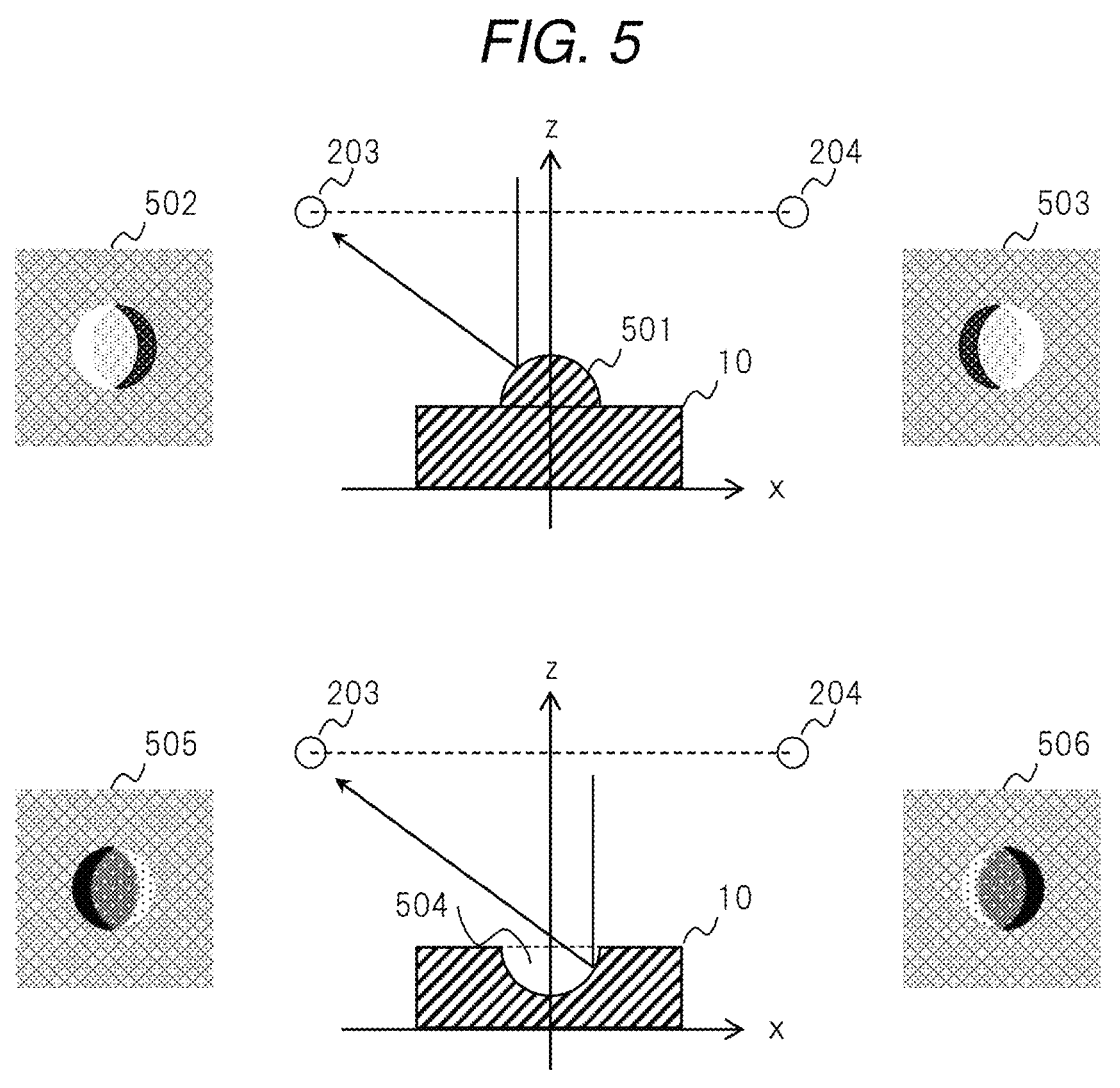

Next, a difference in a way to view defects in an image when a convex defect and a concave defect on the surface of the wafer which is the sample 10 are imaged will be described with reference to FIG. 5. FIG. 5 is a diagram illustrating a difference in a way to view uneven defects in an image by the detector 111 (see FIG. 3) of the SEM 2 of the defect observation apparatus 1. In the middle of FIG. 5, a convex defect 501 and a concave defect 504 on the sample 10 on an x-z plane which is a vertical section are schematically illustrated. The convex defect 501 is swollen in a hemispherical shape upward from the upper surface of the sample 10. The concave defect 504 is recessed in a hemispherical shape downward from the upper surface of the sample 10. In the middle of FIG. 5, only the detectors 203 and 204 located in the positive and negative sides on the x axis are illustrated among the plurality of detectors 111.

An image 502 is a schematically illustrated image generated using the detector 203 by targeting the convex defect 501 and an image 503 is a schematically illustrated image generated using the detector 204. As described above, an image of each detector 111 is acquired as an image with a contrast or a shade as if light shines from the position of the detector 111. Therefore, an image 502 is obtained as an image as if the defect 501 is shown with light from the top left side on which the detector 203 is located, as illustrated. That is, as the image 502, it is possible to obtain an image in which, as indicated by an arrow, the left of a convex portion of the defect 501 is shown with light and relatively bright and the right of the convex portion is shaded and relatively dark. The same applies to an image 503 and a way to apply brightening and shading at positive and negative sides of the x axis is reversed to the image 502.

An image 505 is a schematically illustrated image generated using the detector 203 by targeting the concave defect 504 and an image 506 is a schematically illustrated image generated using the detector 204. An image 505 is acquired as an image as if the defect 504 is shown with light from the top left side on which the detector 203 is located, as illustrated. That is, as the image 505, it is possible to obtain an image in which, as indicated by an arrow, the right side of a concave portion of the defect 504 is shown with light and relatively bright and the left side of the convex portion is shaded and relatively dark. The same applies to an image

506 and a way to apply brightening and shading at positive and negative sides of the x axis is reversed to the image 505.

As in the foregoing example, the SEM 2 can image and acquire a plurality of types of images with different shades as the images of the plurality of channels by using the plurality of detectors 111. The images of the detectors 203 and 204 have been described as examples, but images of the detectors 201 and 202 on the y axis are similar.

[Defect Observation and Flow]

Next, a defect observation method according to the first embodiment executed by the defect observation apparatus 1 according to the first embodiment will be described with reference to FIG. 6 and the like. FIG. 6 is a flowchart illustrating an overall processing operation in the defect observation method according to the first embodiment executed by the defect observation apparatus 1 according to the first embodiment. The defect observation method according to the first embodiment includes a first step S1 which is an image capturing step of capturing the images of the plurality of channels in the bevel portion of the sample 10 as the bevel images by the defect observation apparatus 1 using the SEM 2 and a second step S2 which is a defect detection step of detecting defects in the captured bevel images. The second step S2 includes a determination step S606, a scheme switching step S607, and a defect detection step S608.

The determination step S606 is a step of determining whether there is a reflection of at least one portion among a wafer edge, a wafer notch, and an orientation flat in a bevel image 605 by using the bevel image 605 and the imaging information 603 (information including at least one of an imaging position, an imaging magnification, an imaging visual field, and the like). The scheme switching step S607 is a step of switching and selectively applying a defect detection scheme which is a scheme of detecting a defect among a plurality of schemes which are candidates based on a determination result of the determination step S606 and the information 603 regarding a type of microscope or imaging apparatus used in the imaging step S602. Step S608 is a step of detecting a defect from the bevel image 605 or the like based on the switched scheme.

As a problem of the related art with regard to defect observation of the outer circumferential portion or the bevel portion of a semiconductor wafer, it is difficult to detect a defect in accordance with a single defect detection scheme since whether there is a wafer edge, a wafer notch, an orientation flat, or the like in an image, and a direction or an angle of the wafer edge in the image is different in accordance with an imaging position of a bevel image as in FIG. 1.

As a solution to this problem, according to the first embodiment, a defect detection scheme appropriate for a target of a bevel portion is switched and selectively applied using the bevel image, the imaging information, and the information regarding the type of microscope or an imaging apparatus. Accordingly, accuracy of the defect detection is improved further than in the related art. Here, the scheme is a generic name of a method, an apparatus, a program, and the like including necessary software or hardware and a necessary step or program.

In FIG. 6, in the defect observation by the defect observation apparatus 1, an inspection target semiconductor wafer 601 (actual object and sample information or the like) and the defect candidate coordinates 602 of the defect detection information 8 transmitted from the defect inspection apparatus 5 are used as an input. In the overview of the flow, the defect observation apparatus 1 acquires the defect coordinates 608 by executing the image capturing step S1 and the defect detection step S2 on each defect candidate coordinates and acquires an observation image 609 by executing an observation image capturing step S609 using the obtained defect coordinates 608. The defect observation apparatus 1 acquires the observation image 609 of all the defect candidate coordinates by repeatedly executing the series of processes on all the defect candidate coordinates similarly, and then ends the defect observation.

The image capturing step which is the first step S1 is a step in which the defect observation apparatus 1 captures and acquires the bevel image 605 of the bevel portion of the semiconductor wafer 601 using the SEM 2 based on the target defect candidate coordinates 602. The first step S1 specifically includes steps S601 and S602. Step S601 is similarly repeated for each defect candidate coordinates and is similarly repeated for each i when i is defect candidate coordinates of interest and 1 to L are defect candidate coordinates to be processed. In step S602, the computer system 3 controls the SEM 2 such that the image captured with the SEM 2 is acquired as the bevel image 605.

The defect detection step S2 which is the second step is broadly divided into three processing steps, the determination step S606, the scheme switching step S607, and the defect detection step S608.

In the determination step S606, the bevel image 605 captured in the image imaging step S601 and the imaging information 603 are used as an input. At least the bevel image 605 is used as an input. The imaging information 603 is various types of information related when the bevel image 605 is captured with the used SEM 2. As the imaging information 603, information such as an imaging position, an imaging magnification, and an imaging visual field of the bevel image 605 is used. In the determination step S606, the computer system 3 of the defect observation apparatus 1 determines whether there is a reflection of at least one portion among the wafer edge, the wafer notch, and the orientation flat in the bevel image 605 based on the input bevel image 605 and imaging information 603. The determination result 606 is obtained as a result output of the determination step S606.

In the determination process of the determination step S606, whether there is the wafer edge, the wafer notch, and the like is determined by determining luminance, a region shape, or the like in the bevel image 605, for example, using the information such as the imaging position, the imaging magnification, and the imaging visual field in the imaging information 603 of the bevel image 605. In the determination process, any of known various image processing technologies may be used.

The scheme switching step S607 is a step in which the computer system 3 of the defect observation apparatus 1 switches the defect detection scheme based on the determination result 606 output in the determination step S606 and the information 604 regarding the type of microscope or imaging apparatus used in the imaging step S602 of the first step S1. The details of the switching will be described below with reference to FIG. 7. The information 604 regarding the type of microscope or imaging apparatus is information indicating the SEM 2 in the first embodiment.

As examples of the plurality of defect detection schemes used as candidates in the first embodiment, as illustrated, there are four schemes. That is, the plurality of schemes include four schemes, (A) a statistical image comparison scheme 611, (B) a reference image capturing scheme 612, (C) a reference image estimation scheme 613, and (D) a similar data comparison scheme 614. In the first embodiment, one scheme selected from the four schemes is applied for each bevel image which is a target. The schemes to be used are not limited to the four schemes and other defect detection schemes may be used. The details of each defect detection scheme will be described below.

Finally, in the defect detection step S608 of the second step S2, the computer system 3 of the defect observation apparatus 1 detects a defect portion from the bevel image 605 using the defect detection scheme selected in the scheme switching step S607. The defect coordinates 608 indicating a position of the detected defect is obtained as a result output of the defect detection step S608.

Finally, in the observation image capturing step S609, the computer system 3 of the defect observation apparatus 1 captures an image that has high quality suitable for observing the defect and includes the defect coordinates 608, for example, using the SEM 2 based on the defect coordinates 608 and obtains the observation image 609 as a result. After the observation image capturing step S609, any technology can be applied and a technology to be applied is not limited. For example, the observation image 609 may be captured using an imaging apparatus such as a charged particle beam apparatus other than the SEM 2.

[Switching of Defect Detection Scheme]

FIGS. 7A and 7B are diagrams for the determination step S606 and the scheme switching step S607 and illustrate examples of classification of the bevel images and selective application of the defect detection scheme according to the first embodiment. FIG. 7A illustrates instances of bevel images including defect candidates. In general, since either a wafer notch or an orientation flat indicating a crystal orientation in the semiconductor wafer (for example, see FIG. 1 or 4) is used, the wafer notch and the orientation flat are not simultaneously on the same wafer. Therefore, as presence or absence of three types of shape structures of a wafer edge, a wafer notch, and an orientation flat, six instances can be assumed as in FIG. 7A. In FIGS. 7A and 7B, the six instances are illustrated as first to sixth instances.

In the table of FIG. 7A, the second row corresponds to a case in which a reflection of the wafer edge is not included in the bevel image and a case in which there is a reflection of the wafer edge. The third row corresponds to three cases related to glare of the wafer notch and the orientation flat. As combinations of the presence and absence of the wafer edge, the wafer notch, and the orientation flat, there are the first to sixth instances of six items, as illustrated. In each item, an example of the bevel image of each instance is illustrated.

The table of FIG. 7B shows collection of examples of defect detection schemes which are candidates selectively applied to each instance and schemes particularly selectively applied in the first embodiment for each item to correspond to FIG. 7A.

In a bevel image 701 of the first instance, there is no reflection of the wafer edge and there is no reflection of the wafer notch and the orientation flat. In the bevel image 701, a region a1 indicates a defect candidate and a line a2 indicates one end of a narrow bevel on the upper surface of the wafer. In the bevel image 701, any of (A) the statistical image comparison scheme 611, (B) the reference image capturing scheme 612, (C) the reference image estimation scheme 613, and (D) the similar data comparison scheme 614 in FIG. 6 can be used as the defect detection scheme. In the first embodiment, it is effective to use (A) the statistical image comparison scheme 611 particularly. Therefore, this scheme is applied. The statistical image comparison scheme 611 is a scheme of detecting a defect portion based on a scheme of detecting an abnormal value.

In a bevel image 702 of the second instance, there is a reflection of the wafer edge and there is no reflection of the wafer notch and the orientation flat. In the bevel image 702, a region a3 is a background region outside of the upper surface of the wafer. A region a4 is a region in which a narrow bevel is shown. A wafer edge 721 is a boundary between the region a4 of the narrow bevel and the background region a3. In this example, a region a5 of a defect candidate is on the wafer edge 721.

For the bevel image 702, (B) the reference image capturing scheme 612, (C) the reference image estimation scheme 613, and (D) the similar data comparison scheme 614 can be used as the defect detection scheme. In the bevel image 702, a direction or an angle of the wafer edge 721 which is a boundary between the wafer and the background are substantially constant in the image. In this example, the wafer edge 721 in the bevel image 702 is substantially straight and the direction or the angle of disposition of the wafer edge 721 is, for example, an angle inclined at about −45 degrees with respect to the upper side (in other words, the x axis which is the horizontal axis) of a rectangle of the image. Therefore, the information 604 regarding the type of microscope or imaging apparatus used in the first step S1 is also used. In the example of the first embodiment, since it is effective to use (C) the reference image estimation scheme 613 or (B) the reference image capturing scheme 612, one scheme between the schemes, for example, the scheme of (C) is applied.

In a bevel image 703 of the third instance, there is no reflection of the wafer edge and there is a reflection of the wafer notch. In the bevel image 703, a region a6 is a wafer region (a region with no wafer notch, for example, a region of a narrow bevel). A region a7 is a region of the wafer notch. A line a8 is a boundary between the wafer region a6 and the region a7 of the wafer notch. The line a8 of the wafer notch is distinguished from the wafer edge. A region a9 is an example of a defect candidate in the wafer region.

In a bevel image 704 of the fourth instance, there is no reflection of the wafer edge and there is a reflection of the orientation flat. In the bevel image 704, a region a10 is a wafer region and a region a11 is a background region. A line a12 is a straight line configuring an orientation flat and is a boundary between the wafer region a10 and the background region a11. The line a12 of the orientation flat is distinguished from a wafer edge. A region a13 is an example of a defect candidate on the line a12 of the orientation flat.

For the bevel images 703 and 704, (B) the reference image capturing scheme 612, (C) the reference image estimation scheme 613, and (D) the similar data comparison scheme 614 can be used as the defect detection scheme. Since the wafer notch or the orientation flat is formed in a limited region of the bevel portion of the wafer, there is no region of which the outer appearance similar to that of the wafer notch or the orientation flat in the same wafer. Therefore, in the instance of the bevel images 703 and 704, (D) the similar data comparison scheme 614 is effective. In the example of the first embodiment, particularly, the scheme of (D) is applied.

In a bevel image 705 of the fifth instance, there is a reflection of the wafer edge and there is a reflection of the wafer notch. In the bevel image 705, a region a14 is a wafer region and a region a15 is a background region. A region a16 is a region of the wafer notch. A line a17 is a wafer edge and is a boundary between the regions a14 and a15. A line a18 is a line forming a wafer notch and is a boundary between the region a16 of the wafer notch and the background region a15. A region a19 is an example of a defect candidate on the wafer edge.

In a bevel image 706 of the sixth instance, there is a reflection of the wafer edge and there is a reflection of the orientation flat. In the bevel image 706, a region a20 is a wafer region and a region a21 is a background region. A line a22 is a wafer edge and is a boundary between the regions a20 and a21. A line a23 is a straight line forming the orientation flat and is a boundary between the wafer region a20 and the background region a21. The line a23 of the orientation flat is distinguished from the wafer edge. A region a24 is an example of a defect candidate in the region a20 (a narrow bevel).

For the bevel images 705 and 706, (B) the reference image capturing scheme 612, (C) the reference image estimation scheme 613, and (D) the similar data comparison scheme 614 can be used as the defect detection scheme. In the bevel images 705 and 706, a direction or an angle of disposition of the boundary between the wafer and the background is abruptly changed in the images. For example, in the bevel image 705, the line a17 of the wafer edge at a certain angle is connected to the line a18 of the wafer notch at another angle. A change (in other words, a difference) in the angle between the lines is, for example, about 135 degrees. In the bevel image 706, the line a22 of the wafer edge at a certain angle is connected to the line a23 of the orientation flat at another angle. A change in the angle between the lines is, for example, about 170 degrees. In this instance, there is no region of which the outer appearance is similar in the same wafer as in the instance of the bevel images 703 and 704. Therefore, in this instance, (D) the similar data comparison scheme 614 is effective. In the first embodiment, particularly, the scheme of (D) is applied.

[(A) Statistical Image Comparison Scheme]

(A) The statistical image comparison scheme 611 in FIG. 6 is a scheme of determining and detecting a defect by calculating an average value or the like of luminance in the entire image, generating a consistent image (in other words, statistical image) in accordance with the average value or the like, setting the image as a reference image, and comparing a target image with a reference image. The detailed description of the statistical image comparison scheme 611 will be omitted since a known technology can be applied.

[(B) Reference Image Capturing Scheme]

In the first embodiment, as one feature, a defect detection scheme which is a candidate includes the (B) the reference image capturing scheme 612 in FIG. 6. The reference image capturing scheme 612 is a scheme of capturing a reference image corresponding to the bevel image (in other words, a target image) and detecting a defect portion using the bevel image and the captured reference image.

As one problem of the related art, it is difficult to acquire the reference image in the bevel image. In the semiconductor wafer, as in the example of FIG. 1 or 4, a plurality of chips designed so that the same circuit pattern is formed are disposed on the surface of the wafer. Therefore, in detection of a defect in a semiconductor chip, a reference image may be acquired at coordinates shifted by one chip from the coordinates of the target image. However, since a bevel portion has a unique pattern in the wafer because of a difference in a direction or an angle of a wafer edge in an image, it is difficult to acquire the reference image.

As a resolution to this problem, in the first embodiment, when the reference image capturing scheme 612 is used, a position at which the reference image is captured is determined using symmetry or the like of the shape of the wafer at a position at which the bevel image is captured and a process such as rotation or reversion appropriate for the captured reference image is executed. Accordingly, since the processed reference image has image content the same as the target bevel image, the bevel image can be compared with the reference image, and thus a defect portion in the bevel image can be detected.

FIGS. 8A to 8C are diagrams illustrating the reference image capturing scheme 612 and schematic diagrams illustrating positions of symmetry and rotation at which a reference image of a bevel image is captured. FIGS. 8A to 8C illustrate an example of a reference image (in other words, a reference image candidate image) which can be acquired by imaging a symmetric position for the bevel image on a circular surface of a wafer which is the sample 10. In the first embodiment, a center of the wafer which is the sample 10 is set as the origin (a point (0, 0) on an x-y plane, as illustrated), a first horizontal direction is set as the x axis, and a second horizontal direction perpendicular to the first horizontal direction is set as the y axis. (x, y) is an imaging position P1 of a bevel image which is a target image. An example of a captured image corresponding to a rectangular imaging region centering on the imaging position P1 (x, y) is a bevel image 801. In this example, a defect candidate 801a is shown on a wafer edge in the bevel image 801.

In FIG. 8A, an image at a position P2 (−x, −y) which is point-symmetric to the imaging position P1 (x, y) with respect to the origin is illustrated as an image 802. An image at a position P3 (x−y) which is symmetric to the imaging position P1 (x, y) with respect to the x axis is illustrated as an image 803. An image at a position P4 (−x, y) which is symmetric to the imaging position P1 (x, y) with respect to the y axis is illustrated as an image 804.

In FIG. 8B, an image at a position P5 (−y, x) obtained by rotating the imaging position P1 (x, y) by +90 degrees about the origin is illustrated as an image 805. An image at a position P6 (y, −x) obtained by rotating the imaging position P1 (x, y) by −90 degrees about the origin is illustrated as an image 806.

In FIG. 8C, an image at a position P7 (y, x) which is line-symmetric to the imaging position P1 (x, y) with respect to a straight line inclined at +45 degrees from the x axis is illustrated as an image 807. An image at a position P8 (−y, −x) which is line-symmetric to the imaging position P1 (x, y) with respect to a straight line inclined at −45 degrees from the x axis is illustrated as an image 808.

In the reference image capturing scheme 612, at least one image among the images 802 to 808 (in other words, the reference image candidate images) captured at the positions P2 to P8 obtained through the symmetry and rotation operation processes are used for a reference image. The images 802 to 808 can be used as more appropriate reference images by further executing appropriate image rotation or reversion processes. For example, an image obtained by rotating the image 802 by 180 degrees is an image 802b. Since the image 802b has image content similar to or same as the bevel image 801, the image 802b can be used as a reference image for the bevel image 801.

Further, in the images 802 to 808 (in other words, the reference image candidate images), shades of images output from the detectors 111 described in FIG. 5 can be substantially matched by executing appropriate rotation or reversion processes and exchanging a correspondent relationship between the images obtained by the detectors 111 of the above-described SEM 2. For example, the image 802 captured at the position P2 which is point-symmetric with respect to the origin is assumed to be used as a reference image of the bevel image 801. In this case, the image 802b is obtained by rotating the image 802 by 180 degrees on an x-y plane at first. In the image 802b and the bevel image 801, the directions or angles of the wafer edges in these images are substantially matched.

To match the shades of the images output from the detectors 111, the images output from the detectors 201 and 202 on the y axis of FIG. 3 are exchanged and the images output from the detectors 203 and 204 on the x axis are exchanged. In other words, positive and negative sides on the x axis are exchanged and positive and negative sides on the y axis are exchanged.

In the reference image capturing scheme 612, in calculation of differences between bevel images and reference images when a defect is detected, reference images that have substantially matched directions and shades of wafer edges in the images through the image rotation or reversion processes are used.

Figure 9:
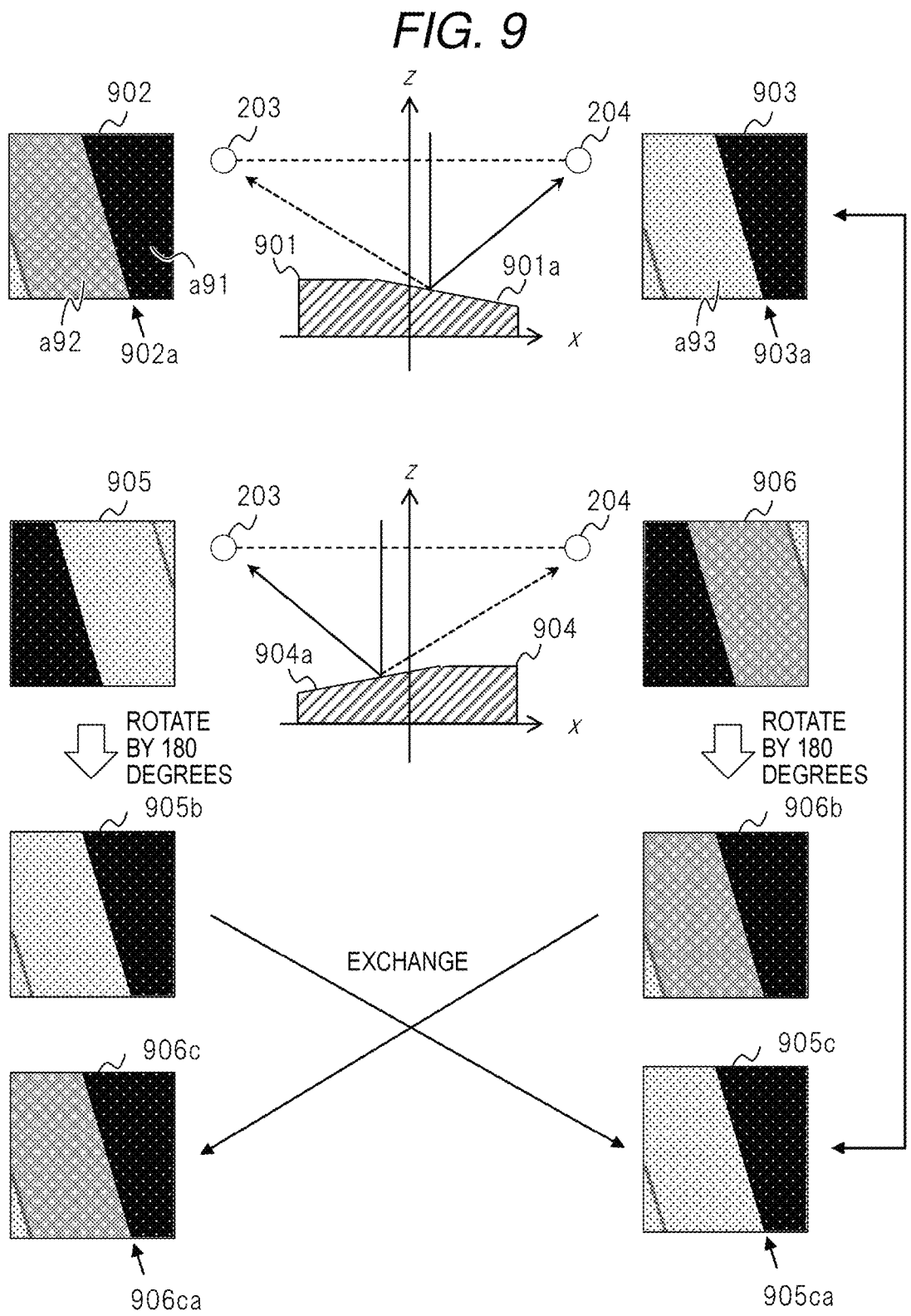
FIG. 9 is a schematic diagram illustrating rotation and exchange when a reference image for a bevel image is generated in the reference image capturing scheme according to the first embodiment.

FIG. 9 is a diagram illustrating exchange between the images output from the detectors 111 to match the shades of the images. As in FIG. 5, FIG. 9 schematically illustrates an x-z cross-sectional plane of the sample 10 and illustrates the detectors 203 and 204 on the x axis and examples of the images obtained by these detectors. In this example, to facilitate description, a case in which there is no defect in a sample 901 is shown. The sample 901 has an inclined surface as a narrow bevel 901a in the outer circumferential portion or the bevel portion of the upper surface of the wafer. The sample 901 on the upper side corresponds to a wafer cross-sectional surface near an imaging position (in other words, an imaging point) of the image 801 of FIGS. 8A to 8C. A sample 904 on the lower side corresponds to a wafer cross-sectional surface near an imaging position of the image 802 of FIGS. 8A to 8C. In the sample 901 on the upper side, the narrow bevel 901a is on a positive side of the x axis. In the sample 904 on the lower side, a narrow bevel 904a is on the negative side of the x axis.

In the example of FIG. 9, in the bevel portions of the samples 901 and 904, there are slopes due to the narrow bevels 901a and 904a with respect to the upper surface (the x-y plane) of the wafer. Light and electrons are incident on and reflected from the inclined surface of the narrow bevel 901a to be output to the detectors 111. At this time, the direction or angle (for example, an outgoing angle) of the light and electrons output to the detectors 111 is less than in the detector 204 than in the detector 203. Therefore, in the sample 901, as illustrated, an image 903 output by the detector 204 is brighter than an image 902 output by the detector 203. For example, when a region a92 of the narrow bevel 901a in the image 902 is compared with a region a93 of the narrow bevel 901a in the image 903, luminance of the region a93 is greater than that of the region a92. Similarly, in the sample 904, an image 905 output by the detector 203 is relatively bright.

Therefore, the defect observation apparatus 1 exchanges the image 905 output by the detector 203 and the image 906 output by the detector 204 in the sample 904 as a process of matching substantially the shade of each image. Accordingly, a shade in an image can be substantially matched between the exchanged image, and the image 902 output by the detector 203 and the image 903 output by the detector 204 in the sample 901.

In the example of FIG. 9, two images, the image 905 by the detector 203 and the image 906 by the detector 204 in the sample 904, are rotated by 180 degrees at first. Images 905b and 906b rotated by 180 degrees are exchanged. The two exchanged images are images 906c and 905c. The rotation may be executed after the exchange. For example, between the images 903 and 905c, directions or angles of wafer edges (wafer edges 903a and 905ca) in the images are substantially matched and shades (brightness of each region) are substantially matched. Therefore, when the image 903 is a target bevel image, the image 905c can be used as a suitable reference image.

As described above, the defect observation apparatus 1 (in particular, the computer system 3) generates the reference images in which the directions and the shades of the wafer edges in the images are substantially matched with the bevel images based on the plurality of reference image candidate images obtained through the symmetry and rotation operation processes on the bevel images. In other words, the reference image capturing scheme 612 is a scheme of selecting an image with a shade closest to the shade of the bevel image among a plurality of images with different shades captured at the selected imaging position and setting the selected image as a reference image. By comparing the bevel image and the suitable reference image, it is possible to detect a suitable defect.

As a modification, the defect observation apparatus 1 may further generate a reference image in which the position of the wafer edge in the image is also substantially matched. An example of a process of matching the position of the wafer edge in the image is translation or the like of the image content.

Figure 10:
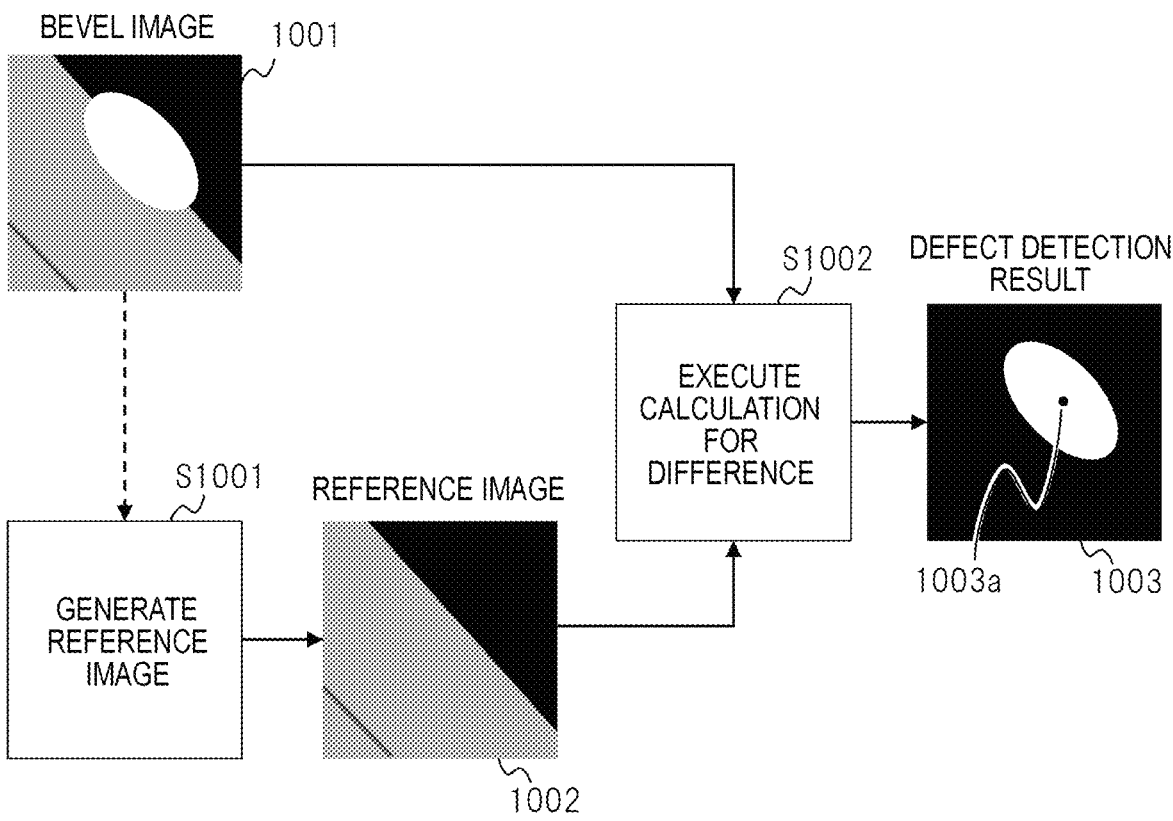
FIG. 10 is a diagram illustrating a processing example in the reference image capturing scheme according to the first embodiment.

FIG. 10 illustrates a processing example in the reference image capturing scheme 612. The processor of the computer system 3 executes a process such as steps S1001 and S1002. In step S1001, the processor generates a reference image 1002 corresponding to a bevel image 1001 of an inspection target (in other words, a defect observation target) based on the process of FIGS. 8A to 8C or FIG. 9. At this time, the processor acquires the reference image candidate image as in FIG. 8 by causing the SEM 2 to capture the target bevel image 1001 and generates the reference image 1002 through the rotation or exchange process as in FIG. 9 from the reference image candidate image. The process is executed similarly for each bevel image at each position.

Then, in step S1002, the processor executes calculation of a difference between the bevel image 1001 and the generated reference image 1002. A defect detection result 1003 is stored and output as a result of the calculation of the difference. The defect detection result 1003 is information including the position of the detected defect. This information is, for example, position coordinates 1003a of a central point of a defect portion in a wafer coordinate system corresponding to the bevel image 1001.

[Image Capturing Procedure]

In the first embodiment, the reference image capturing scheme 612 has the following feature as one feature. That is, according to this scheme, the outer circumferential portion of the wafer is divided into the number of regions set in advance based on the defect candidate coordinates, a plurality of reference images corresponding to the plurality of bevel images belonging to a region other than the first region are collectively captured in, for example, the first region, and the reference images corresponding to the bevel images belonging to the first region are captured in any region other than the first region.

As one problem in a reference image capturing scheme of the related art, it takes a relatively long time to capture the bevel images and the reference images of an observation target. In a method of the related art, as a procedure for capturing a plurality of images, a reference image (for example, referred to as reference image #1) for a bevel image (for example, referred to as bevel image #1) of a certain observation target is captured. Thereafter, a bevel image (bevel image #1) of the observation target is captured. Subsequently, a reference image (for example, referred to as reference image #2) for a bevel image (for example, referred to as bevel image #2) of another observation target is captured. Thereafter, a bevel image (bevel image #2) of the observation target is captured. In this way, the reference image and the bevel image of the observation target are alternately captured repeatedly in order.

However, in the method, when a region at a position symmetric to the bevel image of the observation target is captured as a reference image in the outer circumferential portion or the bevel portion of the surface of the wafer, it is necessary to move the stage of the SEM or the like to a symmetric imaging position from a certain imaging position. In the example of FIGS. 8A to 8C, it is necessary to mechanically move the stage 109 of the SEM 2 (see FIG. 2) between the position P1 of the bevel image 801 and the position P2 of the image 802 symmetric to the position P1. Therefore, because of the process on the plurality of bevel images and reference images at a plurality of positions, an overall movement distance and a required time increase and a throughput deteriorates.

As a solution to this problem, in the reference image capturing scheme 612 according to the first embodiment, the outer circumferential portion or the bevel portion is divided into the number of regions set in advance and each imaging position is selected as follows so that the imaging positions of the plurality of reference images corresponding to the plurality of bevel images belonging to a region other than the first region are collected in the first region among the plurality of divided regions. In the selection of the imaging positions of the reference images, the relationships of the symmetry and rotation as in FIGS. 8A to 8C are used. The defect observation apparatus 1 images the reference image candidate images at the imaging positions based on the symmetry and rotation operation processes as in FIGS. 8A to 8C, and generates the reference images based on the rotation and reversion operations and the operation of exchanging the images of the plurality of channels as in FIG. 9.

Accordingly, the plurality of reference images corresponding to the plurality of bevel images in the region other than the first region can be collectively captured and acquired in the first region, and the reference images corresponding to the bevel images in the first region can be imaged and acquired in the region other than the first region. When the plurality of reference images at the plurality of imaging positions in the first region are captured in order along the circumferential direction, an overall movement distance of the stage can be shortened and a throughput can be improved.

In other words, when the plurality of imaging positions of the plurality of bevel images are in a plurality of regions in the bevel portion of the wafer, the defect observation apparatus 1 selects a plurality of imaging positions so that the plurality of imaging positions of the plurality of reference images corresponding to the imaging positions are concentrated on one region (for example, the first region).

A processing example in conformity with the reference image capturing scheme 612 will be described with reference to FIG. 11. FIG. 11 is a diagram illustrating an imaging procedure of a plurality of images (a plurality of bevel images and a plurality of reference image candidate images) in the region division in conformity with reference image capturing scheme 612. In the upper part of FIG. 11, a surface (in particular, a bevel portion 1100) of the wafer which is the sample 10 on an x-y plane is illustrated. The surface (in particular, the bevel portion 1100) of the wafer is divided into four quadrants as four predetermined regions. In this example, as illustrated, a first region R1, a second region R2, a third region R3, and a fourth region R4 are provided as the four regions. The region division is not limited to four which is the division number.

In the lower part of FIG. 11, an imaging position of a bevel image is indicated by a white circle mark such as an imaging point 1101 (Ai) on a circular circumference 1100$a$ (corresponding to a wafer edge) of the bevel portion 1100, an imaging position of a reference image is indicated by a black circle mark such as an imaging point 1111 (Bi).

Imaging positions of a plurality of bevel images (for example, bevel images #1 to #4) are indicated as points such as Ai, Ai+1, Ai+2, and Ai+3. Imaging positions of a plurality of reference images (for example, reference images #1 to #4) are indicated as points such as Bi, Bi+1, Bi+2, and Bi+3. A certain bevel image and a reference image corresponding to the certain bevel image are assumed to have a value of the same code i. For example, as a correspondence relationship is indicated with a dotted arrow, the imaging point 1101 (Ai) of bevel image #1 corresponds to the imaging point 1111 (Bi) of reference image #1, and the imaging point 1102 (Ai+1) of bevel image #2 corresponds to the imaging point 1112 (Bi+1) of reference image #2.

In this example, a case in which a total of eight images, the four bevel images (bevel images #1 to #4) and the four reference images (reference images #1 to #4) corresponding to these four bevel images are captured will be considered. The defect observation apparatus 1 determines the imaging positions of the plurality of images and a procedure in this case so that an efficient procedure in which a stage movement amount is small is achieved.

When the imaging positions of the plurality of bevel images are obtained based on the defect candidate coordinates in the bevel portion, the defect observation apparatus 1 (in particular, the computer system 3) selects the imaging positions of the plurality of reference images corresponding to the imaging positions of the bevel images. At this time, when the imaging positions of the plurality of bevel images are widely distributed in two or more division regions, the computer system 3 selects the imaging positions of the plurality of corresponding reference images so that the imaging positions are collected in one region (for example, the first region R1) as far as possible. When the imaging positions are selected, the relationships of the symmetry and rotation as in FIGS. 8A to 8C are used.

In this example, to the imaging point 1101 (Ai) of bevel image #1 in the third region R3, the imaging point 1111 (Bi) in the first region R1 serving as a position which is point-symmetric with respect to the origin is set as the imaging position of reference image #1. To the imaging point 1102 (Ai+1) of bevel image #2 in the third region R3, the imaging point 1112 (Bi+1) in the first region R1 serving as a position which is point-symmetric with respect to the origin is set as the imaging position of reference image #2. To the imaging point 1103 (Ai+2) of bevel image #3 in the fourth region R4, the imaging point 1113 (Bi+2) in the first region R1 serving as a position which is line-symmetric with respect to the y axis is set as the imaging position of reference image #3. Since the imaging point 1112 (Bi+1) and the imaging point 1113 (Bi+2) are close positions, these imaging positions are at shifted positions for easy understanding in FIG. 11.

Accordingly, in the first region R1, all the three reference images such as reference images #1 to #3 can be captured.

For example, to the imaging point 1104 (Ai+3) of bevel image #4 in the first region R1, the imaging point 1114 (Bi+3) in the fourth region R4 serving as a position which is line-symmetric with respect to the y axis is set as an imaging position of reference image #4 to be located in a region other than the first region R1. Accordingly, for the bevel image in the first region R1, the reference image is captured in the region other than the first region R1.

As in the forgoing example, the imaging positions of the plurality of bevel images and the plurality of reference images are set. For example, the imaging positions of the plurality of reference images are set in the first region R1. The defect observation apparatus 1 determines an efficient imaging procedure for the plurality of imaging positions (for example, the imaging points 1101 to 1104 and the imaging points 1111 to 1114) set in the entire bevel portion of the wafer. That is, in the efficient imaging procedure, on the circumference 1100a of the bevel portion 1100, the appearing imaging points are selected in order from a certain imaging point along a certain circumferential direction, as exemplified by a solid arrow. Accordingly, for example, for the plurality of imaging points in the first region R1, the imaging procedure is, for example, an order of the imaging points 1104 (Ai+3), 1111 (Bi), 1113 (Bi+2), and 1112 (Bi+1).

In this example, when there are four bevel images corresponding to four defect candidate coordinates and four reference images (specifically, reference image candidate images) are captured to correspond to the four bevel images, the imaging positions of the plurality of reference images are collectively selected in the first region R1 in this case. The invention is not limited thereto. When many bevel images and reference images are captured in the bevel portion of the wafer surface, an imaging position of a plurality of images may be collectively selected in each of the divided regions using the plurality of divided regions as far as possible.

Figure 12:
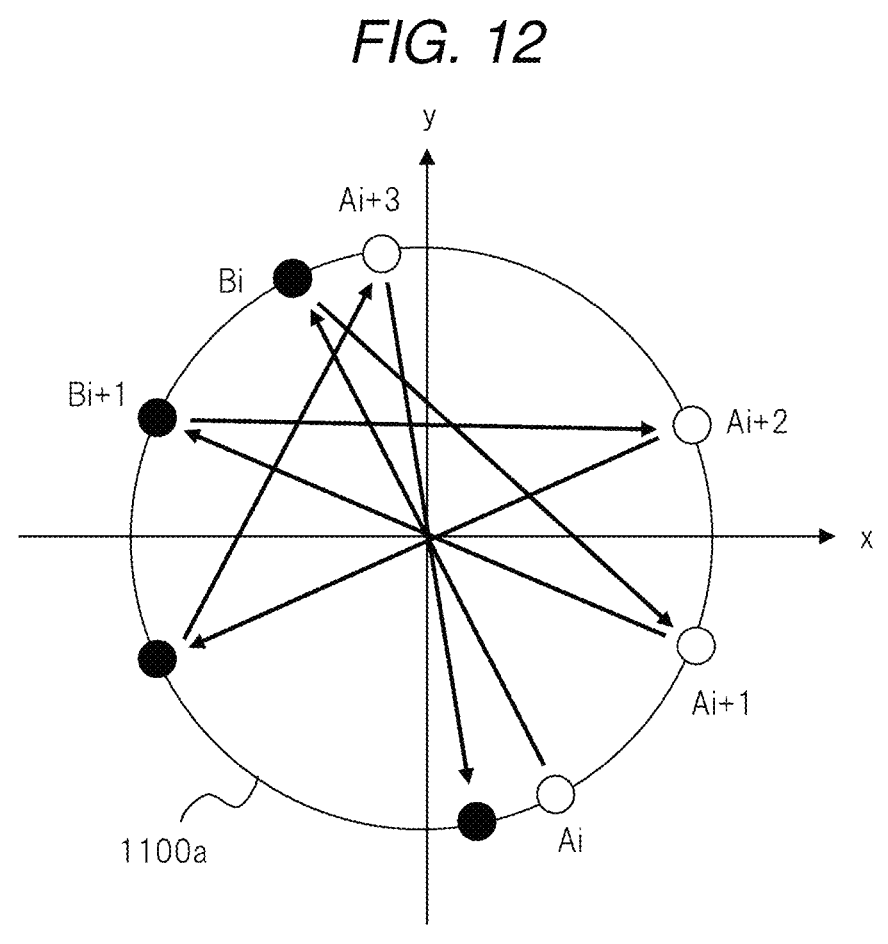

FIG. 12 illustrates a comparative example of FIG. 11. In the case of this method, as described above, for all the bevel images and the reference images, the imaging positions (for example, Ai to Ai+3 and Bi to Bi+3) are set in accordance with the relationship of the point symmetry. For the plurality of bevel images (for example, #1 to #4) and the plurality of reference images (for example, #1 to #4), the bevel images and the reference images are alternately captured repeatedly. In this method, as indicated by a solid line, an overall stage movement distance becomes long, and thus efficiency is not good. The imaging procedure in FIG. 11 is more efficient than the imaging procedure in FIG. 12.

[(C) Reference Image Estimation Scheme]

In the first embodiment, as one feature, the defect detection scheme includes (C) the reference image estimation scheme 613 of FIG. 6. The reference image estimation scheme 613 is a scheme of accepting a bevel image as an input, estimating a reference image with no defect, and detecting a defect portion using the reference image estimated as the bevel image.

As a problem of the related art, when the reference images are captured, a time necessary to observe a defect increases, and thus a throughput deteriorates in some cases. As a solution to this problem, in the reference image estimation scheme 613 according to the first embodiment, a bevel image is accepted as an input, a reference image with no defect is estimated, the bevel image is compared with the reference image, and a defect portion in the bevel image is detected.

Figure 13:
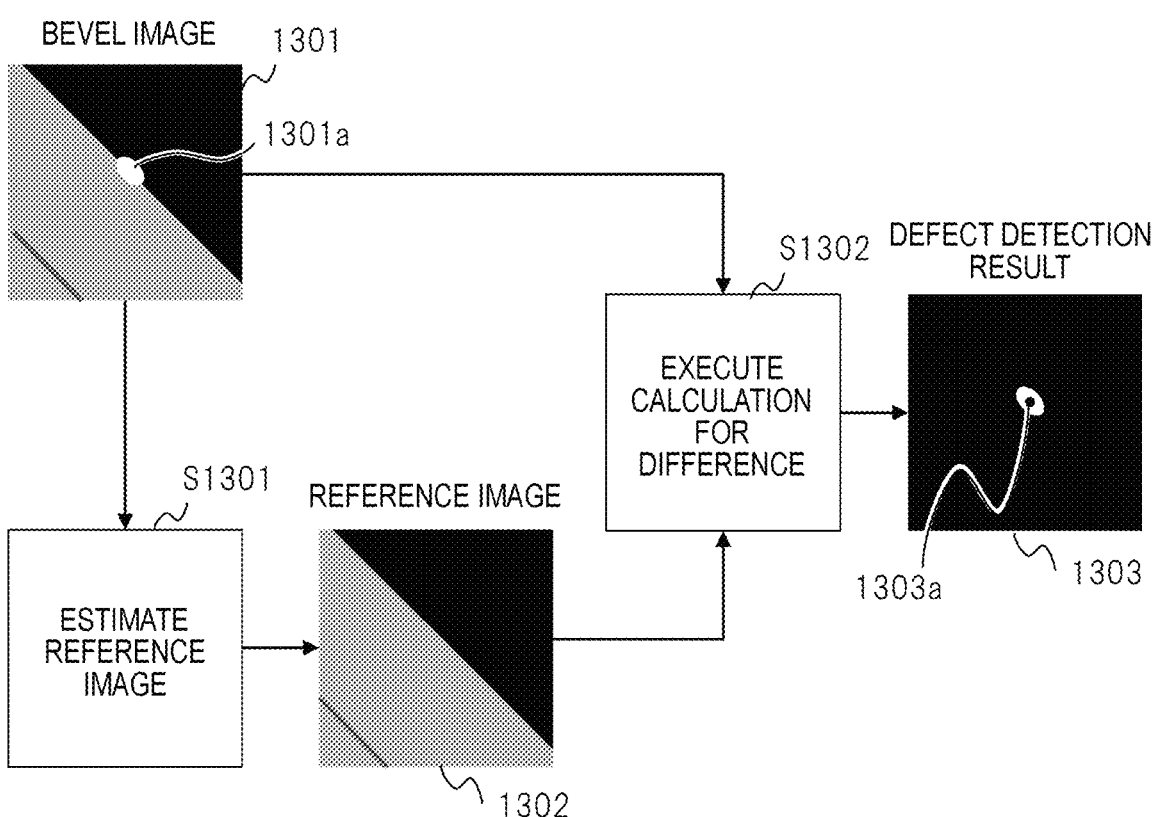
FIG. 13 is a diagram illustrating a processing example in a reference image estimation scheme according to the first embodiment.

FIG. 13 illustrates a processing example in conformity with the reference image estimation scheme 613. The computer system 3 of the defect observation apparatus 1 obtains a bevel image 1301 given as an input. The bevel image 1301 has a defect candidate 1301a at a position indicated at defect candidate coordinates. In this example, there is the defect candidate 1301a on a wafer edge. The processor of the computer system 3 estimates and obtains a reference image 1302 in which there is no defect (an image portion corresponding to a defect) by executing a reference image estimation process on the bevel image 1301 given as the input in step S1301. Then, in step S1302, the processor executes calculation of a difference between the bevel image 1301 and the reference image 1302 obtained through the estimation. Accordingly, a defect detection result 1303 is stored and output as a result of the calculation of the difference. The defect detection result 1303 includes defect position information 1303a.

In the first embodiment, as one feature, in the reference image estimation scheme 613, as a detailed processing example, the processor estimates and obtains the reference image by calculating a direction of the wafer edge in the image and calculating an average image of the bevel images in the wafer edge direction.

As a problem of the related art, it is difficult to estimate a reference image of a bevel image. In a bevel image in which a bevel portion is captured, not only a wafer (in particular, an inner circumferential portion) but also a background region outside of the wafer are shown in some cases. Therefore, a reference image with no defect cannot be estimated only when an average in the image is calculated.

As a solution to this problem, in the detailed processing example of the reference image estimation scheme 613 according to the first embodiment, the processor estimates and obtains the reference images by calculating a direction of the wafer edge in the bevel images and calculating an average image of the bevel images in the wafer edge direction. Then, the estimated images are used for comparison and inspection as the reference images.

Figure 14:
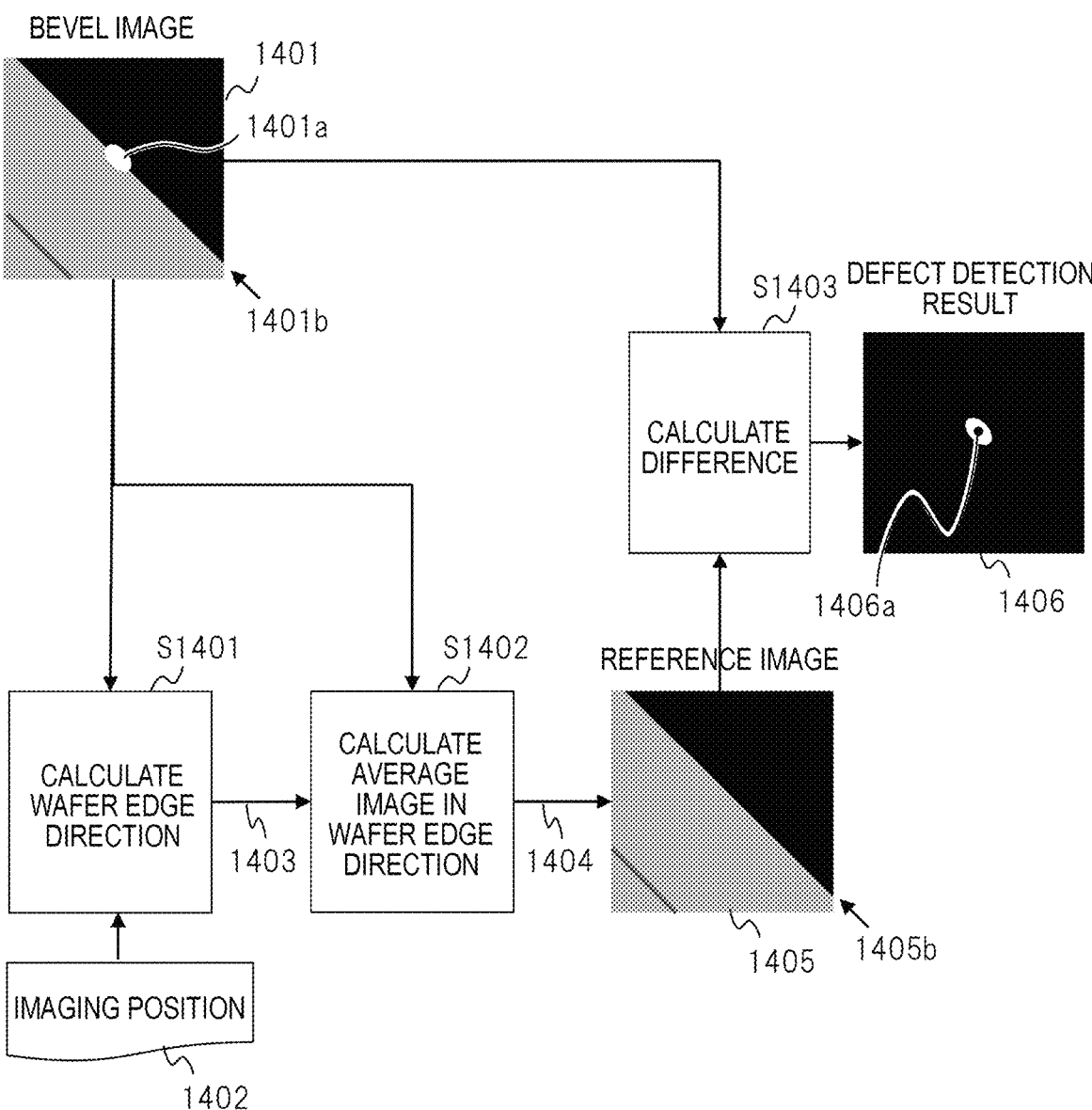
FIG. 14 is a diagram illustrating a processing example with regard to details of the reference image estimation scheme according to the first embodiment.

FIG. 14 illustrates a detailed processing example in the reference image estimation scheme 613 (in particular, estimation of a reference image). The processor obtains a bevel image 1401 as an input. In this example, the bevel image 1401 has a defect candidate 1401a on a wafer edge 1401b. First, in the wafer edge direction in the bevel image 1401, in step S1401, the processor accepts the bevel image 1401 and information regarding an imaging position 1402 of the bevel image 1401 as an input and executes a wafer edge direction calculation process. As a result, information 1403 regarding the wafer edge direction in the bevel image 1401 can be acquired as an output. The information 1403 regarding the wafer edge direction is, for example, information indicating a direction or an angle of the wafer edge 1401b in the image. As an example, when the upper side (the x axis) of a rectangle serves as a reference in the bevel image 1401, the direction of the wafer edge 1401b is a direction expressed at an angle of about −45 degrees.

Subsequently, in step S1402, the processor calculates an average image 1404 in the bevel image 1401 in the calculated wafer edge direction. In the average image 1404 of this result, a reference image 1405 with no defect can be obtained. For example, in the reference image 1405, luminance is constant and there is no defect region on the wafer edge 1405b.

As a processing example of the calculation of the average image 1404 for estimating the reference image, the processor sets a line in the wafer edge direction in the image ss a unit and averages pixel values on the line. Similarly, the processor averages the pixel values in each of the plurality of lines in the same direction in the image. Accordingly, the reference image 1405 with no defect can be obtained in accordance with the average image 1404.

Then, in step S1403, the processor executes calculation of a difference between the bevel image 1401 and the acquired reference image 1405. As a result of the calculation of the difference, a defect detection result 1406 is stored and output. The defect detection result 1406 includes defect position information 1406a.

[(D) Similar Data Comparison Scheme]

In the first embodiment, as one feature, the defect detection scheme includes (D) the similar data comparison scheme 614 of FIG. 6. The similar data comparison scheme 614 is a scheme of searching for images similar to inspection target bevel images from bevel images of another wafer captured in the image capturing step S1 with regard to inspection target bevel images of a certain wafer and using the searched similar images as reference images.

As a problem of the related, reference images of inspection target bevel images cannot be estimated or captured in some cases. As an instance in which a reference image cannot be estimated, there is an example in which when a wafer notch or an orientation flat and a wafer edge are simultaneously shown in an image, a direction or angle of a boundary between a wafer and a background in the image is abruptly changed, and therefore the estimation is difficult. As an instance in which a reference image cannot be captured, there is an example in which there is no region of which the outer appearance is similar in the same wafer since a wafer notch or an orientation flat is formed in a limited region of a bevel portion.

As a solution to this problem, in the first embodiment, in the similar data comparison scheme 614, images similar to inspection target bevel images are searched for from images captured in another wafer with regard to inspection target bevel images of a certain wafer and the searched similar images are used as reference images for comparison and inspection.

Figure 15:
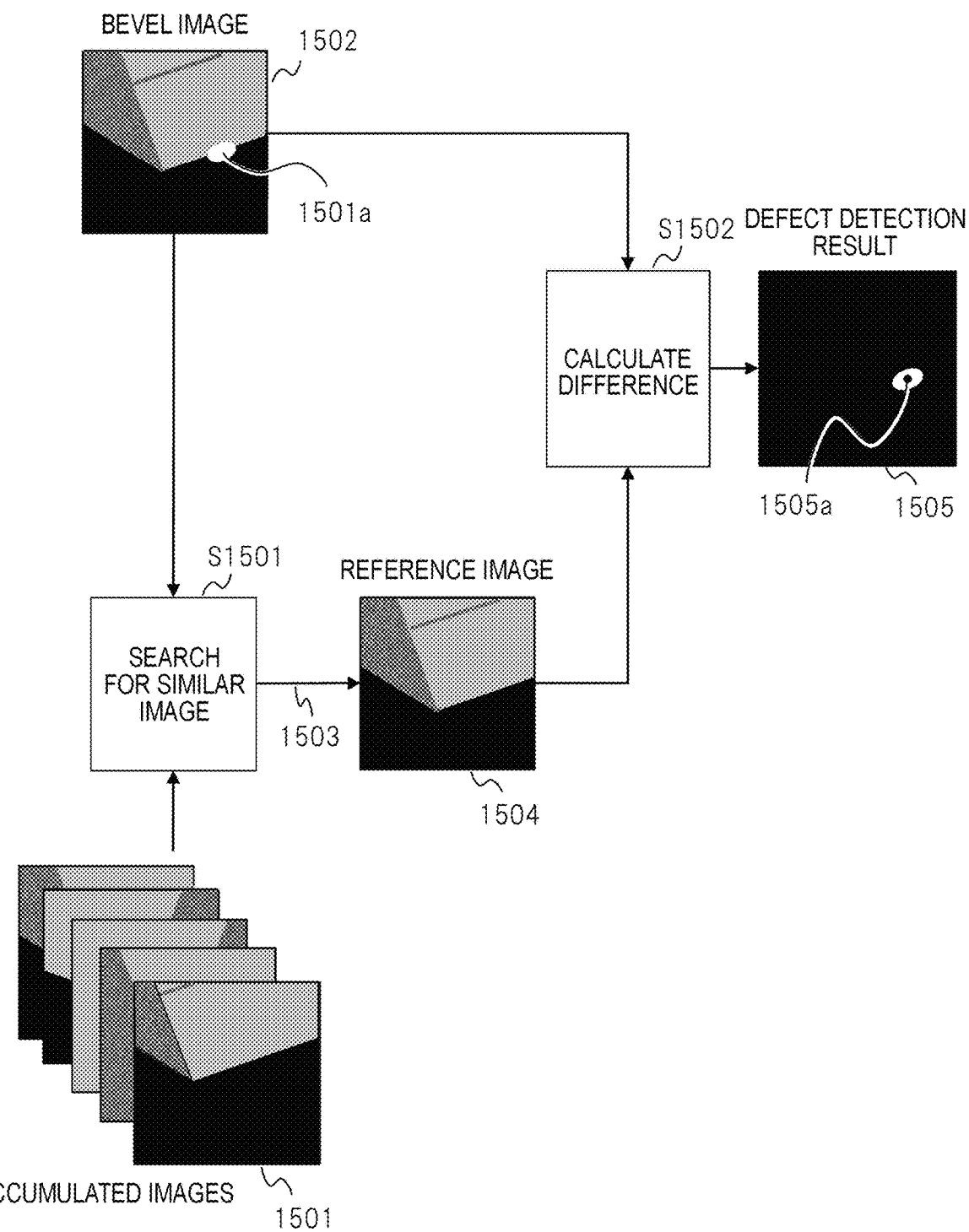
FIG. 15 is a diagram illustrating a processing example with regard to a similar data comparison scheme according to the first embodiment.

FIG. 15 illustrates a processing example in conformity with the similar data comparison scheme 614. The processor of the computer system 3 first captures a plurality of images of a bevel portion by changing an imaging position in another wafer in advance and acquires accumulated images 1501 as an accumulation result. Then, in step S1501, in defect detection, the processor searches for an image similar to the bevel image 1502 among the accumulated images 1501 in response to an input of the inspection target bevel image 1502 in a certain wafer. A similar image 1503 is obtained as a searching result. The processor uses the searched similar image 1503 as a reference image 1504. In step S1502, the processor executes calculation of a difference between the bevel image 1502 and the reference image 1504 in accordance with the similar image 1503. A defect detection result 1505 is stored and output as a result of the calculation of the difference. The defect detection result 1505 includes defect position information 1505a.

As described above, the method and the apparatus according to the first embodiment use a suitable defect detection scheme in accordance with presence or absence of a wafer edge or a wafer notch in a captured image.

[User Operation]

Figure 16:
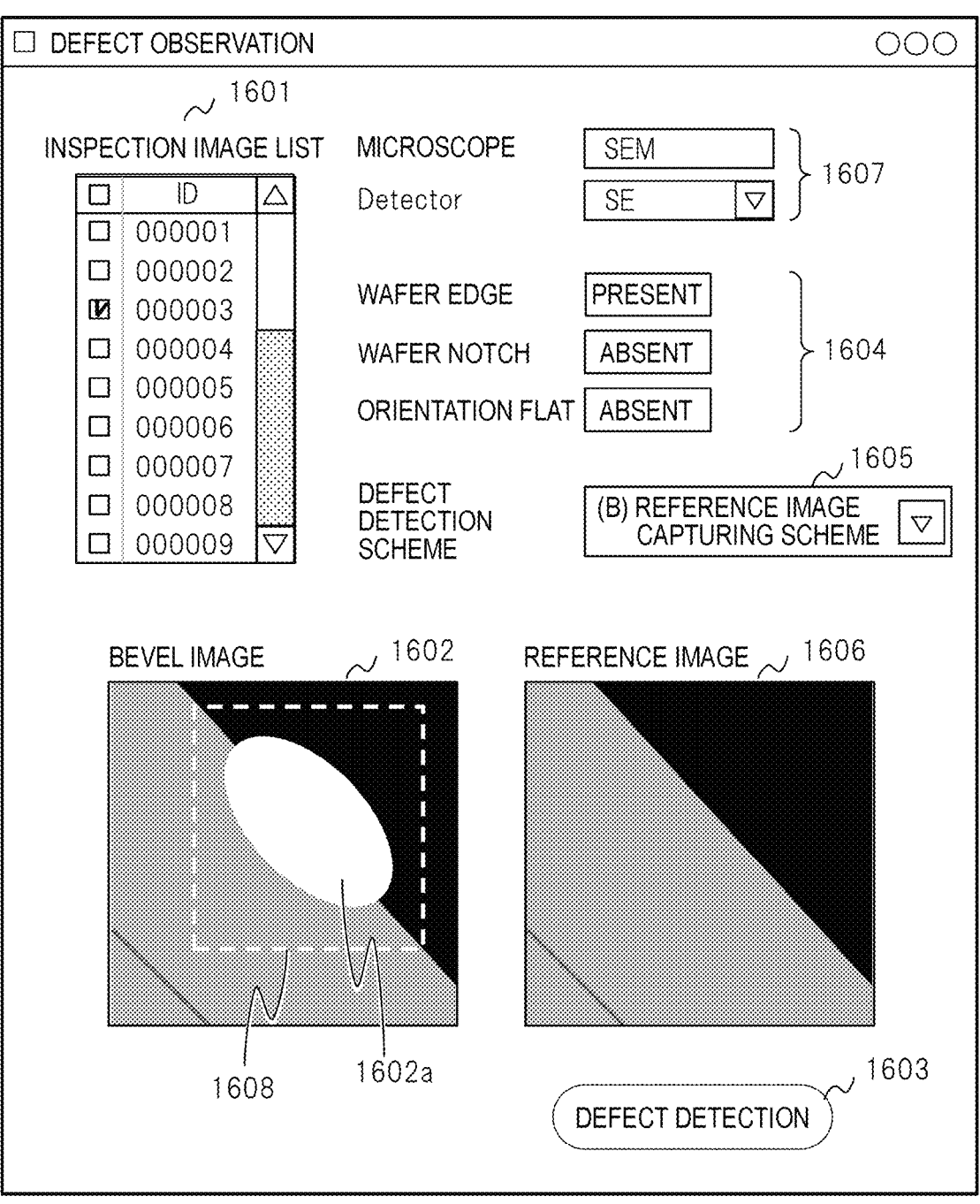
FIG. 16 is a diagram illustrating a display example of a screen including a GUI related to defect detection according to the first embodiment.

FIG. 16 illustrates a display example of a screen including a GUI in the defect observation apparatus and method according to the first embodiment. On the screen of FIG. 16, a list of IDs of the bevel images of which the image acquisition is completed is displayed in an interface region 1601 of an "inspection image list." A user selects and operates an inspection target, in other words, a bevel image of a defect observation target in the list. The bevel image with an ID selected in the list is displayed in an interface region 1602 of a "bevel image." In the interface region 1607, the user can set a type of microscope or imaging apparatus used to capture an image, a detector (in other words, channel), and the like.

When the user selects and operates a button of an interface region 1603 of "defect detection," the selected bevel image is targeted and the defect detection (a flow of the defect observation in FIG. 6) is automatically executed by the defect observation apparatus 1 (in particular, the computer system 3). The computer system 3 automatically switches the defect detection scheme to be applied, executes a defect detection process, and generates a result. As a result of the execution, information regarding the determination result 606 in the determination step S606 in FIG. 6 is displayed in the interface region 1604. The information regarding the determination result 606 includes presence or absence of a reflection of the wafer edge, presence or absence of a reflection of the wafer notch, and presence or absence of a reflection of the orientation flat in the bevel image.

In the interface region 1605 of the "defect detection scheme," information indicating the defect detection scheme selected in the scheme switching step S607 in FIG. 6 is automatically displayed. As an additional function, in a modification, as illustrated, an operation of the user selecting and applying the defect detection scheme by himself or herself can be executed in a GUI component of a list box in the interface region 1605. In this case, for example, the user can display and confirm a processing result in a scheme different from the scheme selected by the system. As a modification, a plurality of processing results in a plurality of schemes may be compared and displayed in parallel on a screen.

When the defect detection scheme selected in the scheme switching step S607 is a scheme in which the reference images are used, the reference images obtained in the scheme are displayed in the interface region 1606 of the "reference images." The user can compare the bevel image in the interface region 1602 with the reference image in the interface region 1606.

When a defect is detected in the target bevel image as a result of the defect detection process, GUI information indicating the detected defect is also displayed in the target bevel image in the interface region 1602. In this example, an image indicated by a dotted range surrounding the defect 1602a is displayed with predetermined color as defect information 1608 indicating the detected defect 1602a in the target bevel image in the interface region 1602. The computer system 3 stores a processing stage of the defect observation and data information of the processing result on the GUI of the foregoing screen in storage resources automatically on the background. The user can execute efficient defect observation work on the foregoing screen.

[Advantages]

As described above, in the defect observation method and apparatus according to the first embodiment, a defect can be observed and detected by applying the defect observation and detection scheme appropriate for an imaging target of a bevel portion of a semiconductor wafer. Therefore, it is possible to improve accuracy of the defect observation and detection further than the defect observation and detection in a single scheme of the related art.

Second Embodiment

A defect observation apparatus and method according to a second embodiment will be described with reference to FIGS. 17A and 17B and subsequent drawings. A defect observation method according to the second embodiment illustrated in FIG. 19 and the like is a method including steps executed by a defect observation apparatus according to the second embodiment. A basic configuration in the second embodiment is common to that of the first embodiment. Hereinafter, configurations of the second embodiment different from those of the first embodiment will be described mainly. In the second embodiment, switching and application of a defect detection scheme based on a determination result of a bevel image are common to those of the first embodiment. In the second embodiment, a main difference from the first embodiment is each defect detection scheme of selectively applying a defect detection scheme in accordance with processing content and a determination result of a bevel image.

In the above-described first embodiment, the method and the like of determining whether there is a reflection of a portion of a structure such as a notch in the bevel image using the bevel image, the imaging information, and the like and switching the defect detection scheme based on a determination result has been described. In the first embodiment, in particular, the case in which (A) the statistical image comparison scheme, (B) the reference image capturing scheme, (C) the reference image estimation scheme, and (D) the similar data comparison scheme of FIG. 6 are used as the example of the defect detection scheme has been described.

Here, when the above-described imaging information (at least one piece of information such as an imaging position, an imaging magnification, and an imaging visual field) is used, it cannot be correctly determined whether a reflection of a portion of a structure in a bevel image is included. For example, in particular, when an error is contained at an imaging position, it cannot be correctly determined whether a reflection of a portion is included despite referring to an image at that imaging position. That is, the defect observation apparatus cannot execute suitable determination although the defect observation apparatus much depends on imaging information such as imaging positions given from the outside.

For example, in (B) the reference image capturing scheme, it is necessary to capture reference images in the same wafer. In (D) the similar data comparison scheme, it is necessary to capture an image or search for a similar image in another wafer. Therefore, due to such an operation, there is a concern of a throughput of defect observation deteriorating.

Accordingly, in the second embodiment, a structure feature of a semiconductor wafer in a bevel image at each imaging position is determined without using imaging information or the like, it is not necessary to capture an image other than the bevel image or search for a similar image, and a defect observation method and the like capable of detecting a defect using only a bevel image will be described. In the second embodiment, a technology capable of correctly determining whether a reflection of a portion of a structure of a bevel portion is included by analyzing the bevel image itself without referring to the imaging information will be described. In the second embodiment, a technology capable of generating a suitable reference image from a bevel image itself will be described.

The defect observation method and apparatus according to the second embodiment detects or determines a boundary between various regions in a given bevel image as a region boundary by analyzing luminance or the like in the bevel image without using imaging information. The method and the apparatus according to the second embodiment classifies structure features of a bevel portion into several structure features in accordance with an aspect such as presence or absence of a region boundary. The method and the apparatus according to the second embodiment switch a defect detection scheme to be applied in accordance with the classification in a determination result.

In the second embodiment, as a difference in the processing content of the determination (in FIG. 6, step S606) of the bevel image, a boundary between various regions in a bevel image is determined and detected as a region boundary. The apparatus and the method according to the second embodiment classify structure features of a bevel portion into several structure features in accordance with presence or absence of a region boundary, the number of region boundaries, a direction or an angle of the region boundary, or the like in the bevel image.

In an actual bevel image, luminance irregularity can occur. For example, luminance irregularity can also occur in an inclined region corresponding to a narrow bevel. It may be difficult to handle the luminance irregularity in a technology of the related art in some cases. In the second embodiment, however, even when there is luminance irregularity in a bevel image, it is possible to appropriately determine and handle the luminance irregularity in accordance with a suitable defect detection scheme.

In the second embodiment, a region boundary is determined and detected by analyzing content of a bevel image, mainly, luminance (in other words, a pixel value corresponding to luminance). That is, various regions divided in accordance with a region boundary are regions in which luminance is relatively considerably different.

[Defect Observation Apparatus]

A configuration of the defect observation apparatus according to the second embodiment is similar to that of FIG. 2. In the computer system 3 according to the second embodiment, functions corresponding to the defect observation method according to the second embodiment are mounted and a computer program corresponding to the defect observation method according to the second embodiment is mounted. The computer program is stored in, for example, the storage unit 103, an external storage device 4, or the like. The processor of the computer system 3 realizes the functions according to the second embodiment by executing processes in accordance with the computer program.

[Image of Bevel Portion of Semiconductor Wafer]

Figure 17A:
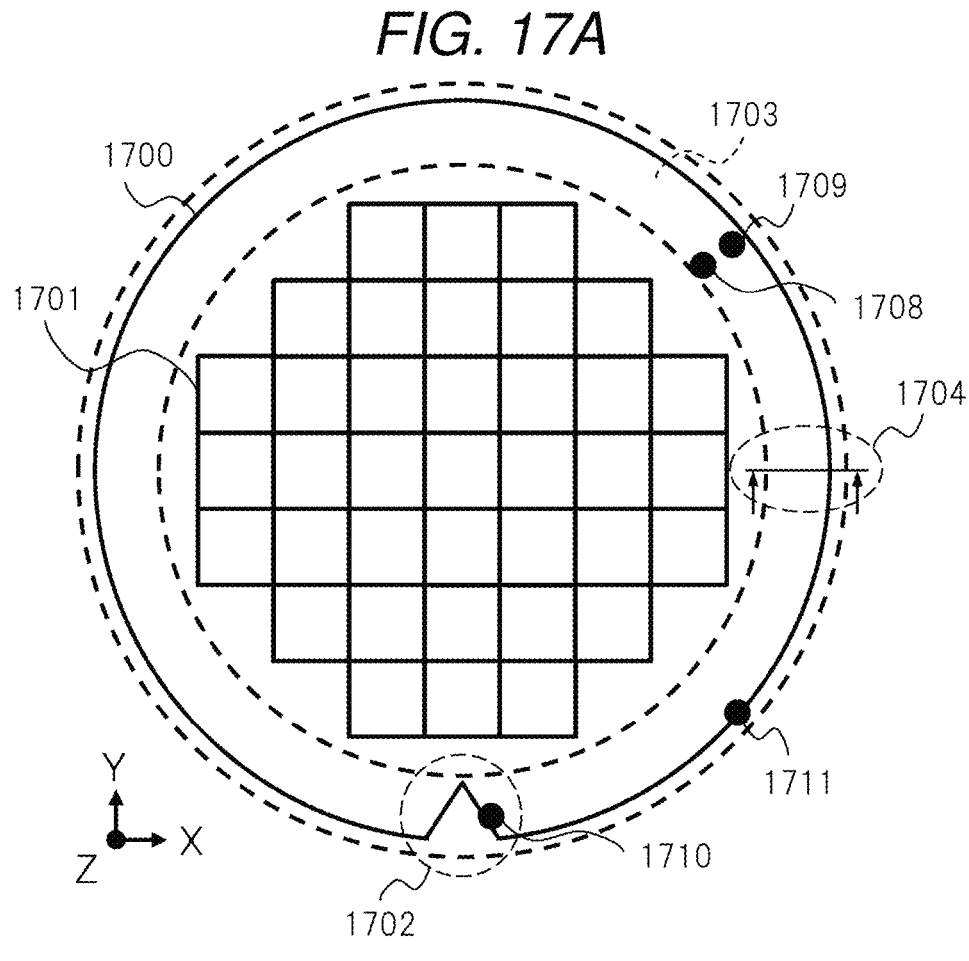
FIGS. 17A and 17B are diagrams illustrating an example of a bevel portion of a semiconductor wafer according to a second embodiment.
Figure 17B:
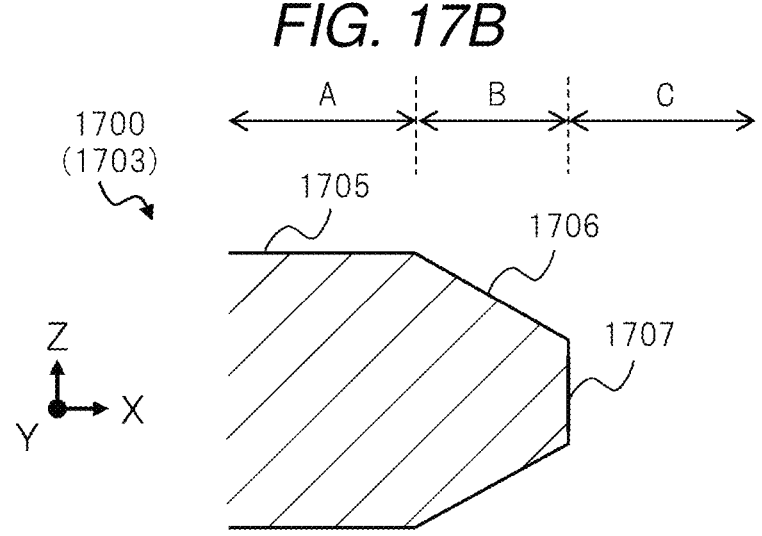

FIGS. 17A and 17B are diagrams illustrating an example of a bevel image obtained by imaging a bevel portion of a semiconductor wafer which is the sample 10 according to the second embodiment. FIG. 17A is an X-Y plan view which is a top view of the surface of a semiconductor wafer 1700. The semiconductor wafer 1700 includes chips 1701 and a notch 1702 on the surface. The plurality of chips 1701 are formed in an inner circumferential portion other than a bevel portion 1703. The bevel portion 1703 of the semiconductor wafer 1700 is schematically illustrated as a region in a ring shape indicated by dotted lines. In this example, one portion of the bevel portion 1703 has the notch 1702.

FIG. 17B is an exemplary cross-sectional view (X-Z plane) illustrating the bevel portion 1703 vertical to a region 1704 indicated by a dotted line of FIG. 17A. In the cross-sectional view of FIG. 17B, the surface of the semiconductor wafer 1700 has a wafer upper-surface region 1705, a wafer slope surface region 1706, and an apex region 1707 (an apex or a tip end) in order from the inner circumferential side to the outer circumferential side in the X axis direction which is a radial direction. In these regions, slopes are different in the cross-sections including the z axis, as illustrated.

To correspond to the regions on the wafer surface, there are an upper surface region A, a slope surface region B, and a background region C in order from the inner circumferential side to the outer circumferential side when seen in the bevel image obtained by imaging the wafer surface in the Z axis direction corresponding to the top view. In the second embodiment, these regions are treated as various regions divided along lines of region boundaries in the bevel image. In the present specification, for description, these regions are defined with names such as the wafer upper-surface region 1705, the upper surface region A, and the like, but the invention is not limited thereto.

The wafer upper-surface region 1705 is a region parallel to the directions of the horizontal X and Y axes and a region corresponding to an inner-circumferential portion of the wafer other than a narrow bevel. The wafer slope surface region 1706 is a region corresponding to the above-described narrow bevel and a region of a surface that has a predetermined angle with respect to the directions of the X and Y axes. The apex region 1707 is a region corresponding to an end of the semiconductor wafer 1700, a region cut vertically to the wafer upper-surface region 1705, and a region corresponding to a curved surface including the z axis direction on a side surface of the outer circumference. The apex region 1707 corresponds to the above-described wafer edge when seen in a top view.

The upper surface-region A is a region corresponding to the inner circumferential portion of the wafer other than the narrow bevel. The slope surface region B is a region corresponding to the narrow bevel. The background region C is a wafer-outside region outside of the wafer edge (the apex region 1707) or a region corresponding to the above-described notch or orientation flat.

Figure 18A:
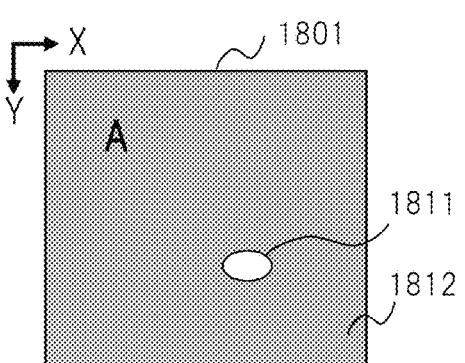
FIGS. 18A to 18E are diagrams illustrating an example of images of bevel portions according to the second embodiment.
Figure 18B:
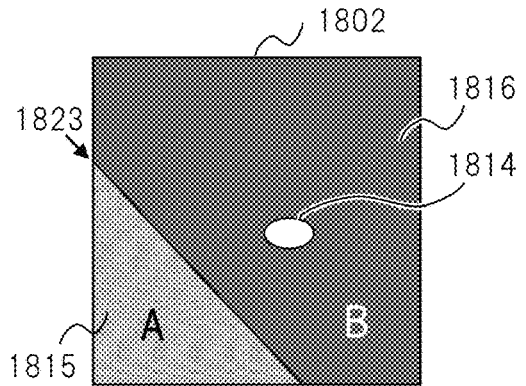
Figure 18C:
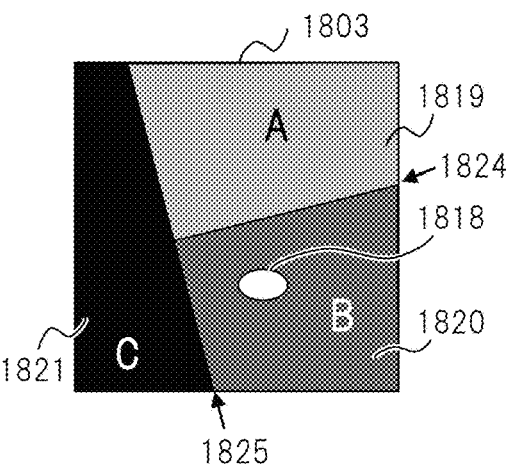
Figure 18D:
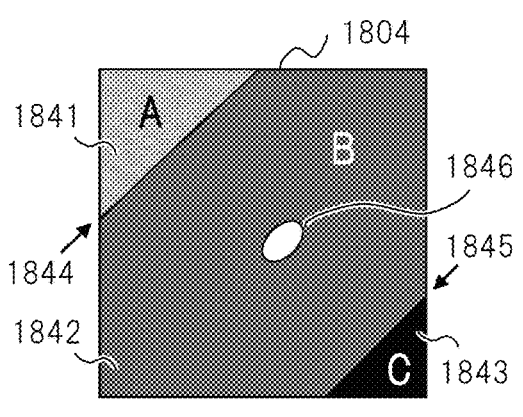
Figure 18E:
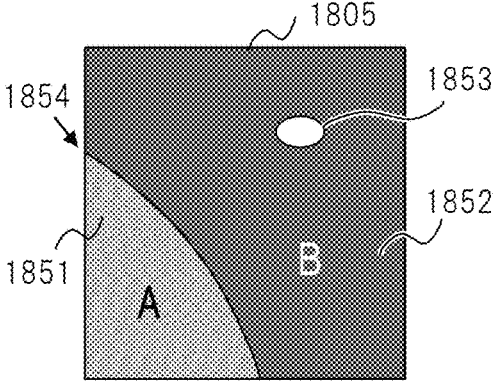

FIGS. 18A to 18E illustrate examples of bevel images which are images captured at positions 1708 to 1711 which are imaging positions in the semiconductor wafer 1700 in FIGS. 17A and 17B. FIG. 18A illustrates an image 1801 at the position 1708. FIG. 18B illustrates an image 1802 at the position 1709. FIG. 18C illustrates an image 1803 at the position 1710. FIG. 18D illustrates an image 1804 at the position 1711. FIG. 18E illustrates an image 1805 which is another image example at the position 1709. The image 1802 in FIG. 18B is an image when a boundary between the upper surface region A and the slope surface region B is shown in a substantially straight line in accordance with an imaging magnification. The image 1805 in FIG. 18E is an image when a boundary between the upper surface region A and the slope surface region B is shown in a curved line in accordance with an imaging magnification.

In this example, the position 1708 is a position close to the inner circumference in the bevel portion 1703, the position 1709 is a position close to the outer circumference in the bevel portion 1703, and the position 1710 is a position close to the notch 1702 in the bevel portion 1703. The position 1711 is a position close to the apex region 1707 in the bevel portion 1703. Each image is schematically illustrated with gray although the example is actually a full-color image. The various regions have luminance irregularity in some cases, but are schematically illustrated as uniform gray regions.

The image 1801 in FIG. 18A includes only a wafer upper-surface region 1812 corresponding to the upper surface region A among three types of regions in FIG. 17B in this case, and a defect 1811 is included in the wafer upper-surface region 1812. In the drawings, for easy understanding, reference sign A or the like corresponding to the upper surface region A is denoted and illustrated.

The image 1802 in FIG. 18B includes a wafer upper-surface region 1815 corresponding to the upper surface region A and a wafer slope surface region 1816 corresponding to the slope surface region B among the three types of regions in this case and a defect 1814 is included in the wafer slope surface region 1816. A region boundary 1823 is a line of a boundary between the wafer upper-surface region 1815 and the wafer slope surface region 1816.

The image 1803 in FIG. 18C includes a wafer upper-surface region 1819 corresponding to the upper surface region A, a wafer slope surface region 1820 corresponding to the slope surface region B, and a partial notch region 1821 corresponding to the background region C among the three types of regions in this case and a defect 1818 is included in the wafer slope surface region 1820. A region boundary 1824 is a line of a boundary between the wafer upper-surface region 1819 and the wafer slope surface region 1820. A region boundary 1825 is a line of a boundary between the wafer upper-surface region 1819 and the wafer slope surface region 1820, and a partial notch region 1821. The background region C has a region of a notch or an orientation flat in some cases as in this example. In this example, the notch has a cross-section vertical to the wafer surface in this case, but has a chamfered slope surface in the notch or the orientation flat in some cases as in the example of the first embodiment.

The image 1804 in FIG. 18D includes a wafer upper-surface region 1841 corresponding to the upper surface region A, a wafer slope surface region 1842 corresponding to the slope surface region B, and a wafer-outside region 1843 corresponding to the background region C among the three types of regions in this case and a defect 1846 is included in the wafer slope surface region 1842. The wafer-outside region 1843 is a region that has no notch nor orientation flat. A region boundary 1844 is a line of a boundary between the wafer upper-surface region 1841 and the wafer slope surface region 1842. A region boundary 1845 is a line of a boundary between the wafer slope surface region 1842 and the wafer-outside region 1843.

The image 1805 in FIG. 18E includes a wafer upper-surface region 1851 corresponding to the upper surface region A and a wafer slope surface region 1852 corresponding to the slope surface region B among the three types of regions in this case and a defect 1853 is included in the wafer slope surface region 1852. A region boundary 1854 is a line of a boundary between the wafer upper-surface region 1851 and the wafer slope surface region 1852. The region boundary 1854 is shown in a curved line in this case and the degree of curve is exaggerated in the drawing for easy understanding.

The upper surface region A is relatively close to the detector 111 of the SEM 2 (see FIG. 2) when seen from the upper side in the Z axis direction. Therefore, luminance in the image is relatively high. Conversely, the background region C corresponds to the stage 109 or the like and is relatively distant from the detector 111 of the SEM 2 (see FIG. 2) when seen from the upper side in the Z axis direction. Therefore, luminance in the image is relatively low (in the drawing, indicated with black).

In the second embodiment, with regard to the wafer structure in the bevel image, the region boundaries are treated primarily and the three types of regions such as the upper surface region A, the slope surface region B, and the background region C divided by the region boundaries are treated secondarily. When a notch or an orientation flat is identified and distinguished, the background region C may be further divided into types of regions such as a wafer-outside region, a notch region, and an orientation flat region. In the present specification, a boundary between two types of regions among three types of regions is defined in description as a region boundary. The region boundary is not limited thereto and a region boundary line or the like may be expressed. The region boundary is a boundary between regions where luminance is relatively considerably different as in the example of FIGS. 18A to 18D.

The region boundary is a straight or arc curved line in accordance with an actual state of a structure. Specifically, in the case of the boundary between the wafer upper-surface region 1705 and the wafer slope surface region 1706 in FIG. 17B, the actual state of the region boundary is a curved line in this case, as illustrated in FIG. 17A. Similarly, in the case of the boundary (that is, the apex region 1707) between the wafer slope surface region 1706 and the background region C, the actual state of the region boundary is a curved line. In the case of the boundary between the wafer upper-surface region 1705 or the wafer slope surface region 1706 and the notch region, the actual state of the region boundary is a straight line, as illustrated in FIG. 17A. Similarly, in the case of the boundary with the orientation flat region as in (a3) of FIG. 1, the actual state of the region boundary is a straight line.

In the examples of the bevel images (FIGS. 18A to 18D) according to the second embodiment, an imaging visual field is relatively narrow. Therefore, in the bevel image, the region boundary is seen as a straight line although the actual state of the structure is a curved line. As will be described below, with regard to a difference between a straight line and a curved line of a region boundary, a method of distinguishing and processing the straight line and the curved line is used basically, but a method of considering and processing all lines as substantially straight lines can also be used.

As in the examples of FIGS. 17A and 17B and FIGS. 18A to 18E, in the bevel image in a top view in which the bevel portion 1703 vertical to the upper surface of the wafer in the Z axis direction is captured, whether a reflection of various regions of the upper surface region A, the slope surface region B, and the background region C is included or a direction or an angle of the region boundary in the image is different in accordance to an imaging position.

In the examples of FIGS. 18A to 18E, in the image 1801 of FIG. 18A, there is only the upper surface region A and there is no region boundary. In the image 1802 of FIG. 18B, there are the upper surface region A and the slope surface region B and there is one region boundary. In the image 1803 of FIG. 18C, there are the upper surface region A, the slope surface region B, and the background region C (in particular, the notch region), there are two region boundaries and directions or angles of the two region boundaries are considerably different. In the image 1804 of FIG. 18D, there are the upper surface region A, the slope surface region B, and the background region C (the wafer-outside region), there are two region boundaries and directions or angles of the two region boundaries are substantially the same. In the image

1805 of FIG. 18E, there are the upper surface region A and the slope surface region B and there is one region boundary in a curved line.

Each region boundary has a direction in the bevel image, in other words, an angle. In the present specification, the direction or the angle is defined in description as a region boundary angle. For each bevel image, the region boundary angle is various. In the second embodiment, when there are a plurality of region boundaries in the bevel image, whether the directions or the angles of the region boundaries are substantially the same or sufficiently different is distinguished. For example, when a difference between the angles of the two region boundaries is a threshold or more, it is determined that the directions and the angles of the region boundaries are considerably different.

Expression or a data structure for a position or an angle of a region boundary in a bevel image is not limited. For example, to express a position or an angle of a region boundary in a bevel image, for example, coordinates of an upper left pixel of a bevel image are set to the origin (0, 0), and an X axis direction (in other words, the horizontal direction) corresponding to the upper side and a Y axis direction (in other words, the vertical direction) corresponding to the left side are used. The X axis direction is set to, for example, an angle of 0 degrees. In the examples of FIGS. 18A to 18E, an angle of the region boundary 1823 is about −45 degrees (or about +315 degrees). An angle of the region boundary 1824 is about +15 degrees. An angle of the region boundary 1825 is about −75 degrees.

The computer system 3 according to the second embodiment detects at least the region boundary as in the examples of FIGS. 18A to 18E from the bevel image and calculates an angle of the region boundary. For the background region C, in particular, there is a case in which a notch region is included, a case in which an orientation flat region is included, or a case in which a wafer-outside region with no notch or orientation flat is included. However, it is not essential to determine such regions.

[Processing Sequence of Defect Observation]

A defect observation method performed by the defect observation apparatus according to the second embodiment will be described with reference to FIG. 19. FIG. 19 illustrates a processing flow of the defect observation method according to the second embodiment. The computer system 3 (in particular, the processor of the control unit 102) in FIG. 2 executes a process in accordance with the flow.

The defect observation method according to the second embodiment includes an image capturing step of acquiring a bevel image 1905 obtained by imaging a bevel portion of a semiconductor wafer as the first step S1 and a defect detection step of detecting a defect portion in the bevel image 1905 as the second step S2. The first step is similar to that of the first embodiment.

The defect detection step which is the second step S2 specifically includes a determination step S1906, a scheme switching step S1907, and a defect detection step S1908. The determination step S1906 is a step of determining a region boundary or the like as a structure of the semiconductor wafer and obtaining a determination result 1906 using the bevel image 1905 (in other words, an image at each imaging position) without using imaging information or the like. The scheme switching step S1907 is a step of selecting and switching one defect detection scheme to be applied to the bevel image 1905 from defect detection schemes 1911 to 1914 of a plurality of candidates (here, first to N-th N candidates) based on the determination result 1906 of the determination step S1906. The defect detection step S1908 is a step of detecting a defect portion from the bevel image 1905 and obtaining defect coordinates 1908 as a defect detection result in the defect detection scheme switched in the scheme switching step S1907. Thereafter, the process after observation image capturing of step S1909 is similar to that of the first embodiment.

In the defect observation of the bevel portion of the semiconductor wafer, as in the examples of FIGS. 18A to 18E, in the bevel image, whether a reflection of the upper surface region A, the slope surface region B, and the background region C including a notch or the like is included or a direction or an angle of the region boundary in the bevel image is different in accordance with an imaging position. Therefore, as a problem, it is difficult to detect a defect in accordance with a single defect detection scheme of the related art. Accordingly, in the second embodiment, presence or absence of a region boundary, the number of region boundaries, and an angle or the like of a region boundary are determined as the structure of the semiconductor wafer using a bevel image. Based on a result of the determination, a defect detection scheme to be applied is switched from the plurality of defect detection schemes. Accordingly, accuracy of defect detection is improved further than in the related art.

In FIG. 19, in the defect observation method according to the second embodiment, the semiconductor wafer 1901 of a defect observation target and the defect candidate coordinates 1902 from the defect inspection apparatus are accepted as an input, and the image capturing step S1902 is executed on each defect candidate coordinates 1902 in the first step S1 to obtain each bevel image 1905. In the defect observation method according to the second embodiment, the determination step S1906, the scheme switching step S1907, and the defect detection step S1908 are executed on each bevel image 1905 in the second step S2 to obtain the defect coordinates 1908. In the defect observation method according to the second embodiment, the observation image capturing step S1909 is executed using the obtained defect coordinates 1908 to obtain the observation image 1909. The defect observation apparatus according to the second embodiment repeatedly executes the series of processes similarly on all the defect candidate coordinates 1902 to acquire observation images 1909 at all the defect candidate coordinates 1902, and then ends the defect observation.

[Determination Step]

FIGS. 20A and 20B illustrate examples of the structure of the semiconductor wafer determined in the determination step S1906 of FIG. 19. In the determination step S1906, the computer system 3 determines whether there is a region of a region boundary, there is a region boundary of a curved line, and there is a notch or an orientation flat in the input bevel images 1905. The computer system 3 classifies the bevel images into several classifications in accordance with the determination. In the examples of FIGS. 20A and 20B, in "image examples" in the first row of the table, bevel images of four instances, first to fourth instances, are shown. For description, the first instance and the like in the second embodiment are distinguished from the first instance and the like in the first embodiment (see FIGS. 7A and 7B). In the second row of the table, "presence or absence of region boundary" indicates presence or absence of a region boundary detected in the bevel image. The region boundary may be a straight line or a curved line. In the third row of the table "presence or absence of region boundary in curved line" indicates presence or absence of, in particular, a region boundary which is a curved line as a region boundary detected in the bevel image. In the fourth row of the table, "presence or absence of notch/orientation flat" indicates presence or absence of a region of a notch or an orientation flat in relation to regions divided in a region boundary detected in the bevel image.

An image 2001 of the first instance is similar to the image 1801 in FIG. 18A. An image 2002 of the second instance is similar to the image 1802 in FIG. 18B. An image 2003 of the third instance is similar to the image 1803 in FIG. 18C. An image 2004 of the fourth instance is similar to the image 1805 in FIG. 18E. The image 2002 of the second instance is an image example when an imaging visual field is relatively narrow, in other words, an imaging magnification is relatively high, and a line of a region boundary is shown in a straight line. The image 2004 of the fourth instance is an image example when an imaging visual field is relatively wide, in other words, an imaging magnification is relatively low, and a line of a region boundary is shown in a curved line.

In the case of the image 1804 in FIG. 18D, two region boundaries are detected. The image 1804 is considered as second classification in FIGS. 20A and 20B in accordance with an aspect of an angle of the region boundary irrespective of whether the number of region boundaries is one or two or more. When a difference between angles of two or more region boundaries is sufficiently small, an image is considered as the second classification in FIGS. 20A and 20B. When the difference between the angles of the two or more region boundaries is sufficiently large, an image is classified as third classification in FIGS. 20A and 20B.

The computer system 3 determines that, for example, the image 2001 corresponds to "absence of region boundary." In this case, presence or absence of the region boundary of the curved line and presence or absence of the notch/orientation flat are non-relation. The computer system 3 determines that, for example, the image 2002 corresponds to "presence of region boundary," determines that this image corresponds "absence of region boundary of curved line" among the region boundaries of the image, and determines that this image corresponds to "absence of notch/orientation flat." The computer system 3 determines that, for example, the image 2003 corresponds to "presence of region boundary," determines that this image corresponds to "absence of region boundary of curved line" among the region boundaries in the image, and determines that this image corresponds to "presence of notch/orientation flat." The computer system 3 determines that, for example, the image 2004 corresponds to "presence of region boundary," determines that this image corresponds to "presence of region boundaries of the curved line" among the region boundaries in the image, and determines that this image corresponds to "absence of notch/ orientation flat."

The presence or absence of the notch/orientation flat can be determined using the number of region boundaries or the angle of the region boundary, as will be described below (FIGS. 22A to 22C). For example, when the number of region boundaries is 2 and a difference between the region boundaries is a threshold or more, "presence of notch or orientation flat" is determined. In the second embodiment, when there is a notch or an orientation flat, the same defect detection scheme can be applied. Therefore, it is not essential to distinguish and identify the notch from the orientation flat.

In the second embodiment (see FIG. 19), a basic configuration is a configuration (see FIG. 21) in which a straight line and a curved line in a region boundary are distinguished and identified, but this is not essential. As a more simplified configuration, a configuration (see FIGS. 23A to 23D) in which all the region boundaries are approximated to a straight line and processed may be used. When a region boundary is treated as a substantially straight line without distinguishing straight and curved lines, the second and fourth instances of FIGS. 20A and 20B can be integrated to one classification (the second classification).

The computer system 3 classifies bevel images into several classifications in accordance with different wafer structures or features in bevel images, specifically, aspects of the region boundaries, as in foregoing examples. In the examples of FIGS. 20A and 20B according to the second embodiment, four classifications from first to fourth classifications are used. The computer system 3 selects and switches an appropriate defect detection scheme to be applied to the bevel image in accordance with the classification. In the example of the second embodiment, an appropriate defect detection scheme is selected from three types of defect detection schemes from first to third defect detection schemes.

The table of FIG. 20B shows collection with regard to selection of a defect detection scheme in accordance with the determination result classifications corresponding to FIG. 20A. In the case of the first classification, defect detection schemes which are applicable candidates are the first defect detection scheme 1911, the second defect detection scheme 1912, and the third defect detection scheme 1913 in FIG. 19. In the case of the second classification, defect detection schemes which are applicable candidates are the second defect detection scheme 1912 and the third defect detection scheme 1913. In the case of the third classification, a defect detection schemes which is an applicable candidate is the third defect detection scheme 1913. In the case of the fourth classification, a defect detection scheme which is an applicable candidate is the third defect detection scheme 1913. In the case of the first classification, a particularly effective defect detection scheme is the first defect detection scheme 1911. In the case of the second classification, a particularly effective defect detection scheme is the second defect detection scheme 1912. In the case of the third classification, a particularly effective defect detection scheme is the third defect detection scheme 1913. In the case of the fourth classification, a particularly effective defect detection scheme is the third defect detection scheme 1913. In the example of the second embodiment, in the case of each classification, the illustrated scheme is applied as a particularly effective defect detection scheme. The details of the first to third defect detection schemes will be described below.

A processing example of scheme switching in step S1907 of FIG. 19 is as follows. The computer system 3 sets the case of "absence of region boundary" (the first instance in FIGS. 20A and 20B) in the determination result 1906 as the first classification and switches the scheme to the first defect detection scheme appropriate for the first classification. The computer system 3 sets the case of "presence of region boundary," "absence of region boundary of curved line," and "absence of notch/orientation flat" (the second instance in FIGS. 20A and 20B) in the determination result 1906 as the second classification and switches the scheme to the second defect detection scheme appropriate for the second classification. The computer system 3 set the case of "presence of region boundary," "absence of region boundary of curved line," and "presence of notch/orientation flat" (the third instance in FIGS. 20A and 20B) in the determination result 1906 as the third classification and switches the scheme to the third defect detection scheme appropriate for the third classification. The computer system 3 sets the case of "presence of region boundary" and "presence of region boundary of curved line" in the determination result 1906 as the fourth classification and switches the scheme to the third defect detection scheme appropriate for the fourth classification.

[Details of Determination Step]

The details of the determination process of the determination step S1906 will be described with reference to FIG. 21. In step S2101, the computer system 3 detects a region boundary in an input bevel image 2101 corresponding to the bevel image 1905 and obtains region boundary information (in other words, a region boundary image) 2102 as a detection result. In this example, a case in which the input bevel image 2101 is the image 2003 of the third instance in FIGS. 20A and 20B is illustrated. A region boundary in the bevel image 2101 can be detected by determining a distribution of luminance in the bevel image 2101 using a known image processing technology. For example, when luminance is examined in a direction indicated by a dotted arrow, as illustrated, a portion in which the luminance is sufficiently considerably changed can be detected. When portions with such a change in the luminance are distributed continuously in a straight form, the portions in the straight line correspond to a region boundary.

Region boundary information 2102 is set as an image which is a data structure example, but the invention is not limited thereto. For the region boundary image 2102, a value indicating whether to correspond to a region boundary is stored for each pixel. In this example, in the region boundary image 2102, region boundaries 2103 and 2104 are detected as two region boundaries, as illustrated. These region boundaries correspond to the region boundaries 1825 and 1824 in FIGS. 18A to 18E. As each pixel value, for example, a first value is stored in the case of no correspondence to the region boundary, a second value is stored in the case of correspondence to the region boundary 2103, and a third value is stored in the case of correspondence to the region boundary 2104. When a plurality of region boundaries are detected in one bevel image, the computer system 3 may assign and manage identification information, position coordinate information, or the like to each region boundary.

Subsequently, in step S2102, the computer system 3 determines whether a line is a straight line or a curved line for each region boundary in the region boundary information 2102 and acquires a straight line or curved line determination result 2105 as a determination result. A scheme of determining whether a line is a straight line or a curved line is not limited and a known image processing technology can be applied. The straight line or curved line determination result 2105 is managed in association with the region boundary information 2102 because information indicating whether a line is a straight line or a curved line for each region boundary is stored. For example, the region boundary 2103 is a straight line and the region boundary 2104 is a straight line. In the second embodiment, the straight line and the curved line are distinguished and identified in the determination.

Subsequently, in step S2103, the computer system 3 calculates a direction or an angle of the line for each region boundary in the region boundary information 2102 as a region boundary angle. A result calculated in step S2103 is obtained as region boundary angle information 2106. The region boundary angle information 2106 is managed in association with the region boundary information 2102 and the straight line or curved line determination result 2105. For example, in the region boundary 2103 (in other words, the first region boundary), a first angle (for example, −75 degrees) is obtained as a region boundary angle. In the region boundary 2104 (in other words, the second region boundary), a second angle (for example, +15 degrees) is obtained as a region boundary angle.

The invention is not limited to the calculation of the region boundary angle, but the computer system 3 may calculate a curvature or the like, for example, when a region boundary is a curved line. In this case, information such as the curvature is also included in the region boundary angle information 2106 to be stored. The straight line or curved line determination result 2105 calculated in step S2102 or the region boundary angle information 2106 calculated in step S2103 is used in a subsequent processing step.

Subsequently, in step S2104, the computer system 3 determines a structure feature of a semiconductor wafer in the bevel image 2101 at an imaging position based on the region boundary information 2102 including the number of region boundaries detected in the bevel image 2101, the region boundary angle information 2106 including the angle, and the straight line or curved line determination result 2105, and obtains a determination result 2108. The structure feature is an aspect of presence or absence of the region boundary or the number or angles of region boundaries as in FIGS. 20A and 20B. In other words, the structure feature is an aspect of various regions such as the upper surface region A, the slope surface region B, and the background region C in FIGS. 17A and 17B divided in accordance with the region boundary. In the example of FIG. 21, the bevel image 2101 is determined to correspond to the third classification in FIGS. 20A and 20B. The invention is not limited to the data structure, but the determination result 2108 may be information including "presence or absence of region boundary" as in the tables of FIGS. 20A and 20B or may be information indicating classifications defined in advance (for example, the first to fourth classifications).

In the bevel image, there is no feature pattern in each of the upper surface region A, the slope surface region B, and the background region C including the notch or the orientation flat or the wafer-outside region as in FIGS. 17A to 18E. Therefore, as a problem, it is difficult to determine a structure of a semiconductor wafer in a bevel image at an imaging position without using imaging information in the related art. Accordingly, in the second embodiment, in a region boundary which is a boundary between various regions in the bevel image, the region boundary is detected focusing on an abrupt change in luminance. In the second embodiment, the structure features of the semiconductor wafer are classified in accordance with the number of region boundaries or the angle. In other words, in the second embodiment, as in FIGS. 20A and 20B, aspects such as presence or absence of the region boundary, presence or absence of the region boundary of the curved line, and presence or absence of the notch or the orientation flat are specified as classifications. Accordingly, in the second embodiment, although imaging information such as an imaging position which can include an error is not used, the structure features in the bevel image can be classified and the defect detection method appropriate for each classification can be applied.

In step S2101, as a processing example of detection of the region boundary, the computer system 3 detects each region boundary by applying a filter such as a Sobel filter in which an output value increases in a portion in which luminance changes to the bevel image 2101 and detecting a straight line or a curved line by Hough transformation. As a result of step S2101, for each region boundary, one or more pixels forming the region boundary are associated.

In step S2102, as a processing example of determination for a straight line or a curved line, the computer system 3 calculates a direction of a luminance gradient for each pixel in the bevel image 2101 and in the region boundary information 2102 corresponding to the bevel image 2101. For example, in a pixel on the illustrated region boundary 2103, as indicated by a dotted arrow, a direction of a luminance gradient (an angle indicating the direction) can be calculated. The computer system 3 compares the direction of the luminance gradient of each pixel in a pixel group forming the region boundary. The computer system 3 determines that the line of the region boundary is a straight line when the direction of the luminance gradient of each pixel is within a predetermined range (for example, within one degree). Otherwise, the computer system 3 determines that the line of the region boundary is a curved line. As a result of step S2102, for each region boundary, information indicating whether a line is a straight line or a curved line is associated. For each pixel of the region boundary, information such as a direction of the luminance gradient may be held in association.

In step S2103, as a processing example of the calculation of the region boundary angle, the computer system 3 calculates or refers to the direction of the luminance gradient in the region boundary determined to be a straight line for each region boundary. The computer system 3 may calculate a curvature or the like in the region boundary determined to be a curved line. The computer system 3 sets a vertical direction of a direction of a luminance gradient of a region boundary which is a straight line to an extension direction of the region boundary from the region boundary image 2102 and calculates a region boundary angle corresponding to the extension direction. For example, a predetermined direction (for example, the X axis direction) of the bevel image is set as a reference of an angle and the region boundary angle is calculated (see FIGS. 23A to 23D to be described below). A method of calculating the region boundary angle is not limited thereto.

In step S2104, a processing example of the determination of the wafer structure is as follows. The computer system 3 determines "presence of region boundary" when one or more region boundaries are detected in the bevel image. The computer system 3 determines "absence of region boundary" when a region boundary is not detected. In the case of "presence of region boundary," the computer system 3 determines "presence of region boundary of curved line" when there are one or more region boundaries determined to be a curved line in step S2102 among the detected region boundaries. In the other cases, that is, in a case in which all the region boundaries are straight lines, the computer system 3 determines "absence of region boundary of curved line."

In the case of "absence of region boundary of a curved line," the computer system 3 determines whether there is a region boundary different from an angle of another region boundary. In other word, the computer system 3 determines whether a difference between an angle of a certain region boundary and an angle of another region boundary is sufficiently large, for example, a difference between the region boundary angles is a threshold or more. For example, when the difference between the region boundary angles of the region boundaries is a threshold (for example, 10 degrees) or more, the computer system 3 may determine "difference in the region boundary angle." When there is a region boundary different from the angle of another region boundary, the computer system 3 determines "presence of notch/orientation flat" (the third classification in FIGS. 20A and 20B). In the other cases, the computer system 3 determines "absence of notch/orientation flat."

For example, in the case of the image 1804 of FIG. 18D, since a difference between the angle of the region boundary 1844 and the angle of the region boundary 1845 is sufficiently small, "absence of notch/orientation flat" is determined. In the case of the image 1803 in FIG. 18C, since a difference between the angle of the region boundary 1824 and the angle of the region boundary 1825 is sufficiently large, "presence of notch/orientation flat" is determined.

The determination process of FIG. 21 and the classifications of FIGS. 20A and 20B are exemplary and the invention is not limited thereto. In the defect observation method and apparatus according to the second embodiment, a region boundary is detected in the bevel image and is classified into one of the classifications in accordance with an aspect of the region boundary.

Determination of Presence or Absence of Notch/Orientation Flat

FIGS. 22A to 22C are supplementary diagrams illustrating determination of presence or absence of a notch or an orientation flat using a region boundary angle. As described above, as the background region C, in detail, there are three types of regions, a wafer-outside region, a notch region, and an orientation flat region. The computer system 3 can determine whether there are such regions by using a region boundary angle. An image 2201 in FIG. 22A is an example of an image in which a wafer-outside region is included as the background region C and a notch region or an orientation flat region is not included. The image 2201 has a straight line as one region boundary 2205. In this case, the processor can determine that the background region C is the wafer-outside region and "absence of notch/orientation flat." When the region boundary 2205 is shown as a curved line, the processor can estimate that the background region C is the wafer-outside region with higher accuracy. The invention is not limited thereto. The processor may further add luminance or the like of each region and determine whether there are various regions.

An image 2202 in FIG. 22B is an example of an image in which a notch region is included as the background region C. The image 2202 has region boundaries 2206 and 2207 as two region boundaries. In this case, the processor confirms whether a difference a1 between an angle of the region boundary 2206 and an angle of the region boundary 2207 is a threshold or more. When the difference a1 is the threshold or more, the processor determines that there is a notch region or an orientation flat region. In this example, since the angle of the region boundary 2207 is sufficiently larger than the angle of the region boundary 2206 and the difference a1 is the threshold or more, "presence of notch/orientation flat" is determined. More specifically, in the background region C with low luminance, there are a region in contact with the region boundary 2206 and a region in contact with the region boundary 2207. One of these regions corresponds to a wafer-outside region and the other region (for example, the region 2208) corresponds to a notch region.

An image 2203 in FIG. 22C is similar to the image in FIG. 22B and is an example of an image in which an orientation flat region is included as the background region C. The image 2203 has region boundaries 2209 and 2210 as two region boundaries. In this case, the processor confirms whether a difference a2 between an angle of the region boundary 2209 and an angle of the region boundary 2210 is a threshold or more. When the difference a2 is the threshold or more, the processor determines that there is a notch region or an orientation flat region. In this example, since the angle of the region boundary 2210 is sufficiently larger than the angle of the region boundary 2209 and the difference a2 is the threshold or more, "presence of notch/orientation flat" is determined. For example, a region 2211 corresponds to the orientation flat region.

When information regarding whether each region boundary is a straight line or a curved line is used, the processor can estimate whether the background region C is a wafer-outside region or a notch or orientation flat region with higher accuracy.

As a modification, two or more types of thresholds related to a difference in the region boundary angle may be prepared, and it may be determined whether there are a notch region and an orientation flat region in accordance with whether the difference in the region boundary angle corresponds to a certain threshold range.

[Straight Line and Curved Line of Region Boundaries]

Figure 23A:
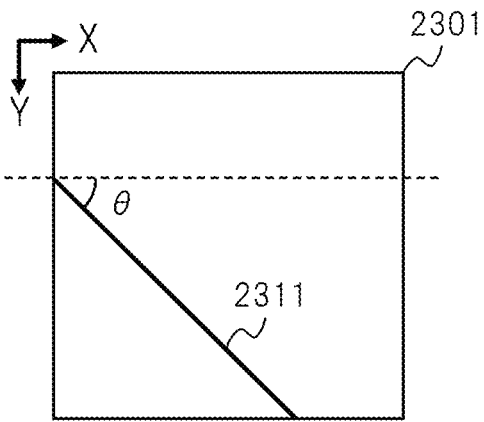

FIGS. 23A to 23D are diagrams illustrating a region boundary which is a straight line or a curved line as supplements of FIGS. 20A and 20B and 21. A bevel image 2301 in FIG. 23A is an example of an image in which a region boundary is shown as a straight line 2311. In FIGS. 23A to 23D, luminance is abstract and is schematically illustrated. In the case of the image in FIG. 23A, a direction or an angle of a region boundary detected as the straight line 2311 can be calculated as, for example, an angle $\theta$.

As cautions, the straight line 2311 is just a perspective seen from the upper side of the image, and whether an actual state of a structure corresponding to the straight line 2311 is a straight line or a curved line is a different viewpoint. Depending on wafer dimensions, an imaging magnification, or the like, a perspective of a line of the region boundary in the bevel image is different. When the actual state is a curved line (for example, the apex region 1707 in FIGS. 17A and 17B) and the imaging magnification is high, the curved line is seen as a substantially straight line. For example, the region boundary 1824 in FIG. 18C is actually a boundary between the wafer upper-surface region 1705 and the wafer slope surface region 1706 near the outer circumference of the wafer. When the imaging magnification is low, the region boundary 1824 is shown as a curved line. When the imaging magnification is high, the region boundary 1824 is shown as a substantially straight line. In the image 2003 in FIGS. 20A and 20B corresponding to the region boundary 1824, the region boundary 1824 is shown as a substantially straight line. Therefore, "absence of region boundary of curved line" is determined.

Figure 23B:
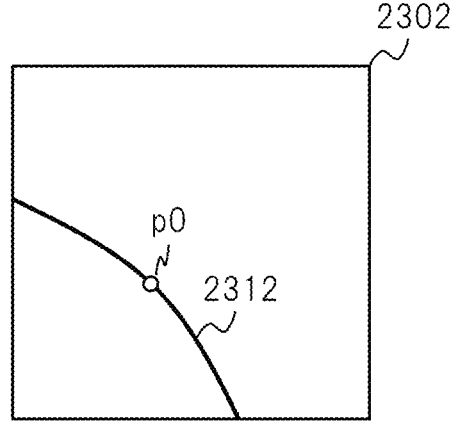

An image 2302 in FIG. 23B is an example of an image in which a region boundary is shown as a curved line 2312. The degree of curving of the curved line 2312 is exaggeratedly and schematically illustrated. The computer system 3 may detect the shape of the curved line 2312 as a region boundary from the image 2302, as it is, and retain the curved line as the region boundary image 2102 (see FIG. 21). In the case of the image 2302 in FIG. 23B, an angle of a region boundary which is a curved line 2312 can be calculated, for example, by approximating the curved line to one straight line.

Figure 23C:
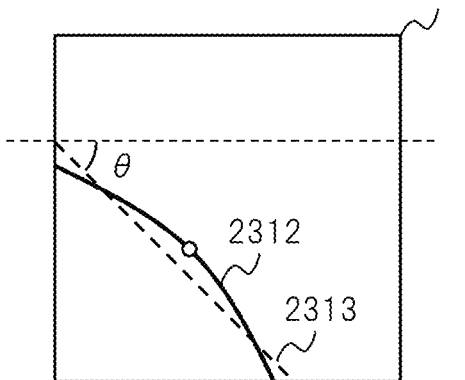

For example, in the image 2303 in FIG. 23C, a curved line 2312 of a region boundary is approximated to one straight line 2313 (in other words, an approximated straight line). For example, based on a direction or the like of the above-described luminance gradient, the computer system 3 may approximate the region boundary to one straight line in this way when the degree of curving of the curved line 2312 is constant. In the case of FIG. 23C, an angle of the region boundary by a straight line 2313 can be calculated as, for example, an angle $\theta$.

Figure 23D:
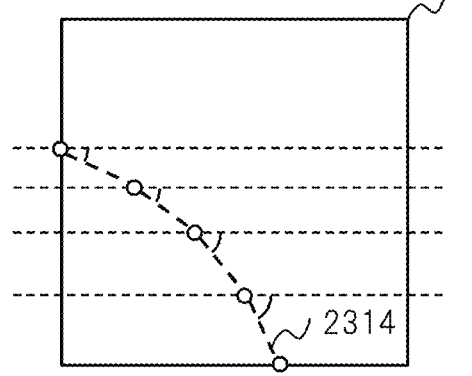

An image 2304 in FIG. 23D is another example of an image in which the curved line 2312 in FIG. 23B is approximated to a straight line. In this example, the curved line 2312 is approximated to a plurality of straight lines (in other words, line segments) as an approximated straight line 2314. The approximated straight line 2314 is formed by connecting, for example, four line segments. In the case of FIG. 23D, an angle of the region boundary by the approximated straight line 2314 may be calculated as an angle of each line segment.

When the detected region boundary is a curved line, the computer system 3 may calculate information indicating the degree of curving of the curved line, for example, a curvature. The computer system 3 may calculate a curvature at any pixel position on a curved line. For example, in the case of the image 2302 in FIG. 23B, a point of a pixel p0 near a substantially middle portion of the curved line 2312 may be taken to calculate a curvature of that point. The invention is not limited to the curvature. For example, in the case of the image 2304 in FIG. 23D, an angle formed by two adjacent line segments may be calculated at each point of the pixel at which the segments are divided.

[First Defect Detection Scheme (Defect Detection Scheme A)]

A first defect detection scheme 1911 will be described with reference to FIG. 24 and subsequent drawings. FIG. 24 illustrates a processing flow or the like of the first defect detection scheme 1911. The processing flow of the first defect detection scheme 1911 includes a reference image generation step S2401 and a defect detection step S2402. In the reference image generation step S2401, the computer system 3 inputs a target bevel image 2401 corresponding to the bevel image 1905 and generates a reference image 2403 which is compared with the bevel image 2401. In the defect detection step S2402, the computer system 3 detects a defect portion in the bevel image 2401 using the bevel image 2401 and the reference image 2403 and acquires defect coordinates 2404 as a detection result.

In step S2403 of the reference image generation step S2401, the computer system 3 first calculates a pixel and one or more peripheral pixels of the pixel as a pixel group (also referred to as a generation pixel group) 2402 used to determine a pixel value of the reference image 2403 for each pixel of the bevel image 2401 (see FIG. 25 to be described below). Subsequently, in step S2404, the computer system 3 generates a reference image 2403 using the generation pixel group 2402.

When only the upper surface region A is included in a bevel image other than a defect as in the image captured at the position 1708 of FIGS. 17A and 17B (for example, the image 1801 of FIG. 18A), a method capable of appropriately detecting a defect using only this bevel image is necessary. In particular, there is a case in which a luminance value overall changes even only in one upper surface region A in the bevel image, and the change in the luminance value is generally called luminance irregularity. In this case, a method capable of appropriately detecting a defect using only the bevel image is necessary. The same applies to a case in which only the slope surface region B is included in the bevel image.

Accordingly, in the first defect detection scheme 1911 according to the second embodiment, the bevel image 2401 including only the upper surface region A (or only the slope surface region B) is targeted, the generation pixel group 2402 is calculated for each pixel of the bevel image 2401, and the reference image 2403 is generated using the generation pixel group 2402. Accordingly, an influence of luminance irregular or noise in a region can be reduced, and thus the suitable reference image 2403 can be generated. A defect can be detected with high accuracy using only the bevel image 2401 including only one type of region other than a defect.

In step S2403, as a processing example of calculation of the generation pixel group, for each pixel of the bevel image 2401, the computer system 3 calculates pixels (for example, pixels within ten pixels) close to the pixel (referred to as a pixel of interest) as a generation pixel group. For example, when ten pixels are used as a predetermined distance, the processor sets corresponding peripheral pixels within ten pixels from the pixel of interest as a generation pixel group.

In step S2404, as a processing example of generation of the reference image, the computer system 3 calculates an average value of luminance values of the corresponding generation pixel group for each pixel of interest of the bevel image 2401 and sets the average value as a luminance value of the pixels at the corresponding positions of the reference image 2403.

In this way, as the first defect detection scheme, an influence of luminance irregularity in a region is reduced by calculating the peripheral pixels of the pixel of interest as a generation pixel group. By setting the average value of the luminance values of the generation pixel group as a luminance value of the pixels of the reference image 2403, it is possible to reduce an influence of noise and generate the suitable reference image 2403.

In step S2402, as a processing example of detection of a defect portion, the computer system 3 calculates a difference between the bevel image 2401 and the reference image 2403, determines that a pixel in which the difference value is greater than a preset threshold corresponds to a defect portion and acquires the pixel as the defect coordinates 2404. As another scheme, a plurality of pixels in which a difference value is greater than a threshold may be grouped in accordance with a distance or the like and central coordinates or the like of a grouped pixel region may be acquired as the defect coordinates 2404.

FIG. 25 is a supplementary diagram illustrating the calculation of the generation pixel group in step S2403. An expanded partial pixel region in the bevel image 2501 on the left side is illustrated on the right side. One certain pixel 2501 of interest is indicated with black. The processor sets a predetermined distance as a pixel distance from the pixel 2501 of interest to the periphery in a 2-dimensional plane, that is, in each direction including the X and Y axis directions, and sets a calculation range 2502 as a range corresponding to the pixel distance in each direction. In this example, the pixel distance is set to three pixels in each of the negative and positive directions of the X and Y axis directions in this case. A calculation range corresponding to the predetermined distance from the pixel 2501 of interest is also set in a slope direction with respect to the X and Y axis directions. The corresponding peripheral pixels 2503 (indicated by an oblique line pattern) within the calculation range corresponding to the predetermined distance are considered as a generation pixel group. In other words, the setting of the calculation range 2502 in accordance with the pixel distance may be ascertained as setting of a matrix of the peripheral pixels 2503 near the pixel 2501 of interest.

The first defect detection scheme according to the second embodiment is similar to (A) the statistical image comparison scheme in the first embodiment (see FIG. 6). The first defect detection scheme according to the second embodiment is a scheme of setting peripheral pixels for each pixel of interest described above as a generation pixel of a reference image. Therefore, a case in which there is luminance irregularity in a bevel image can also be handled.

[Second Defect Detection Scheme (Defect Detection Scheme B)]

The second defect detection scheme 1912 will be described with reference to FIG. 26 and subsequent drawings. The second defect detection scheme 1912 includes a reference image generation step S2601 and a defect detection step S2602. In the reference image generation step S2601, the computer system 3 inputs a target bevel image 2601 and region boundary angle information 2106 and generates a reference image 2603 which is compared with the target bevel image 2601. In the defect detection step S2602, the computer system 3 detects a defect portion in the bevel image 2601 using the bevel image 2601 and the reference image 2603 and acquires defect coordinates 2604.

In step S2603 of the reference image generation step S2601, the computer system 3 first calculates a generation pixel group 2602 for each pixel of the bevel image 2601 based on the region boundary angle information 2106 (see FIG. 27 to be described below). Subsequently, in step S2604, the computer system 3 generates the reference image 2603 using the generation pixel group 2602.

When two types of regions, the upper surface region A and the slope surface region B other than a defect are included in the bevel image as in an image (the image 1802 in FIG. 18B) captured at the position 1709 of FIGS. 17A and 17B, a method capable of appropriately detecting a defect using only the bevel image is necessary. Accordingly, in the second defect detection scheme 1912 according to the second embodiment, the generation pixel group 2602 is calculated for each pixel of the bevel image based on a region boundary angle and the reference image 2603 is generated using the generation pixel group 2602. Accordingly, in the second defect detection scheme, when a direction or an angle of a region boundary is different in accordance with an imaging position as in the bevel image including the upper surface region A and the slope surface region B other than a defect, the suitable reference image 2603 can be generated. Then, the defect can be detected with high accuracy using only the bevel image. The same applies to a case in which two different types of regions are included in the bevel image.

In step S2603, as a processing example of calculation of the generation pixel group, the computer system 3 calculates pixels located in a direction of the region boundary angle as a generation pixel group for each pixel of the bevel image 2601. The processor calculates the generation pixel group for each pixel of the bevel image 2601 based on the distance from the pixel and the region boundary angle. In the generation of the reference image in step S2604 or the defect detection in step S2602, a processing example similar to the case of the first defect detection scheme in FIG. 24 can be applied.

When there is luminance irregularity in the wafer upper-surface region 1705 or the wafer slope surface region 1706 in FIGS. 17A and 17B, an error is detected as a defect in some cases although a region of the luminance irregularity is normal. Since the bevel image in the second embodiment is an image by the SEM 2 (see FIG. 2) and a visual field of the image is relatively narrow (in other words, an imaging magnification is high), the region boundary is seen as a straight line in the bevel image in many cases. The invention is not limited thereto. When the visual field of the image is relatively large, the region boundary is seen as a curved line in the bevel image in some cases.

When the region boundary is a curved line and all the pixels located in the direction of the region boundary angle are calculated as a generation pixel group (see FIG. 28 to be described below), pixels of a region of which luminance values are considerably different are included in the generation pixel group and a normal portion is erroneously detected as a defect in some cases. Accordingly, in the second defect detection scheme 1912, while the region boundary direction is set as a reference for each pixel of the bevel image, the pixels included in the generation pixel group are limited based on a distance from the pixel.

FIG. 27 illustrates a processing example related to the calculation of the generation pixel group in step S2603. In the processing example, the processor determines the generation pixel group based on a distance from a pixel of interest (also referred to as a pixel distance D) and the region boundary angle. A bevel image 2701 on the left side is an example of an image including the upper surface region A and the slope surface region B and includes a region boundary 2703. In the bevel image 2701, an expanded local region 2702 which is a partial pixel region is illustrated as a first example in (a) on the right side. In this example, the local region 2702 is an example of a pixel region in the slope surface region B relatively near the region boundary 2703.

A pixel 2704 indicated with black is an example of a pixel of interest. When a generation pixel group of the pixel 2704 of interest is calculated, the processor determines a calculation range 2706 in accordance with, for example, a direction of the region boundary angle of the region boundary 2703 and the distance (D) from the pixel 2704 of interest. In this example, the region boundary angle of the region boundary 2703 is about −45 degrees and the direction of the region boundary angle is an upper left or upper right direction with respect to the pixel 2704 of interest.

In this example, the distance (D) from the pixel 2704 of interest is set to two pixels and the distance (D) of two pixels is set in each of the upper left direction and the lower right direction of the region boundary. The calculation range 2706 indicated by a dotted arrow is a range corresponding to the direction and the distance. The processor calculates peripheral pixels 2705 (indicated by an oblique line pattern) related to the pixel 2704 of interest included in the calculation range 2706 as a generation pixel group. The pixel 2704 of interest itself and the generation pixel group are counted. In this example, a pixel line corresponding to the calculation range 2706 is formed by five pixels in total, which is a generation pixel group.

The pixel distance D in the determination of the calculation range 2706 may be a setting value in the second defect detection scheme 1912. The pixel distance D may be determined in accordance with a maximum number M of pixels of the generation pixel group to be described below. The pixel distance D may be determined in accordance with, for example, the degree of luminance irregularity of a region or may be determined in accordance with the size of a defect desired to be detected. The calculation range 2706 is not limited to a parallel direction corresponding to the direction of the region boundary angle, but may be expanded and set to a direction perpendicular to the direction of the region boundary angle. This setting is assumed to be able to be set on a GUI screen to be described below by a user.

A second example of (b) is an example in which the calculation range 2706 is expanded and set in a direction perpendicular to the direction of the region boundary angle. In this example, the calculation range 2706 in which the distance (D) from the pixel 2704 of interest is three pixels is set and a pixel line adjacent in each of an upper right direction or a lower left direction which is a perpendicular direction 2708 (indicated by a one-dot chain arrow) with respect to the pixel line corresponding to the direction of the region boundary angle is also set as the generation pixel group.

When the maximum number M of pixels related to the generation pixel group is set, the distance (the pixel distance D) from the pixel 2704 of interest can be automatically determined in accordance with the maximum number M of pixels. For example, when the maximum number M of pixels is 5 and the pixel distance D from the pixel 2704 of interest is two pixels as in the first example of (a), the number of generation pixel groups is 5 in total and is the maximum number M of pixels or less. In this way, the number of generation pixel groups for each pixel can be automatically determined as a value close to the set maximum number M of pixels. In the second defect detection scheme, by limiting the number of generation pixel groups using the pixel distance D and the maximum number M of pixels, it is possible to reduce erroneous detection.

FIG. 28 is a diagram illustrating a case in which all the pixels located in the direction of the region boundary angle are calculated as the generation pixel group when a region boundary is a curved line according to a comparative example. An image 2801 includes a curved line 2804 as a detected region boundary as in the image 1805 in FIG. 18E or the image 2004 of the fourth instance in FIGS. 20A and 20B. The region boundary is a boundary between a wafer upper-surface region 2802 and a wafer slope surface region 2803. Luminance of the wafer slope surface region 2803 is lower than luminance of the wafer upper-surface region 2802. A direction and an angle of the region boundary with respect to the curved line 2804 which is a region boundary are assumed to be calculated as a direction 2806 and an angle 19, for example, when the scheme in FIG. 23C is used.

In the comparative example, the processor calculates all the pixels in the direction 2806 of the region boundary in the bevel image for each pixel of interest as the generation pixel group. For example, in the case of a pixel p1, an illustrated pixel line 2807 is a generation pixel group. For example, in the case of a pixel p2, however, a pixel line 2810 is a generation pixel group. The pixel p2 is near the curved line 2804. The pixel line 2810 is astride the wafer upper-surface region 2802 and the wafer slope surface region 2803, and a luminance value is considerably different between these regions. Therefore, on the pixel line 2810, the considerably different luminance values are included in the generation pixel group. In a reference image generated using the generation pixel group, a normal portion is erroneously detected as a defect in some cases. Accordingly, the second defect detection scheme is a scheme of calculating the generation pixel group in the limited calculation range using the pixel distance D in the direction of the region boundary as in FIG. 27. Accordingly, since pixels with considerably different luminance are rarely included in the generation pixel group for each pixel, a more suitable reference image can be generated.

[Third Defect Detection Scheme (Defect Detection Scheme C)]

The third defect detection scheme 1913 will be described with reference to FIG. 29 and subsequent drawings. FIG. 29 illustrates a processing flow of the third defect detection scheme 1913. The third defect detection scheme includes a reference image generation step S2901 and a defect detection step S2902. The reference image generation step S2901 is a step of inputting a target bevel image 2901, region boundary information 2102, and region boundary angle information 2106 and generating a reference image 2903 which is compared with the target bevel image 2901. The defect detection step S2902 is a step of detecting a defect portion in the bevel image 2901 using the bevel image 2901 and a reference image 2903 and acquiring defect coordinates 2904.

In step S2903 of the reference image generation step S2901, the computer system 3 first calculates a distance (referred to as a region boundary distance E) from the region boundary included in the region boundary information 2102 for each pixel of the bevel image 2901 (see FIGS. 30A to 30C to be described below).

In step S2904, the computer system 3 calculates the generation pixel group 2902 for each pixel of the bevel image 2901 based on a region boundary angle (included in the region boundary angle information 2106) of a nearby region boundary based on the region boundary distance E. In step S2905, the computer system 3 generates the reference image 2903 using the generation pixel group 2902. The generation of the reference image in step S2906 or the detection of the defect portion in step S2902 is the same as the case of the second defect detection scheme (see FIG. 26).

When the upper surface region A other than a defect, the slope surface region B, and the background region C are included in the bevel image and the plurality of region boundaries are included as in the image (the image 1803 in FIG. 18C) captured at the position 1710 in FIGS. 17A and 17B, a method capable of appropriately detecting a defect using only the bevel image is necessary. Accordingly, the third defect detection scheme is a scheme of calculating the distance (E) from the region boundary for each pixel of the bevel image, calculating the generation pixel group based on the region boundary angle of the nearby region boundary, and generating the reference image using the generation pixel group. Accordingly, when there are a plurality of region boundaries with the considerably different directions or angles in the bevel image as in the bevel image 2901, the suitable reference image can be generated and a defect can be detected with high accuracy using only the bevel image.

[Distance (E) from Region Boundary]

A distance (E) from the region boundary calculated in step S2903 will be described with reference to FIGS. 30A to 30C. FIG. 30A illustrates region boundary distance information 3000 which is information regarding the region boundary distance E calculated in step S2903 in a table format. FIG. 30B illustrates an example of the region boundary distance E and a pixel of interest in the bevel image 2901. In this example, detection of a region boundary 3007 ("region boundary 1") and a region boundary 3008 ("region boundary 2") as two region boundaries in the bevel image 2901 is completed. As examples of pixels of interest, pixels 3005 and 3006 are illustrated.

In step S2903, the computer system 3 calculates the distance (E) from each region boundary to each pixel 3001 in the bevel image 2901. The region boundary distance E is, for example, a length of a perpendicular drawn from the pixel of interest to the region boundary. A distance between a pixel 3005 and the region boundary 3007 is a region boundary distance E1 and a distance between the pixel 3005 and the region boundary 3008 is a region boundary distance E2. A distance between a pixel 3006 and the region boundary 3007 is a region boundary distance E3 and a distance between the pixel 3006 and the region boundary 3008 is a region boundary distance E4. The distance (E) is stored, in the table of FIG. 30A, as a distance 3002 from the region boundary 1 and a distance 3033 from the region boundary 2.

The processor calculates a nearby region boundary for each pixel of interest based on the calculated region boundary distance E and stores the nearby region boundary in a nearby region boundary 3004 in the table. In this example, since the distance E1 is the shortest from the pixel 3005, a nearby region boundary is the region boundary 3007. Since the distance E4 is the shortest from the pixel 3006, a nearby region boundary is the region boundary 3008.

In step S2904, the computer system 3 calculates, for example, pixels located in the direction of the region boundary angle of the nearby region boundary for each pixel of the bevel image as a generation pixel group 2902.

FIG. 30C illustrates a direction 3009 of the region boundary angle for the pixel 3005 and a direction 3010 of the region boundary angle for the pixel 3006. A range for calculating the generation pixel group in the direction of the region boundary angle is not set to all the pixels in the direction of the region boundary angle, but may be determined to be limited for each pixel of interest based on the distance (D) from the pixel as in the case of the second defect detection scheme.

Further, in the third defect detection scheme, in the reference image generation step S2901, the computer system 3 calculates, as a generation pixel group, pixels located for each pixel of the bevel image 2901 in the direction of the region boundary angle of the nearby region boundary from that pixel and in a range until blocked by another region boundary. In other words, the range in which the generation pixel group is calculated in the direction of the region boundary angle is a range in which a pixel colliding with another region boundary is a maximum limit.

As in the example of the image 2901, in a bevel image in which there are region boundaries of which directions or angles are considerably different, when all the pixels located in the direction of the region boundary angle of the nearby region boundary for each pixel are calculated as a generation pixel group, pixels of a region in which luminance values are considerably different are included in the generation pixel group in some cases. In these cases, a normal portion is erroneously detected as a defect. Accordingly, in the third defect detection scheme, a range from the pixel in the direction of the region boundary angle of the nearby region boundary angle until blocked by another region boundary for each pixel of the bevel image is limited as a calculation range, and pixels located within the calculation range are calculated as a generation pixel group.

In the example of FIG. 30C, for the pixel 3005, the direction 3009 of the region boundary 3007 is blocked by the region boundary 3008 which is another region boundary. Accordingly, pixels located until a pixel colliding with the region boundary 3008 on the direction 3009 are considered as a maximum limit of the calculation range. Similarly, for the pixel 3006, the direction 3010 of the region boundary 3008 is blocked by the region boundary 3007 which is another region boundary. Accordingly, pixels located until a pixel colliding with the region boundary 3007 on the direction 3010 are considered to be a maximum limit of the calculation range.

[Calculation of Generation Pixel Group]

FIGS. 31A and 32B illustrate processing examples in which the generation pixel group in step S2904 is calculated. FIG. 31A illustrates an example corresponding to the example of the pixel of interest and the bevel image 2901 in FIGS. 30A to 30C. FIG. 31A illustrates an example in which a generation pixel group is calculated for each pixel of interest in the direction of the nearby region boundary in the range until another region boundary by using the pixel distance D. FIG. 31A illustrates an expanded local region 3101 and an expanded local region 3102 which are partial regions including pixels of interest of the bevel image 2901, respectively.

First, in the case of the local region 3101, when a generation pixel group for the pixel 3005 indicated with black is calculated, the computer system 3 determines, for example, a calculation range 3107 using a distance (the pixel distance D) from the pixel 3005 in the direction of the region boundary angle of the nearby region boundary 3007. Then, the processor calculates the pixel 3106 included in the calculation range 3107 as a generation pixel group for the pixel 3005. In this example, a case in which the maximum number M of pixels is seven and the pixel distance D is three is illustrated.

In the case of the local region 3102, when a generation pixel group for the pixel 3006 indicated with black is calculated, the computer system 3 determines, for example, a calculation range 3110 using a distance (the pixel distance D) from the pixel 3006 in the direction of the region boundary angle of the nearby region boundary 3008. In this example, a case in which the maximum number M of pixels is seven and the pixel distance D is three is illustrated. In this example, the processor searches for peripheral pixels in an upper left or lower right slope direction from the pixel 3006 along a direction parallel to the nearby region boundary 3008 indicated by a dotted pattern. In this case, peripheral pixels corresponding to three pixels which are the pixel distance D can be calculated in the lower right direction. In the upper left direction, however, there is blocking by the region boundary 3007 which is another region boundary before reaching of three pixels which are the pixel distance D. Accordingly, the processor calculates peripheral pixels corresponding to, for example, two pixels in the range until the region boundary 3007 in the upper left direction. The processor determines these peripheral pixels as a calculation range 3110 and sets peripheral pixels 3109 included in the calculation range 3110 as a generation pixel group. Accordingly, the generation pixel group for the pixel 3006 has luminance only in the slope surface region B.

In this way, in the third defect detection scheme, since the generation pixel group is set for each pixel in the bevel image in a limited range by using the region boundary, pixels in the regions with considerably different luminance are not mixed in the generation pixel group, and thus a suitable reference image can be generated.

FIG. 31B illustrates another processing example. An image 3120 is an image similar to the image 1805 in FIG. 18E or the image 2004 of the fourth instance in FIGS. 20A and 20B and including a curved line as a region boundary 3122 in this case. FIG. 31B illustrates an expanded local region 3121 including a certain pixel of interest 3123. The pixel 3123 is located near the region boundary 3122.

This processing example is an example in which when a region boundary is shown as a curved line, the curved line is not approximated to a straight line. In this processing example, in step S2904, the computer system 3 calculates the generation pixel group 2902 for each pixel of the bevel image 2901 based on a curvature (see FIGS. 23A to 23D) of the nearby region boundary from the pixel. In the example of FIG. 31B, when a generation pixel group of the pixel 3123 indicated with black is calculated, the processor determines an arc calculation range 3125 in accordance with, for example, a curvature of the nearby region boundary 3122. The calculation range 3125 is determined as an arc range in the direction of the region boundary 3122 which is a curved line. The calculation range 3125 is determined as a limited range using a distance (the pixel distance D) from the pixel of interest. In this example, the pixel distance is set to two pixels in this case. The processor calculates a peripheral pixel 3124 included in the calculation range 3125 as a generation pixel group of the pixel 3123. Accordingly, since the generation pixel group is not astride on the curved region boundary and has luminance in the same type of region, a suitable reference image can be generated.

As another processing example, when a region boundary is shown as a curved line, as in FIG. 23D, a curved line is approximated to a plurality of line segments, each line segment may be treated as a different region boundary or each line segment may be treated as a sub portion of the region boundary to generate the generation pixel group in accordance with a scheme similar to that of FIG. 31A.

FIG. 32A illustrates the foregoing other processing example. A bevel image 3201 illustrated on the left part has a curved line as a region boundary 3202. Pixels 3203 and 3204 are examples of pixels of interest. On the right part, a case in which the curved line of the region boundary 3202 is approximated to, for example, two line segments is illustrated. The region boundary 3202 is approximated to line segments 3202a and 3202b, and these line segments may be treated as, for example, first and second region boundaries. When a generation pixel group for the pixel 3203 is calculated, a calculation range 3205 is determined using the pixel distance D in directions corresponding to the line segments 3202a and 3202b in the nearby region boundary 3202. When a generation pixel group for the pixel 3204 is calculated, a calculation range 3206 is determined using the pixel distance D in a direction corresponding to the nearby line segment 3202b (the second region boundary).

As still another processing example, when a region boundary is shown as a curved line, a region boundary angle of an approximated straight line may be calculated and peripheral pixels in a straight line are searched for in a direction of the region boundary angle from a pixel of interest. In the case of the blocking by the curved region boundary on the straight line, a calculation range may be determined to a limited range until that.

FIG. 32B illustrates the other processing example. The bevel image 3201 illustrated on the left part is similar to the image of FIG. 32A and has a curved line as the region boundary 3202. A pixel 3207 is an example of a pixel of interest. On the right part, a case in which the curved line of the region boundary 3202 is approximated to, for example, one line segment 3208 is illustrated. In this example, a case in which the straight line 3208 is a tangent to the curved line of the region boundary 3202 is illustrated. The processor calculates an angle θ of the region boundary 3202 using the straight line 3208. When the generation pixel group for the pixel 3207 is calculated, the processor determines a calculation range 3209 in a direction corresponding to the angle θ of the region boundary 3208. In the calculation range 3209, peripheral pixels are searched for on the direction of the region boundary 3208. When the calculation range collides with the curved line of the region boundary 3208, peripheral pixels until the collided portion are considered to be a calculation range.

As described above, in the third defect detection scheme, for the bevel images of the third and fourth classifications in FIGS. 20A and 20B, suitable reference images can be generated from the bevel images and a defect can be detected. As described above, in the third defect detection scheme, several processing examples can be given. A processing example to be used actually is loaded and set in advance in software of the defect observation apparatus.

Alternatively, a plurality of functions corresponding to a plurality of processing examples in software of the defect observation apparatus may be loaded or a function to be used may be selected by user setting on a GUI screen.

[GUI Screen]

FIG. 33 illustrates a display example of a screen including a GUI according to the second embodiment. In the reference image generation steps (S2401 of FIG. 24, S2601 of FIG. 26, and S2901 of FIG. 29) in each defect detection scheme according to the second embodiment, a screen for setting the maximum number of pixels (referred to as M) included in a generation pixel group is provided. The computer system 3 receives an instruction or a setting for each function in the second embodiment on a GUI screen provided for a user and displays a bevel image, a defect detection result, and the like. Along with these, the computer system 3 displays a GUI for the setting of the maximum number M of pixels on the GUI screen as in the example of FIG. 33.

In the above-described first to third defect detection schemes, in the reference image generation step, the generation pixel group is calculated for each pixel in the bevel image. At this time, when the number of pixels included in the generation pixel group is considerable, even a pixel far from a certain pixel is included in the generation pixel group, there is an influence of a large difference in luminance between regions, luminance irregularity in a region, or the like, and there is a concern of accuracy of defect detection deteriorating. Thus, in the second embodiment, there is a function of appropriately setting the number of pixels included in the generation pixel group for a reference image in each defect detection scheme so that the maximum number M of pixels can be set on the GUI screen. Accordingly, it is possible to generate a suitable reference image in each defect detection scheme and it is possible to detect a defect with high accuracy.

In the process of calculating the generation pixel group, the computer system 3 calculates the generation pixel group in a calculation range which does not exceed the maximum number M of pixels for each pixel of the bevel image based on peripheral pixels (for example, pixels within the pixel distance D) closest from the pixel of interest in accordance with a method of calculating another generation pixel group in conformity with the defect detection scheme. In the above-described example of FIG. 27, when a setting value of the maximum number M of pixels is 5, the pixel distance D is considered to be two pixels, and thus five generation pixel groups are obtained through this process.

The GUI screen of FIG. 33 has an interface region 3300 of the "maximum number of pixels of the generation pixel group" and an interface region 3310 of "defect detection." The interface region 3300 of the "maximum number of pixels of the generation pixel group" has regions 3301 to 330N for setting the maximum number M of pixels of the generation pixel group for each of first to N-th defect detection schemes. The user can perform a GUI operation to confirm and set the maximum number M of pixels in each scheme in the regions 3301 to 330N. In software of the defect observation apparatus, a default setting value of the maximum number M of pixels is set, and thus the user can change the setting value. The user inputs and sets appropriate numbers of pixels in the regions 3301 to 330N.

The interface region 3310 of defect detection has an interface region 3311 of a "bevel image" and an interface region 3312 of a "defect detection result." In the interface region 3311 of the "bevel image," one or more bevel images which are defect detection targets are displayed. In the interface region 3312 of a "defect detection result," one or more images of the defect detection results at positions corresponding to the left bevel images are displayed. When the user changes the setting value of the maximum number M of pixels in an upper column, the computer system 3 displays a defect detection result to which a defect detection process at the setting value of the maximum number M of pixels changed for the left bevel image is applied in a lower column in response to this change. The user can view and confirm the defect detection result in accordance with the change in the maximum number M of pixels. Accordingly, the user can set the suitable maximum number M of pixels efficiently.

The invention is not limited to the screen example of FIG. 33. For example, in the interface region 3310 of "defect detection," information indicating which defect detection scheme is applied may be displayed for each target bevel image. For each target bevel image, a generated reference image may be displayed. For each target bevel image, a determination result (information regarding whether there is a region boundary) as in FIG. 20A or information regarding a classification result may be displayed.

[Advantages and Others]

As described above, in the defect observation method and apparatus according to the second embodiment, a defect can be observed and detected by applying a defect observation and detection scheme appropriate for an imaging target of a bevel portion of a semiconductor wafer as in the first embodiment. Therefore, it is possible to improve accuracy of the defect observation and detection compared to defect observation and detection in conformity with a single scheme of the related art.

The process related to distinguishment between the straight line and the curved line of the above-described region boundary is not limited to the process performed in the determination step S1906. As a modification of the second embodiment, the process may be performed as necessary in each defect detection scheme.

Modification 1 of Second Embodiment

The following modifications of the second embodiment can be made. FIG. 34 is a diagram illustrating Modification 1 of the second embodiment. In Modification 1, step S3400 is added as a main different point from the flow of FIG. 19 in the second embodiment. A part of the process when the defect is detected in step S1908 using the defect detection scheme changed in step S1907 is different.

In the above-described determination process (see FIG. 21) of step S1906, the region boundary information 2102 (a region boundary image) is calculated. In step S3400, the region boundary information 2102 is input and used. In step S3401, the computer system 3 calculates a distance (a region boundary distance E) from a region boundary for each pixel from the region boundary image. In step S3402, the computer system 3 sets sensitivity (referred to as S) of the defect detection in accordance with the region boundary distance E for each pixel. As a result of step S3402, the sensitivity setting information 3403 is obtained. The sensitivity setting information 3403 is input to each defect detection scheme (in particular, the second and third defect detection schemes).

The sensitivity S is sensitivity when the defect detection process is performed using the defect detection scheme in step S1908 and a pixel is determined and detected to be a defect portion. The sensitivity S set in step S3402 is applied in the defect detection process among the defect detection scheme selected in step S1907. Accordingly, in Modification 1, a defect can be detected at different sensitivity S in accordance with a pixel in the bevel image.

As a processing example in which the sensitivity S is used, when a defect is determined with a difference between a target pixel of the bevel image and a pixel of a reference image in conformity with a certain defect detection scheme, a difference value is weighted in accordance with the sensitivity S. For example, a weight is considered to be larger as the sensitivity S is higher.

The details of the sensitivity S set in accordance with the region boundary distance E for each pixel are not particularly limited, and various sensitivities can be set depending on a target semiconductor wafer or the like. An example of a sensitivity setting is as follows.

The processor calculates the distance (E) from the region boundary 3402 for each pixel P in the region boundary image 2102 corresponding to the bevel image 3401. The processor sets the sensitivity S at the pixel P in accordance with magnitude of the distance (E). Here, in the bevel image 3401, a change in luminance is relatively large between the region boundary 3402 and its periphery. Therefore, there is a possibility of a region boundary periphery region 3404 being erroneously detected to have a defect despite being normal. Accordingly, in an example of the sensitivity setting according to Modification 1, the processor sets the sensitivity S to be lower as the region boundary distance E is shorter for each pixel P. For example, the sensitivity S is set with, for example, a proportional relationship in accordance with a value of the region boundary distance E. Accordingly, since a defect can be detected at the sensitivity S lower as a distance to a region boundary periphery region 3403 is closer in accordance with the pixel, erroneous detection can be inhibited.

As another example of the sensitivity setting, the processor divides a pixel region in a bevel image into several regions. For example, the processor divides the pixel region into the region boundary periphery region 3403 and the other region. The processor sets first sensitivity that is relatively low in the region boundary periphery region 3403 and sets second sensitivity that is relatively higher than the first sensitivity in the other region. Accordingly, since the sensitivity S is low in the region boundary periphery region 3403 in which a change in luminance is large, erroneous detection can be inhibited.

As still another example of the sensitivity setting, conversely to the foregoing example, the processor sets the sensitivity S to be relatively high in the region boundary periphery region 3403 when defect detection is performed mainly in the region boundary periphery region 3403.

Modification 2 of Second Embodiment

In the second embodiment, the technology in which the imaging information is not used in a portion other than the bevel image in the determination and defect detection which are basic processes has been described, but the invention is not limited thereto. As Modification 2, in the portion other than the bevel image, imaging information, sample information, or other information may be used as reference information. For example, information such as an imaging position, an imaging magnification, or wafer dimensions may be used as reference information. For example, from information such as an imaging magnification or wafer dimensions, whether a line of a boundary region shown in a bevel image is a straight line or a curved line can be determined to some degree. Accordingly, the computer system 3 may use the reference information such as an imaging magnification to determine whether the region boundary is a straight line or a curved line. Based on the determination, the computer system 3 may perform, for example, the above-described determination (see FIGS. 20A and 20B and FIG. 21) or may select the process illustrated in FIGS. 23A to 23D in accordance with distinguishment between a straight line and a curved line of the region boundary.

Modification 3 of Second Embodiment

In the second embodiment, the case has been described in which the upper surface region A, the slope surface region B, and the background region C illustrated in FIGS. 17A and 17B are treated as types of regions divided by the region boundary by using the top view image obtained by imaging a wafer surface in a vertical direction. The invention is not limited thereto. In Modification 3, a bevel image captured in a slope direction (in other words a tilt direction) with respect to the wafer surface may be used. In the bevel image, the apex region 1707 in FIGS. 17A and 17B is shown in some cases. In these cases, the apex region 1707 is added as one of the types of regions divided by the region boundary. Even in this case, the region boundaries as in FIGS. 20A and 20B can be determined and classified similarly.

[Other Modifications]

As modifications of the first or second embodiment, machine learning in which a bevel image is accepted as an input may be additionally applied. In the case of this modification, the computer system 3 trains a learning model using a learning bevel image and the determination result information of the above-described determination (S606 or S1906) in a learning phase. Parameters of the learning model are adjusted through the training. As the learning model, for example, a convolution neural network (CNN) or the like can be applied. The computer system 3 inputs a target bevel image to the trained learning model and obtains determination result information (for example, presence or absence of a wafer edge, a notch, or an orientation flat) as an output which is an estimation result by the learning model in an estimation phase. The computer system 3 may also use a determination result by the foregoing machine learning other than the above-described determination (S606 or S1906).

A computer system and a service provider performing learning and training of a model in a learning phase, and a computer system and a service provider performing estimation using a learned model in an estimation phase may be separate subjects.

The embodiments of the present disclosure have been described specifically, but the present invention is not limited to the above-described embodiments. Various changes can be made within the scope of the present invention without departing from the gist of the present invention. In each embodiment, constituents can be added, deleted, or substituted except for essential constituents. Unless particularly limited, the number of constituents may be singular or plural. The embodiments can be combined.

What is claimed is:

1. A defect observation method of observing a defect in a bevel portion of a semiconductor wafer which is a sample using a computer system that includes a processor and a memory resource, the method comprising: as steps executed by the computer system, a first step of acquiring, as a bevel image, an image in which defect candidate coordinates in the bevel portion are imaged as an imaging position using a microscope or an imaging apparatus; and a second step of detecting a defect in the bevel image, wherein the second step includes a determination step of determining whether there is at least one portion among a wafer edge, a wafer notch, and an orientation flat in the bevel image, a scheme switching step of switching and selectively applying a defect detection scheme of detecting the defect from the bevel image from a plurality of schemes which are candidates based on a determination result of the determination step, and a defect detection step of executing a process of detecting the defect from the bevel image in conformity with the scheme switched in the scheme switching step.

2. The defect observation method according to claim 1, wherein the scheme switching step includes a reference image capturing scheme as one of the plurality of schemes, and wherein the reference image capturing scheme is a scheme of capturing a reference image corresponding to the bevel image and detecting the defect using the bevel image and the captured reference image.

3. The defect observation method according to claim 2, wherein the reference image capturing scheme is a scheme of selecting one or more imaging positions from imaging positions obtained through an operation for symmetry or rotation on an imaging position of the bevel image in the bevel portion and rotating or reversing an image captured at the selected imaging position and setting the reversed image as the reference image.

4. The defect observation method according to claim 3, wherein the microscope or the imaging apparatus includes a plurality of detectors disposed at different positions and detects images with different shades by the detectors, and wherein the reference image capturing scheme is a scheme of selecting an image closest to a shade of the bevel image among a plurality of images with different shades captured at the selected imaging position and setting the selected image as the reference image.

5. The defect observation method according to claim 3, wherein the reference image capturing scheme is a scheme of dividing the bevel portion of the semiconductor wafer into a plurality of regions including at least first and second regions based on an imaging position indicated by the defect candidate coordinates, and selecting, in a plurality of bevel images at a plurality of imaging positions belonging to a region other than the first region, a plurality of imaging positions with respect to a plurality of reference images in accordance with the reference images corresponding to the bevel images so that the imaging positions are collected within the first region through the operation for the symmetry or rotation.

6. The defect observation method according to claim 5, wherein the reference image capturing scheme is a scheme of capturing the plurality of images at the plurality of selected imaging positions within the first region in order.

7. The defect observation method according to claim 2, wherein the scheme switching step is a step of switching the defect detection scheme to the reference image capturing scheme when there is the wafer edge and there are no wafer notch and no orientation flat as a determination result of the determination step.

8. The defect observation method according to claim 1, wherein the scheme switching step includes a reference image estimation scheme as one of the plurality of schemes, and wherein the reference image estimation scheme is a scheme of accepting the bevel image as an input, estimating an image with no defect as a reference image, and detecting the defect using the reference image estimated as the bevel image.

9. The defect observation method according to claim 8, wherein the reference image estimation scheme is a scheme of estimating the reference image by calculating a direction of a wafer edge in the bevel image and calculating an average image of the bevel images in the direction of the wafer edge.

10. The defect observation method according to claim 8, wherein the scheme switching step is a step of switching the defect detection scheme as the reference image estimation scheme when there is the wafer edge and there are no wafer notch and no orientation flat as a determination result of the determination step.

11. The defect observation method according to claim 1, wherein the scheme switching step includes a similar data comparison scheme as one of the plurality of schemes, and wherein the similar data comparison scheme is a scheme of, with regard to the bevel image of a target captured in a certain semiconductor wafer, searching for an image similar to the bevel image of the target based on another bevel image captured in another semiconductor wafer, setting the searched similar image as a reference image, and detecting the defect by comparing the bevel image of the target with the reference image.

12. The defect observation method according to claim 11, wherein the scheme switching step is a step of switching the defect detection scheme to the similar data comparison scheme when there is the wafer notch or there is the orientation flat as a determination result of the determination step.

13. The defect observation method according to claim 1, wherein the scheme switching step includes a statistical image comparison scheme as one of the plurality of schemes, and wherein the statistical image comparison scheme is a scheme of calculating a statistical value of luminance in an entire captured image, generating a consistent image in accordance with the statistical value, setting the consistent image as a reference image, and detecting the defect using the bevel image and the reference image.

14. The defect observation method according to claim 1, further comprising a step of displaying information regarding the determination result indicating whether there is the portion on a screen as a step executed by the computer system.

15. A defect observation method of observing a defect in a bevel portion of a semiconductor wafer which is a sample using a computer system that includes a processor and a memory resource, the method comprising: as steps executed by the computer system, a first step of acquiring, as a bevel image, an image in which the bevel portion is imaged using a microscope or an imaging apparatus; and a second step of detecting a defect in the bevel image, wherein the second step includes a determination step of determining a region boundary in the bevel image, a scheme switching step of switching and selectively applying a defect detection scheme of detecting the defect from the bevel image from a plurality of schemes which are candidates based on a determination result of the determination step, and a defect detection step of executing a process of detecting the defect from the bevel image in conformity with the scheme switched in the scheme switching step.

16. The defect observation method according to claim 15, wherein the determination step is a step of executing classification based on whether there is the region boundary in the bevel image, and wherein the scheme switching step is a step of selecting the defect detection scheme in accordance with the classification.

17. The defect observation method according to claim 15, wherein the determination step is a step of calculating an angle corresponding to a direction of the region boundary for each region boundary in the bevel image and executing classification based on the angle of the region boundary, and wherein the scheme switching step is a step of selecting the defect detection scheme in accordance with the classification.

18. The defect observation method according to claim 15, wherein the determination step is a step of determining a straight line or a curved line for each region boundary in the bevel image and executing classification based on whether there is a region boundary which is the curved line, and wherein the scheme switching step is a step of selecting the defect detection scheme in accordance with the classification.

19. The defect observation method according to claim 17, wherein the determination step includes determining whether there is a wafer notch or an orientation flat based on the number of region boundaries and the angles of the region boundaries.

20. The defect observation method according to claim 18, wherein the determination step is a step of approximating a curved line to a straight line when the region boundary is the curved line, calculating an angle corresponding to a direction of a region boundary which is the approximated straight line, and executing the classification based on the angle of the region boundary.

21. The defect observation method according to claim 16, wherein a defect detection scheme A is included as one of the plurality of schemes, wherein, in the scheme switching step, the defect detection scheme A is selected when there is no region boundary in the bevel image, wherein the defect detection scheme A is a scheme of detecting the defect by generating a reference image from the bevel image and comparing the bevel image with the reference image, and wherein the generating of the reference image includes calculating a generation pixel group for each pixel of the bevel image based on peripheral pixels within a predetermined distance from the pixel and generating the reference image using the generation pixel group.

22. The defect observation method according to claim 17, wherein a defect detection scheme B is included as one of the plurality of schemes, wherein, in the scheme switching step, the defect detection scheme B is selected when there is the region boundary in the bevel image, wherein the defect detection scheme B is a scheme of detecting the defect by generating a reference image from the bevel image and comparing the bevel image with the reference image, and wherein the generating of the reference image includes calculating a generation pixel group for each pixel of the bevel image in a direction corresponding to an angle of the region boundary and generating the reference image using the generation pixel group.

23. The defect observation method according to claim 22, wherein the generating of the reference image in the defect detection scheme B includes calculating, for each pixel of the bevel image, peripheral pixels within a predetermined distance from the pixel in a direction corresponding to an angle of the region boundary as the generation pixel group.

24. The defect observation method according to claim 19, wherein a defect detection scheme C is included as one of the plurality of schemes, wherein, in the scheme switching step, the defect detection scheme C is selected when there is the region boundary in the bevel image and there is the wafer notch or the orientation flat, wherein the defect detection scheme C is a scheme of detecting the defect by generating a reference image from the bevel image and comparing the bevel image with the reference image, and wherein the generating of the reference image includes calculating a distance from the region boundary for each pixel of the bevel image, determining a nearby region boundary based on the distance, calculating a generation pixel group in a direction corresponding to an angle of the nearby region boundary, and generating the reference image using the generation pixel group.

25. The defect observation method according to claim 24, wherein the generating of the reference image in the defect detection scheme C includes calculating the generation pixel group within a range blocked by another region boundary different from the nearby region boundary in a direction corresponding to an angle of the nearby region boundary for each pixel of the bevel image.

26. The defect observation method according to claim 18, wherein a defect detection scheme C is included as one of the plurality of schemes, wherein, in the scheme switching step, the defect detection scheme C is selected when there is the region boundary in the bevel image and there is the region boundary which is the curved line, wherein the defect detection scheme C is a scheme of detecting the defect by generating a reference image from the bevel image and comparing the bevel image with the reference image, and wherein the generating of the reference image includes calculating a generation pixel group in a direction of the region boundary which is the curved line for each pixel of the bevel image and generating the reference image using the generation pixel group.

27. The defect observation method according to claim 15, wherein at least one defect detection scheme among the plurality of schemes is a scheme of detecting the defect by generating the reference image from the bevel image and comparing the bevel image with the reference image, wherein the generating of the reference image includes calculating a generation pixel group for each pixel of the bevel image within a range of a set maximum number of pixels based on peripheral pixels and generating the reference image using the generation pixel group, and wherein the method further comprises, as a step executed by the computer system, a step of displaying an interface for setting the set maximum number of pixels in the defect detection scheme on a screen.

28. The defect observation method according to claim 15, further comprising: as a step executed by the computer system, a step of calculating a distance from the region boundary for each pixel in the bevel image when there is the region boundary in the bevel image, and setting sensitivity of the detection of the defect in accordance with the distance from the region boundary for each pixel in the bevel image, wherein the defect detection step is a step of detecting the defect by applying the sensitivity for each pixel during a defect detection process in the defect detection scheme.

29. A defect observation apparatus observing a defect in a bevel portion of a semiconductor wafer which is a sample, the defect observation apparatus comprising:

a controller including a processor and a memory source; and a microscope, wherein the controller acquires, as a bevel image, an image captured using defect candidate coordinates in the bevel portion as an imaging position by using the microscope, determines whether there is at least one portion among a wafer edge, a wafer notch, and an orientation flat in the bevel image, switches and selectively applies a defect detection scheme of detecting the defect from the bevel image from a plurality of schemes which are candidates based on a determination result, and executes a process of detecting the defect from the bevel image in conformity with the switched scheme.

30. A defect observation apparatus observing a defect in a bevel portion of a semiconductor wafer which is a sample, the defect observation apparatus comprising:

a controller including a processor and a memory source; and a microscope, wherein the controller acquires, as a bevel image, an image in which the bevel portion is imaged by using the microscope, determines a region boundary in the bevel image, switches and selectively applies a defect detection scheme of detecting the defect from the bevel image from a plurality of schemes which are candidates based on a determination result, and executes a process of detecting the defect from the bevel image in conformity with the switched scheme.

31. A non-transitory computer-readable medium configured to store a defect observation program, which, when executed by a processor of a computer, causes the processor to execute a process in accordance with the defect observation method according to claim 1.

32. A non-transitory computer-readable medium configured to store a defect observation program, which, when executed by a processor of a computer, causes the processor to execute a process in accordance with the defect observation method according to claim 15.

\* \* \* \* \*